(12) United States Patent
Little et al.

(10) Patent No.: US 9,490,579 B2
(45) Date of Patent: Nov. 8, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Yuan Zhang, Rowland-Heights, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/839,880

(22) Filed: Aug. 28, 2015

(65) Prior Publication Data

US 2015/0372424 A1 Dec. 24, 2015

Related U.S. Application Data

(63) Continuation-in-part of application No. 14/688,993, filed on Apr. 16, 2015, and a continuation-in-part of application No. 14/558,732, filed on Dec. 3, 2014, and a continuation-in-part of application No. 14/542,550, (Continued)

(51) Int. Cl.
   *H01R 11/20* (2006.01)
   *H01R 13/642* (2006.01)
   (Continued)

(52) U.S. Cl.
   CPC ........ *H01R 13/642* (2013.01); *H01R 13/6587* (2013.01); *H01R 24/60* (2013.01);
   (Continued)

(58) Field of Classification Search
   CPC .......................... H01R 4/2433; H01R 4/2404
   USPC ....... 439/409, 391, 410, 387, 389, 435, 436, 439/393
   See application file for complete search history.

(56) References Cited

U.S. PATENT DOCUMENTS 5,073,130 A 12/1991 Nakamura
6,139,363 A * 10/2000 Ko .......................... H01R 43/16
   439/579

(Continued)

FOREIGN PATENT DOCUMENTS

CM  CN201868687 U  6/2011
CN  CN201029143 Y  2/2008

(Continued)

OTHER PUBLICATIONS

USB Type-C Specification 0.9c05-20140518.

(Continued)

*Primary Examiner* — Phuongchi T Nguyen
(74) *Attorney, Agent, or Firm* — Wei Te Chung; Ming Chieh Chang

(57) ABSTRACT

A receptacle connector assembly includes an insulative housing defining base with a mating tongue forwardly extending therefrom in a front-to-back direction, a plurality of contacts disposed in the housing with contacting sections exposed upon the mating tongue, a metallic shield enclosing the housing to define a capsular mating cavity in which the mating tongue is disposed and a metallic shielding plate embedded within the mating tongue and defining a pair of lateral edge sections. The metallic shield defines an identification protrusion extending into the mating cavity so as to preclude from mating with a standard plug connector, which has a contour compliant with said capsular mating cavity, but with a customized plug connector which also has a contour compliant with said capsular mating cavity and further with a corresponding slot to receive said identification protrusion.

15 Claims, 78 Drawing Sheets

Related U.S. Application Data filed on Nov. 15, 2014, and a continuation-in-part of application No. 14/497,205, filed on Sep. 25, 2014, and a continuation-in-part of application No. 14/477,889, filed on Sep. 5, 2014, and a continuation-in-part of application No. 14/454,737, filed on Aug. 8, 2014, and a continuation-in-part of application No. 14/337,180, filed on Jul. 21, 2014, and a continuation-in-part of application No. 14/517,941, filed on Oct. 20, 2014.

(60) Provisional application No. 62/044,195, filed on Aug. 30, 2014, provisional application No. 61/981,217, filed on Apr. 18, 2014, provisional application No. 61/989,508, filed on May 6, 2014, provisional application No. 62/001,084, filed on May 21, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
  *H01R 24/60*  (2011.01)
  *H01R 13/6587*  (2011.01)
  *H01R 107/00*  (2006.01)
  *H01R 12/72*  (2011.01)
  *H01R 24/28*  (2011.01)
  *H05K 1/11*  (2006.01)
  *H05K 1/18*  (2006.01)

(52) U.S. Cl.
  CPC ............ *H01R 12/724* (2013.01); *H01R 24/28* (2013.01); *H01R 2107/00* (2013.01); *H05K 1/117* (2013.01); *H05K 1/184* (2013.01); *H05K 2201/09063* (2013.01); *H05K 2201/10189* (2013.01); *Y10T 29/4922* (2015.01)

(56) References Cited

U.S. PATENT DOCUMENTS

| | | | |
|---|---|---|---|
| 6,358,089 B1 | 3/2002 | Kuroda | |
| 6,489,563 B1 * | 12/2002 | Zhao | H01R 9/0524 174/88 C |
| 6,755,689 B2 | 6/2004 | Zhang et al. | |
| 7,094,089 B2 | 8/2006 | Andre | |
| 7,364,464 B2 | 4/2008 | Iino | |
| 7,524,213 B2 | 4/2009 | Neer | |
| 7,534,150 B2 * | 5/2009 | Shen | H01R 12/712 439/752 |
| 7,758,379 B2 | 7/2010 | Chen | |
| 8,087,944 B2 | 1/2012 | Kumamoto et al. | |
| 8,517,773 B2 | 8/2013 | Lee et al. | |
| 8,882,524 B2 | 11/2014 | Golko | |
| 8,911,260 B2 | 12/2014 | Golko | |
| 8,961,235 B2 | 2/2015 | Little | |
| 8,968,031 B2 | 3/2015 | Simmel et al. | |
| 2005/0202727 A1 | 9/2005 | Andre | |
| 2010/0267261 A1 | 10/2010 | Lin | |
| 2010/0297885 A1 * | 11/2010 | Cao | H01R 4/028 439/626 |
| 2013/0089291 A1 | 4/2013 | Jol | |
| 2013/0095701 A1 | 4/2013 | Golko | |
| 2013/0095702 A1 | 4/2013 | Golko | |
| 2014/0024257 A1 | 1/2014 | Castillo et al. | |
| 2014/0335729 A1 | 11/2014 | Little et al. | |
| 2015/0056839 A1 | 2/2015 | Zhang | |
| 2015/0155657 A1 | 6/2015 | Golko | |
| 2015/0162684 A1 | 6/2015 | Amini et al. | |
| 2015/0171562 A1 | 6/2015 | Gao et al. | |
| 2015/0214673 A1 | 7/2015 | Gao et al. | |
| 2015/0214674 A1 | 7/2015 | Simmel et al. | |
| 2015/0295362 A1 | 10/2015 | Tziviskos et al. | |
| 2015/0340813 A1 | 11/2015 | Ng et al. | |
| 2015/0340815 A1 | 11/2015 | Gao et al. | |
| 2015/0340825 A1 | 11/2015 | Ng et al. | |

FOREIGN PATENT DOCUMENTS

| | | |
|---|---|---|
| CN | 201230066 Y | 4/2009 |
| CN | 101573840 A | 11/2009 |
| CN | 201623280 U | 11/2010 |
| CN | 201741935 U | 2/2011 |
| CN | 201741937 U | 2/2011 |
| CN | 102437482 A | 5/2012 |
| CN | 102544812 A | 7/2012 |
| CN | 202423735 U | 9/2012 |
| CN | 202737282 U | 2/2013 |
| CN | 103081253 A | 5/2013 |
| CN | 203242848 U | 10/2013 |
| CN | 203481540 U | 3/2014 |
| TW | M288035 | 2/2006 |
| TW | M357077 | 5/2009 |
| TW | I427870 | 6/2011 |
| TW | M414692 | 10/2011 |
| TW | M443957 | 12/2012 |
| TW | M453995 | 5/2013 |
| TW | M454654 | 6/2013 |
| WO | WO2009147791 | 12/2009 |
| WO | WO2013/020359 | 2/2013 |

OTHER PUBLICATIONS

Universal Serial Bus Type-C Cable and Connector Specification Revision 1.0 Aug. 11, 2014.

Universal Serial Bus Type-C Cable and Connector Specification Revision 0.7 Working Draft Jan. xx, 2014.

* cited by examiner

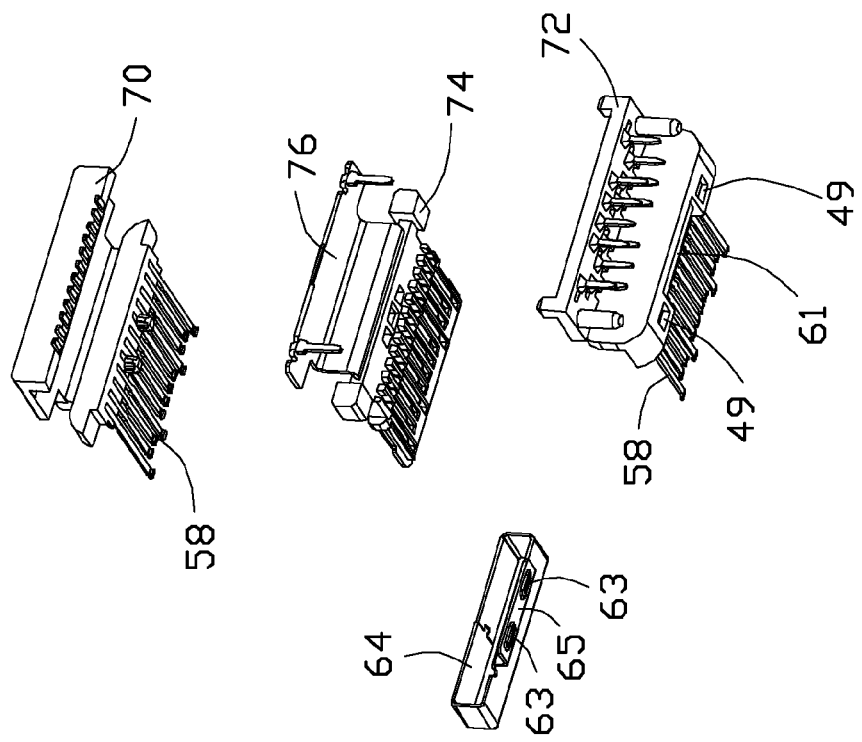
FIG. 8(B)
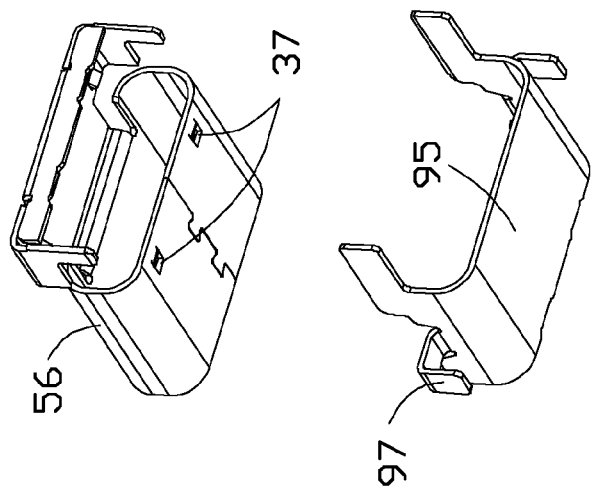

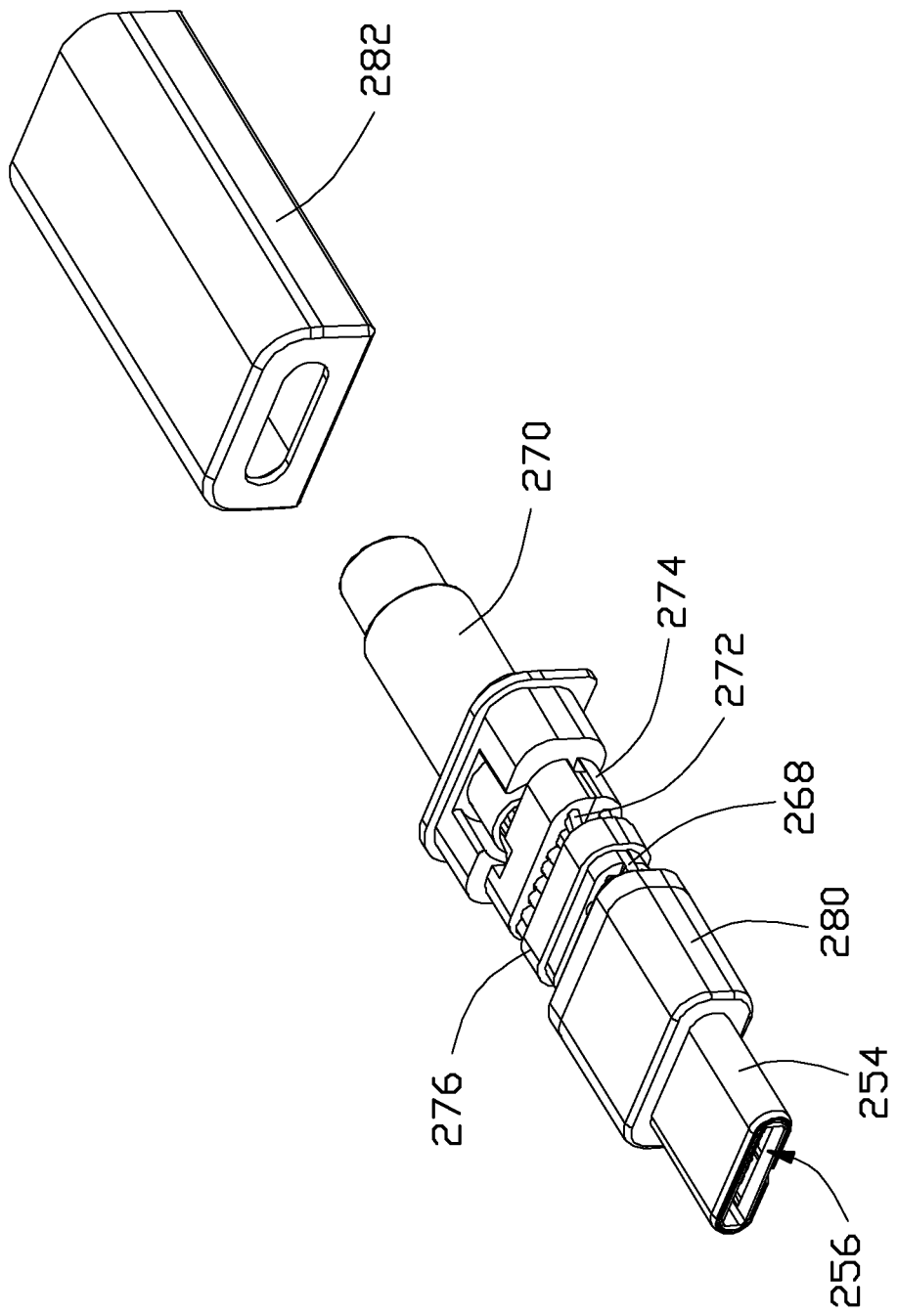

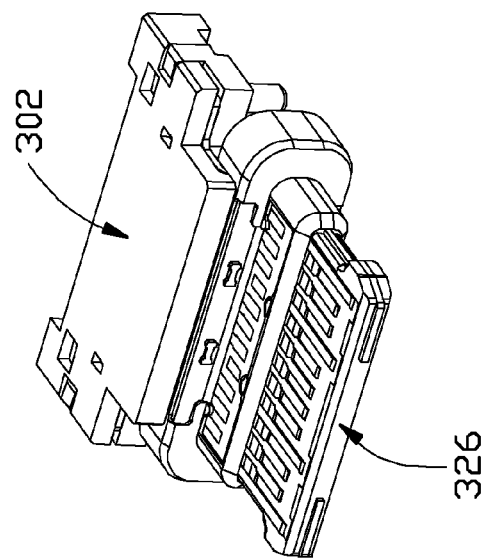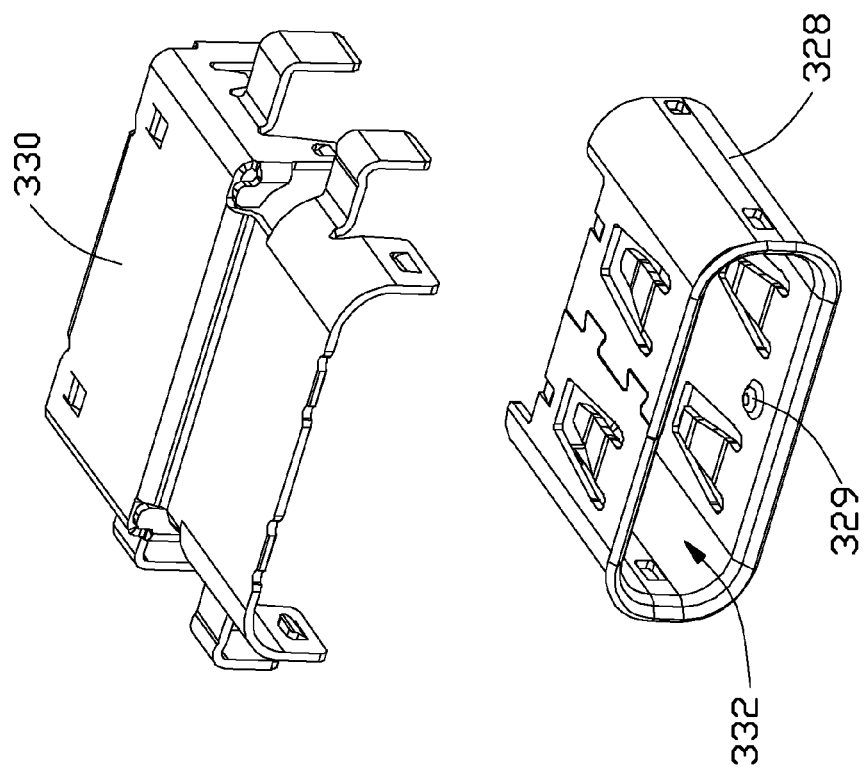
FIG. 33(A)

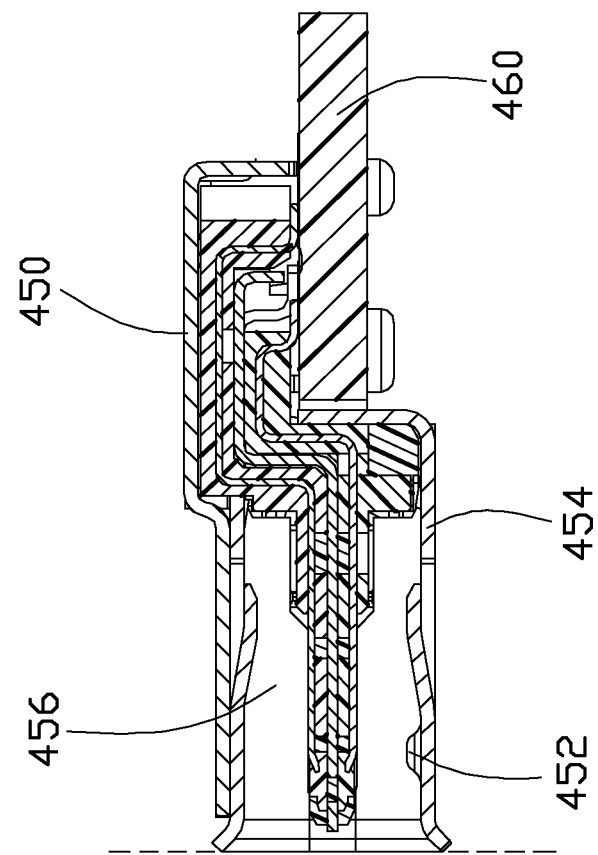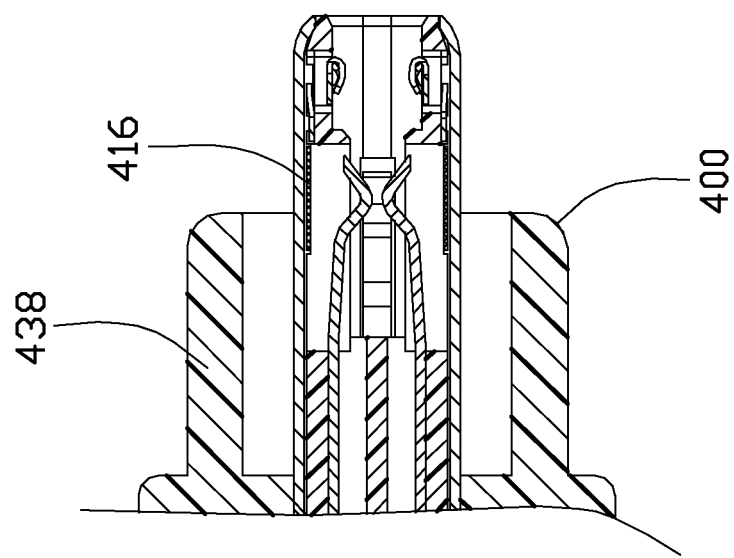
FIG. 44

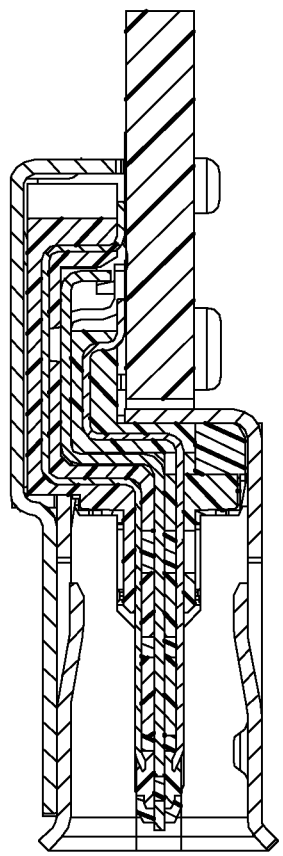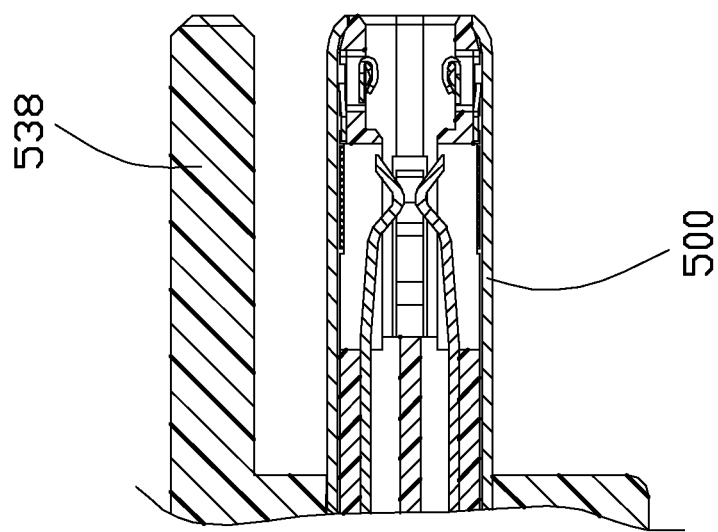
FIG. 51

FLIPPABLE ELECTRICAL CONNECTOR

CROSS REFERENCE TO RELATED APPLICATIONS

This application is a continuation-in-part of the co-pending application Ser. No. 14/558,732 filed Dec. 3, 2014 and Ser. No. 14/688,993 filed Apr. 16, 2015 and the instant application further claims the benefit of, and priority to, U.S. Provisional Patent Application No. 62/044,195, filed Aug. 30, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degradation in the super speed signals. Recently, a proposal for use with the future USB (Universal Serial Bus) was presented.

Hence, a new and simple electrical plug connector and the complementary receptacle connector are desired to improve those disclosed in the aforementioned proposal.

SUMMARY OF THE INVENTION

Accordingly, the object of the present invention is to provide a receptacle connector assembly for use with a plug comprises an insulative housing defining base with a mating tongue forwardly extending therefrom in a front-to-back direction, a plurality of contacts disposed in the housing with contacting sections exposed upon the mating tongue, a metallic shield enclosing the housing to define a capsular mating cavity in which said mating tongue is disposed and a metallic shielding plate embedded within said mating tongue and defining a pair of lateral edge sections configured to be adapted to be locked with a latch of the plug. The metallic shield defines an identification protrusion extending into the mating cavity so as to preclude from mating with a standard plug connector, which has a contour compliant with said capsular mating cavity, but with a customized plug connector which also has a contour compliant with said capsular mating cavity and further with a corresponding slot to receive said identification protrusion.

The plug connector comprises an insulative housing defining a receiving cavity, a plurality of contacts disposed in the housing with contacting sections exposed in said receiving cavity, and a metallic shell fitly enclosing said housing. The shell defines a capsular contour with a slot extending along a front-to-back direction from a front edge thereof so as to distinguish from a standard plug connector having the same capsular contour while without said slot; whereby the plug connector is allowed to be mated with a customized receptacle connector which forms a mating cavity complaint with said capsular contour while further equipped with an inward protrusion.

Other objects, advantages and novel features of the invention will become more apparent from the following detailed description when taken in conjunction with the accompanying drawings.

BRIEF DESCRIPTION OF THE DRAWINGS

FIG. 8(B) is a rear partially exploded perspective view of the receptacle connector of FIG. 1 wherein the housing and the contacts are pre-assembled together.

FIG. 23 is a front exploded perspective view of the plug connector of FIG. 21(A).

FIG. 33(A) is a front exploded perspective view of the receptacle connector of FIG. 30(A).

FIG. 44 is a cross-section al view of the disassembled plug connector and receptacle connector of FIG. 39.

FIG. 51 is a cross-sectional view of the disassembled plug connector and receptacle connector of FIG. 47.

DETAILED DESCRIPTION OF THE PREFERRED EMBODIMENT

Figure 1:
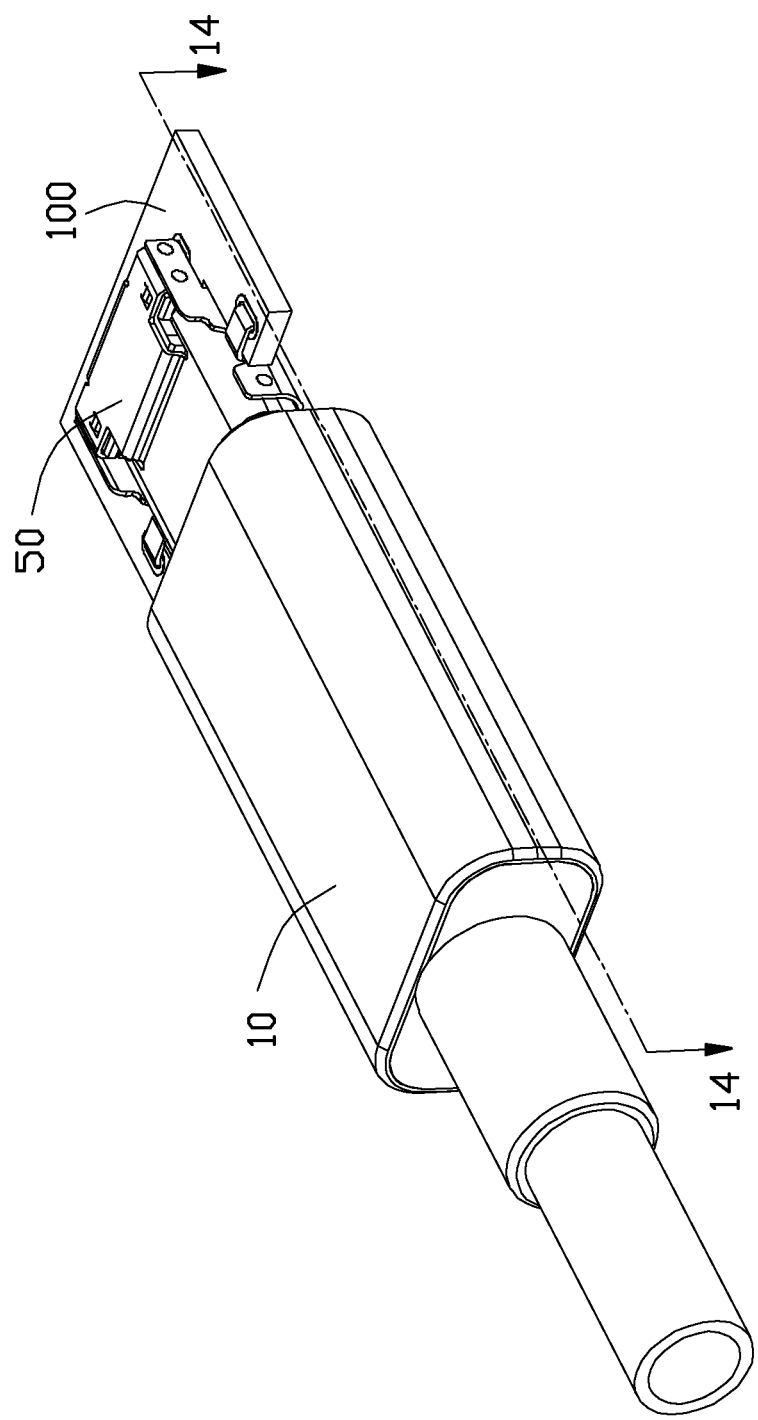
FIG. 1 is an assembled perspective view of the mated receptacle connector on the printed circuit board and the plug connector of a first embodiment of the instant invention.
Figure 2A:
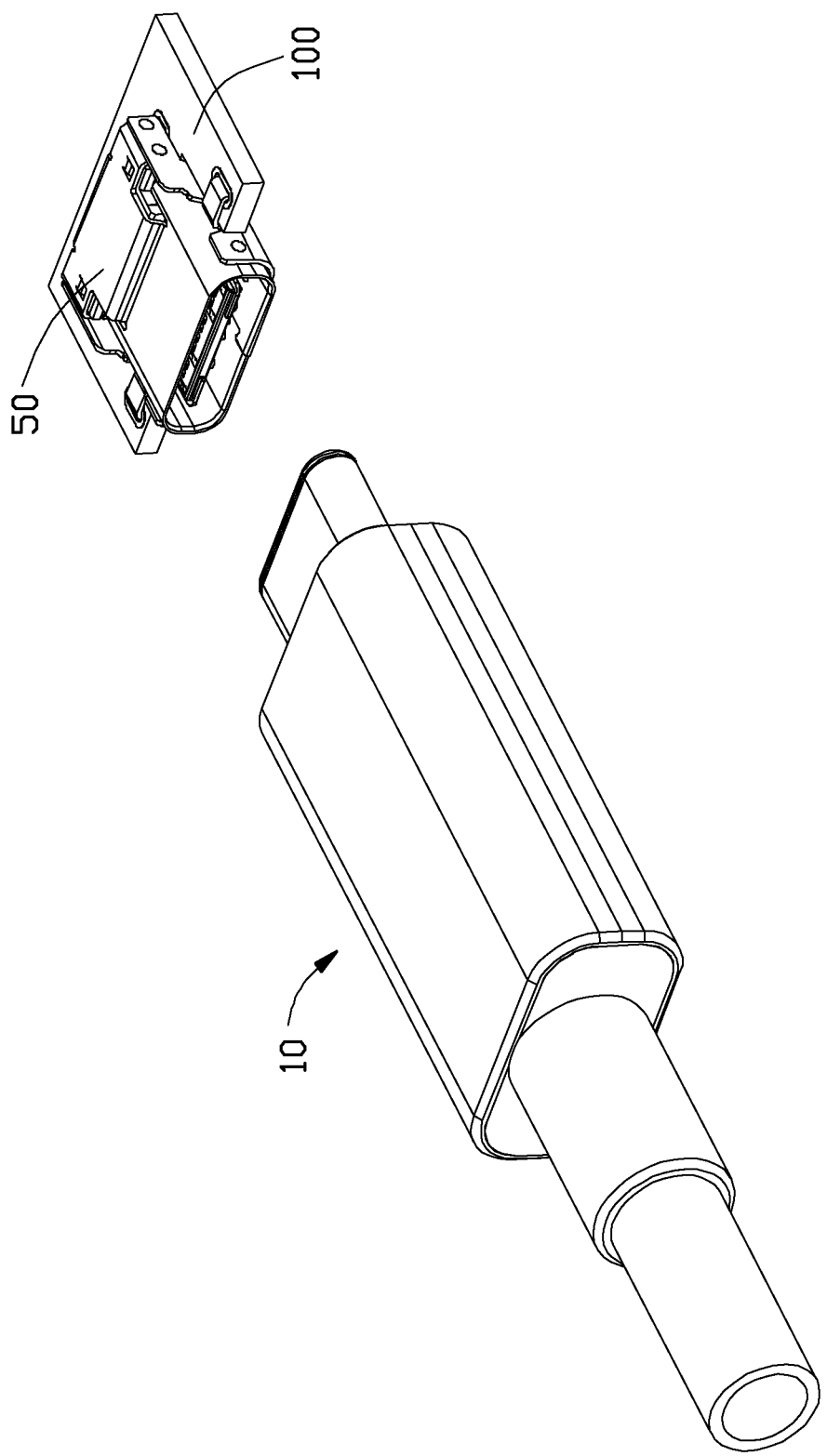
FIG. 2(A) is a front exploded perspective view of the receptacle connector and the plug connector of FIG. 1.
Figure 2B:
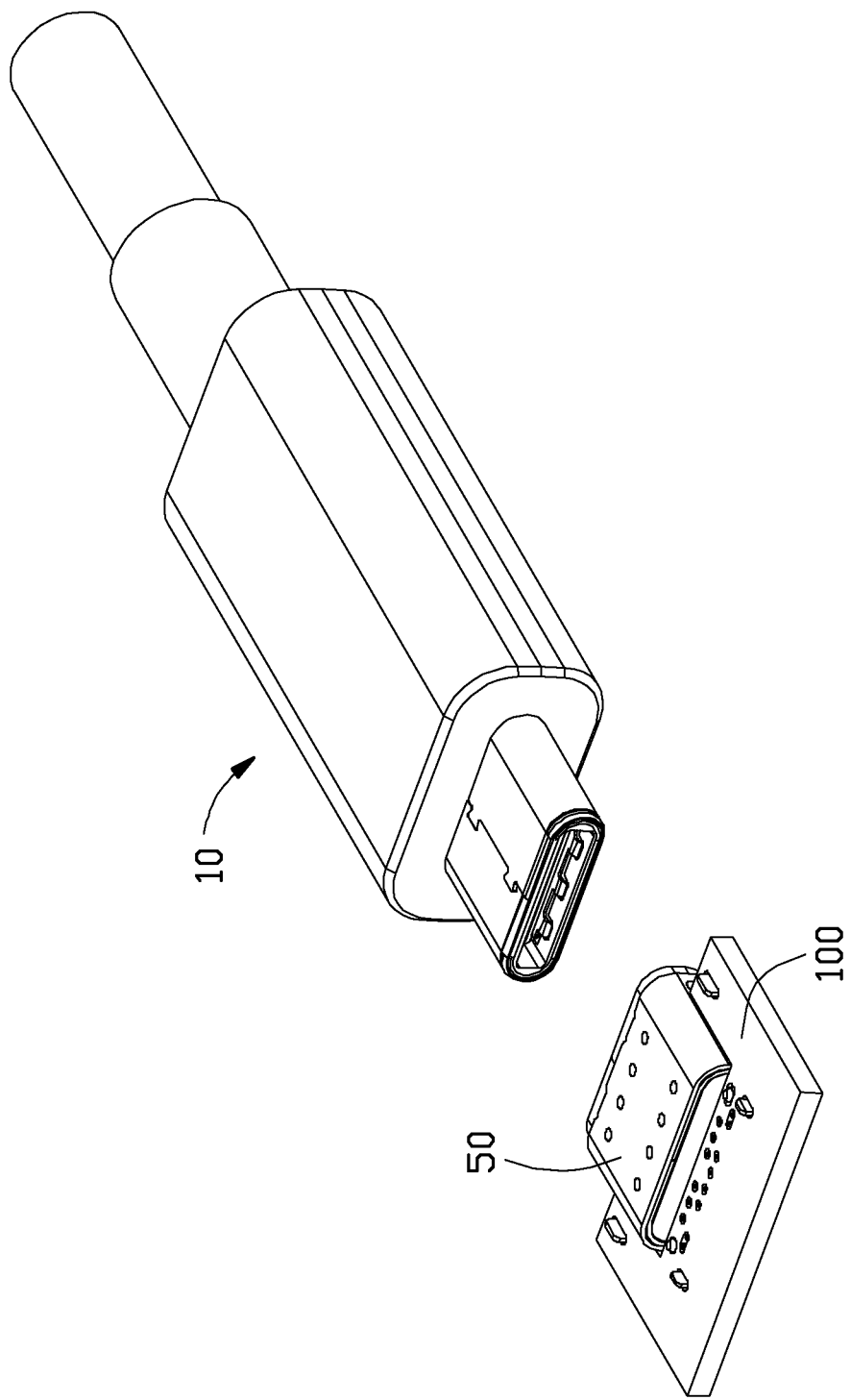
FIG. 2(B) is a rear exploded perspective view of the receptacle connector and the plug connector of FIG. 1.
Figure 3:
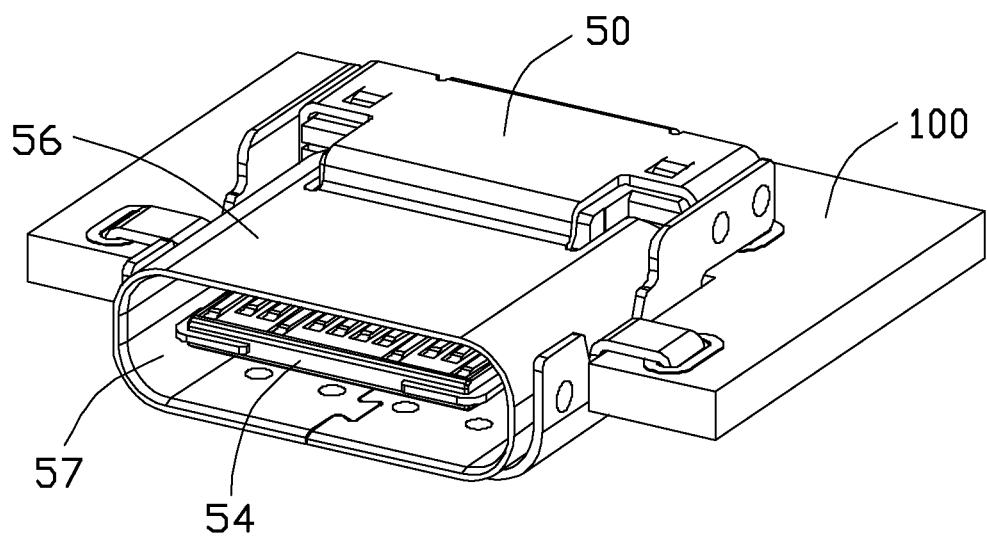
FIG. 3 is a front perspective view of the receptacle connector on the printed circuit board of FIG. 1.
Figure 4:
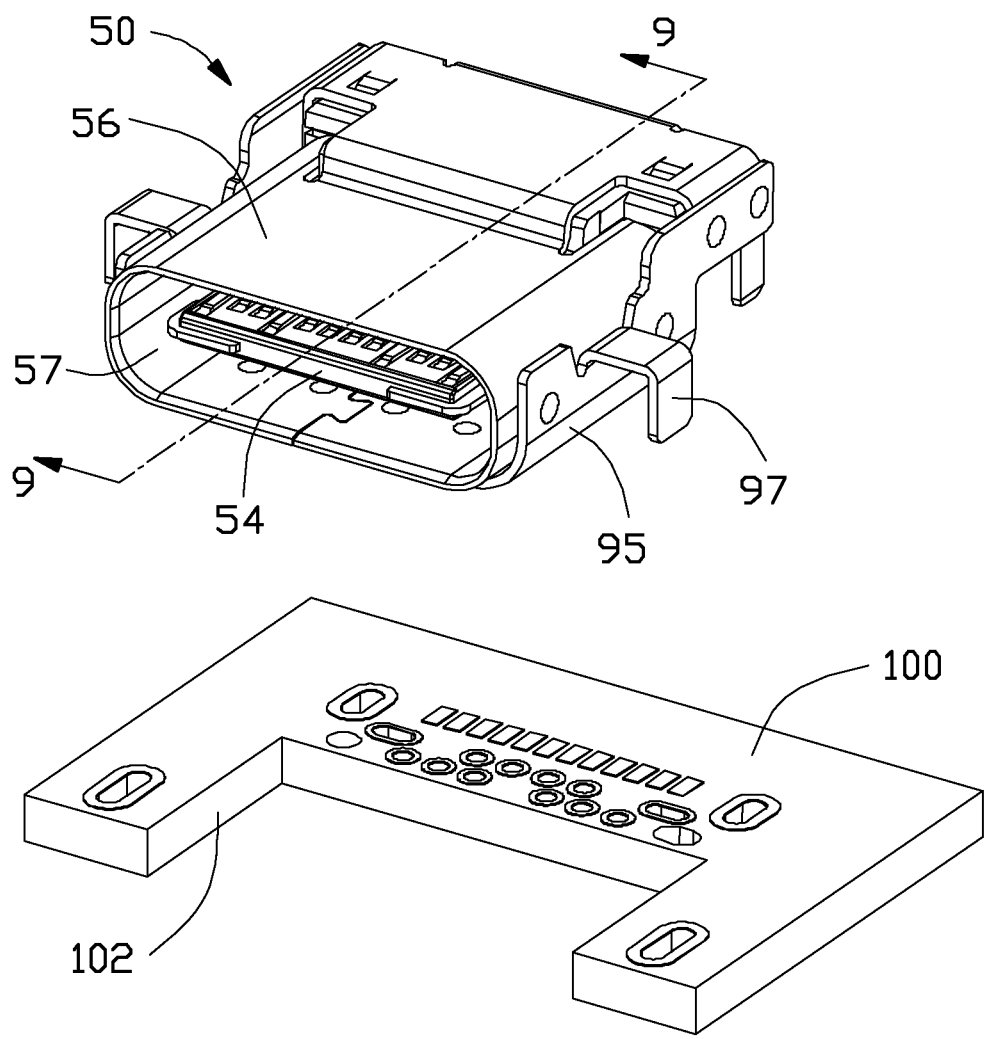
FIG. 4 is a front perspective view of the receptacle connector spaced from the printed circuit board of FIG. 1.
Figure 5A:
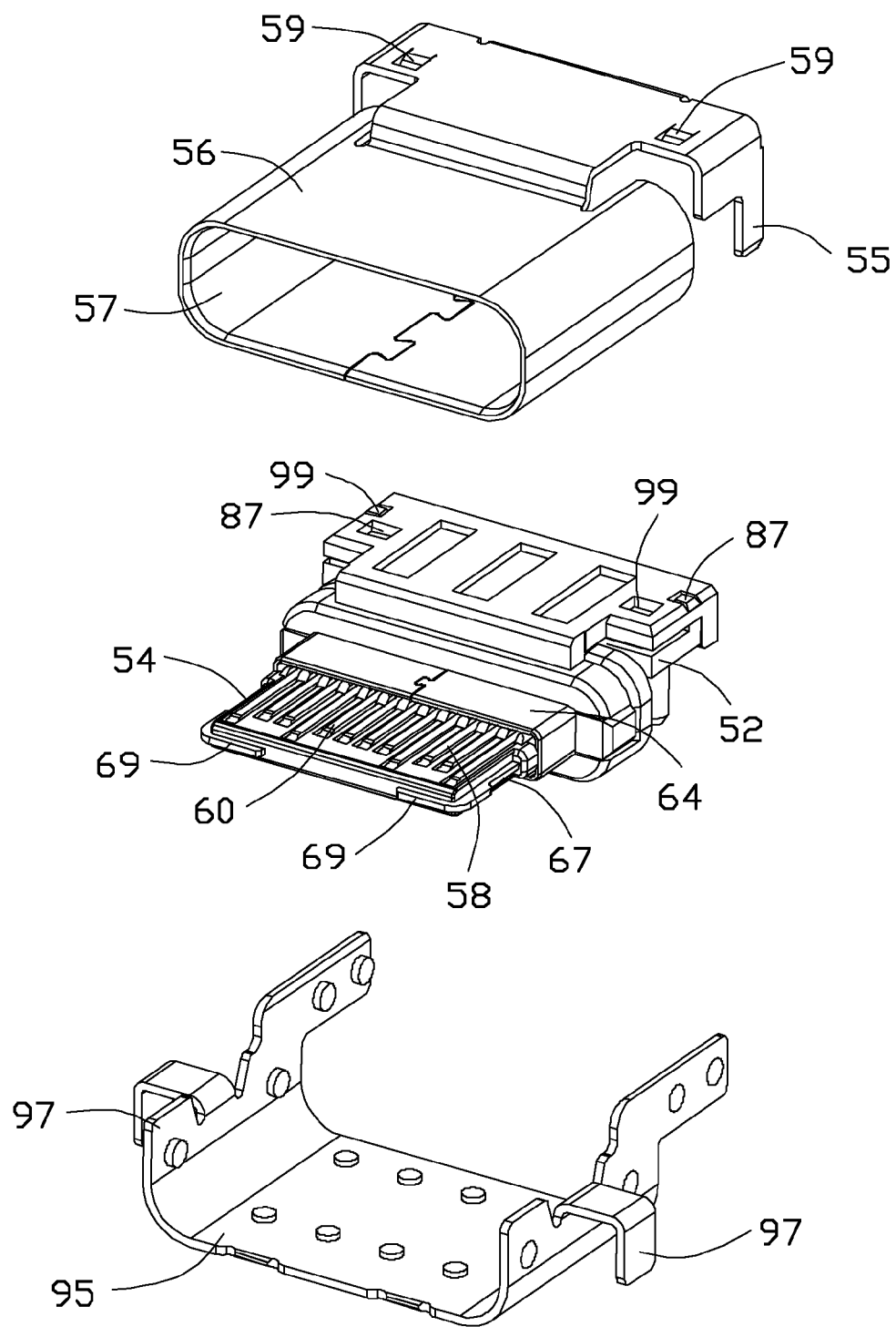
FIG. 5(A) is a front partially exploded perspective view of the receptacle connector of FIG. 1.
Figure 5B:
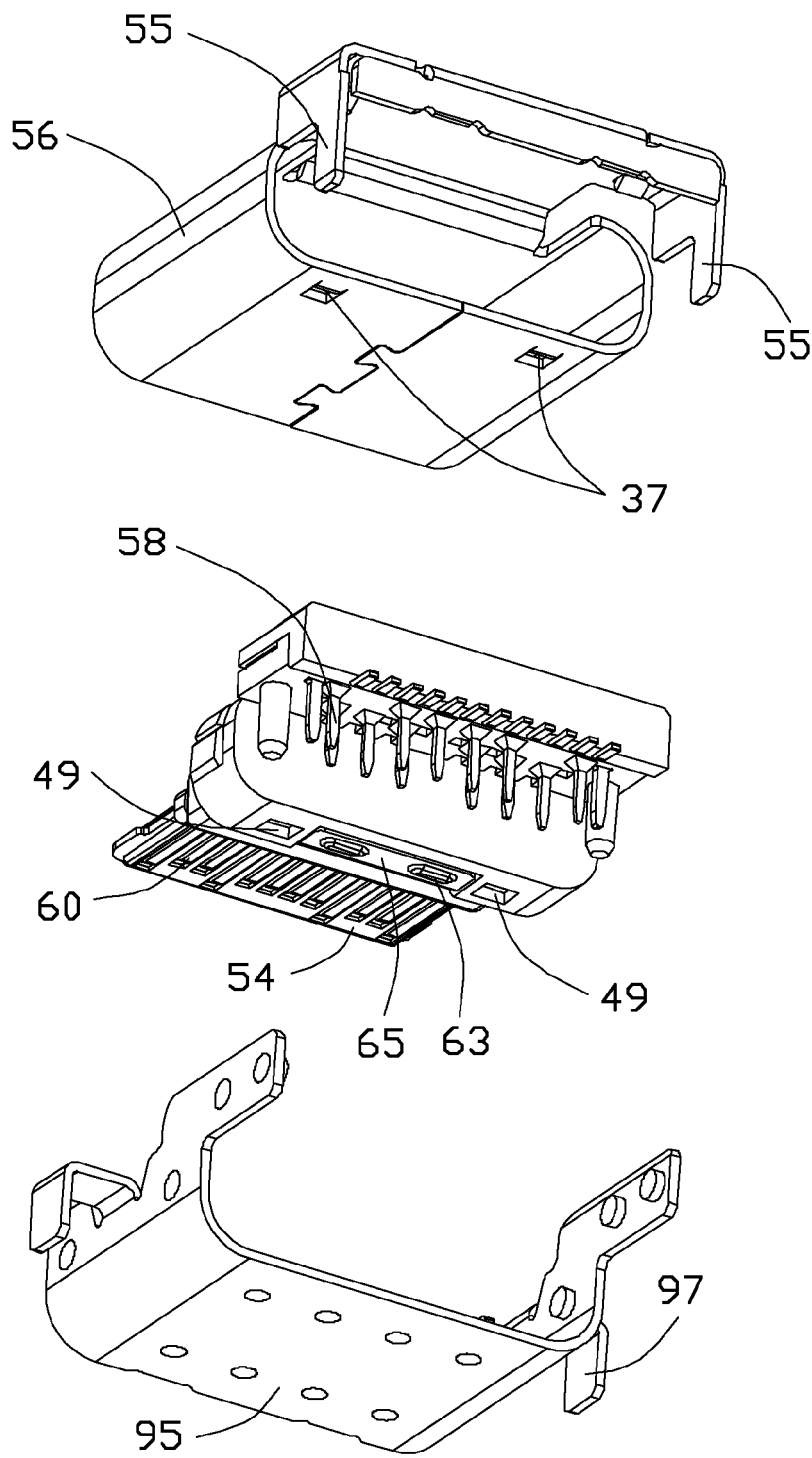
FIG. 5(B) is a rear partially exploded perspective view of the receptacle connector of FIG. 1.
Figure 6:
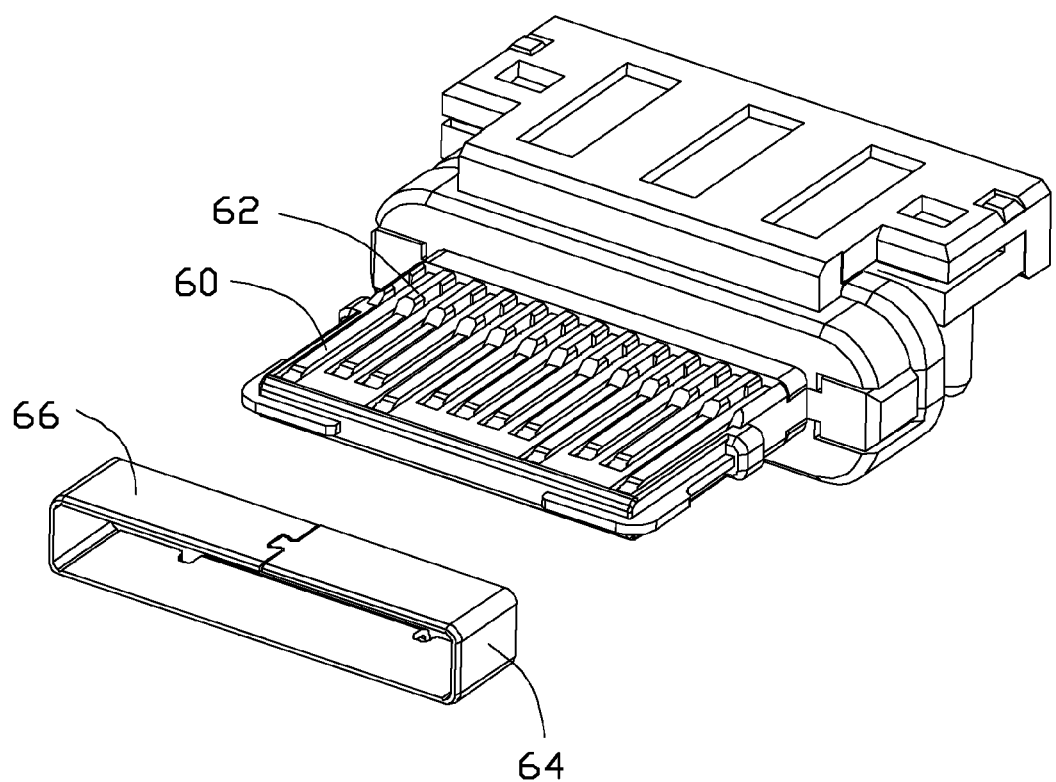
FIG. 6 is a front partially exploded perspective view of the receptacle connector of FIG. 1 without the shield thereof.
Figure 7A:
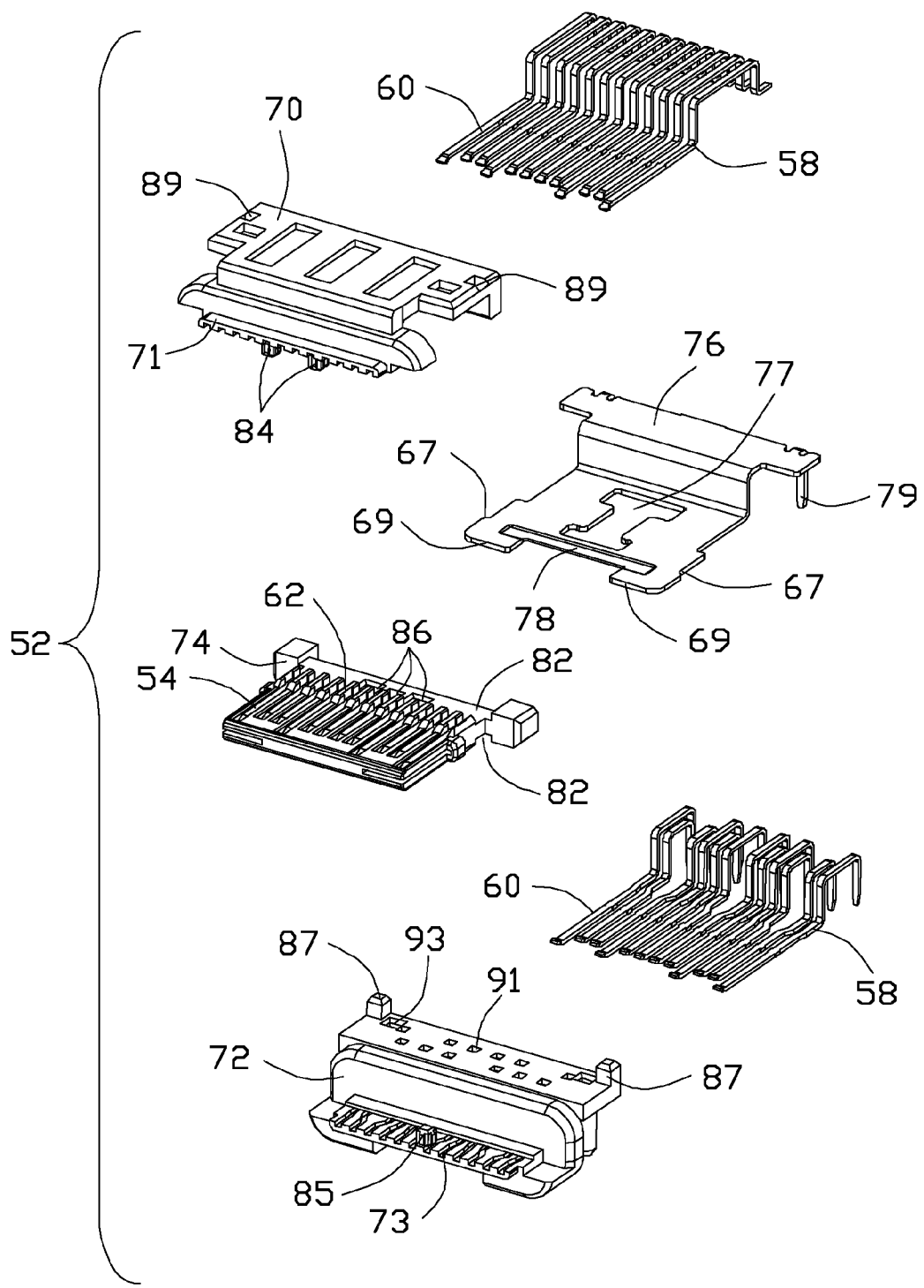
FIG. 7(A) is a front partially exploded perspective view of the receptacle connector of FIG. 1 to show the housing and the contacts thereof.
Figure 7B:
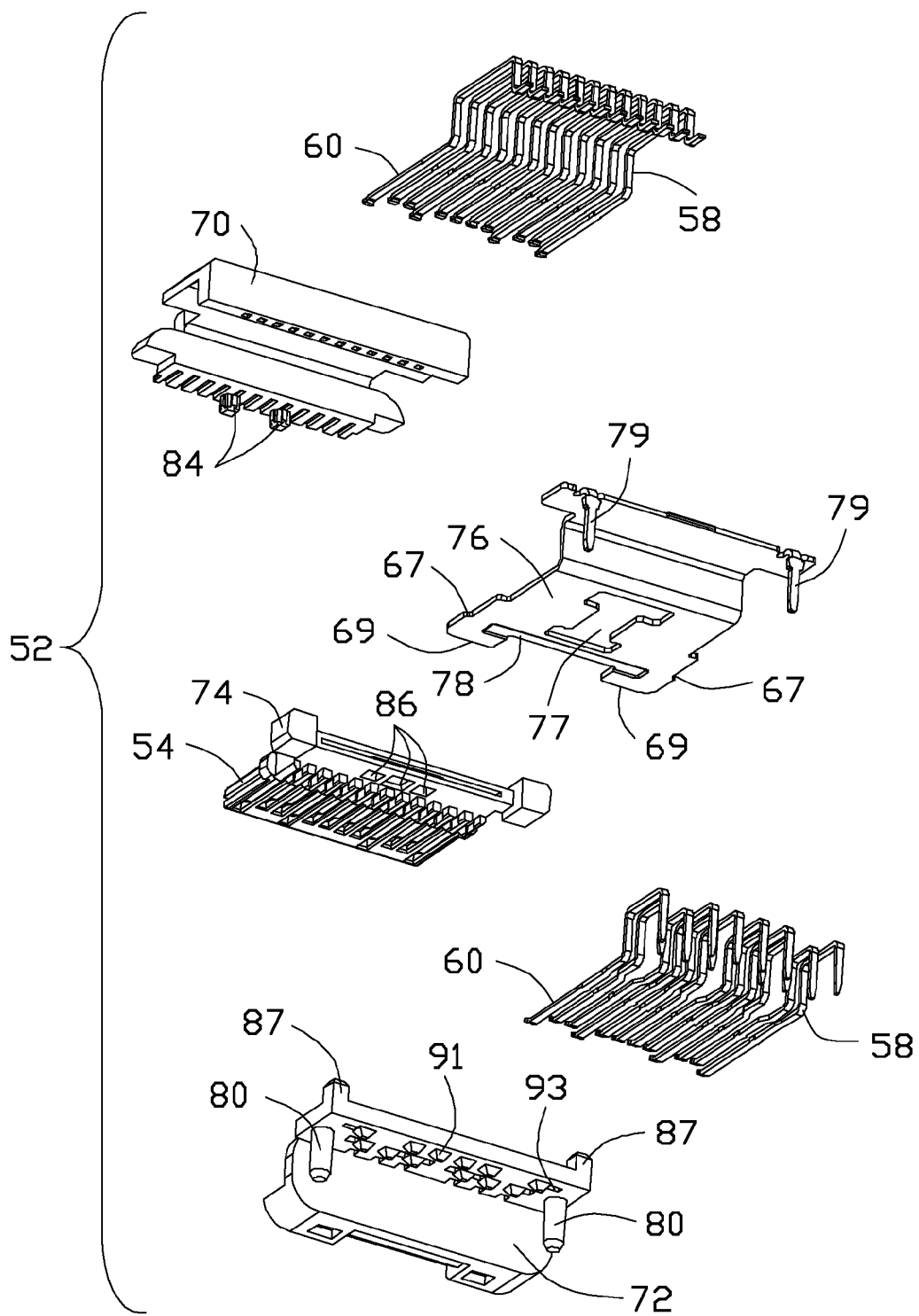
FIG. 7(B) is a rear partially exploded perspective view of the receptacle connector of FIG. 1 to show the housing and the contacts thereof.
Figure 8A:
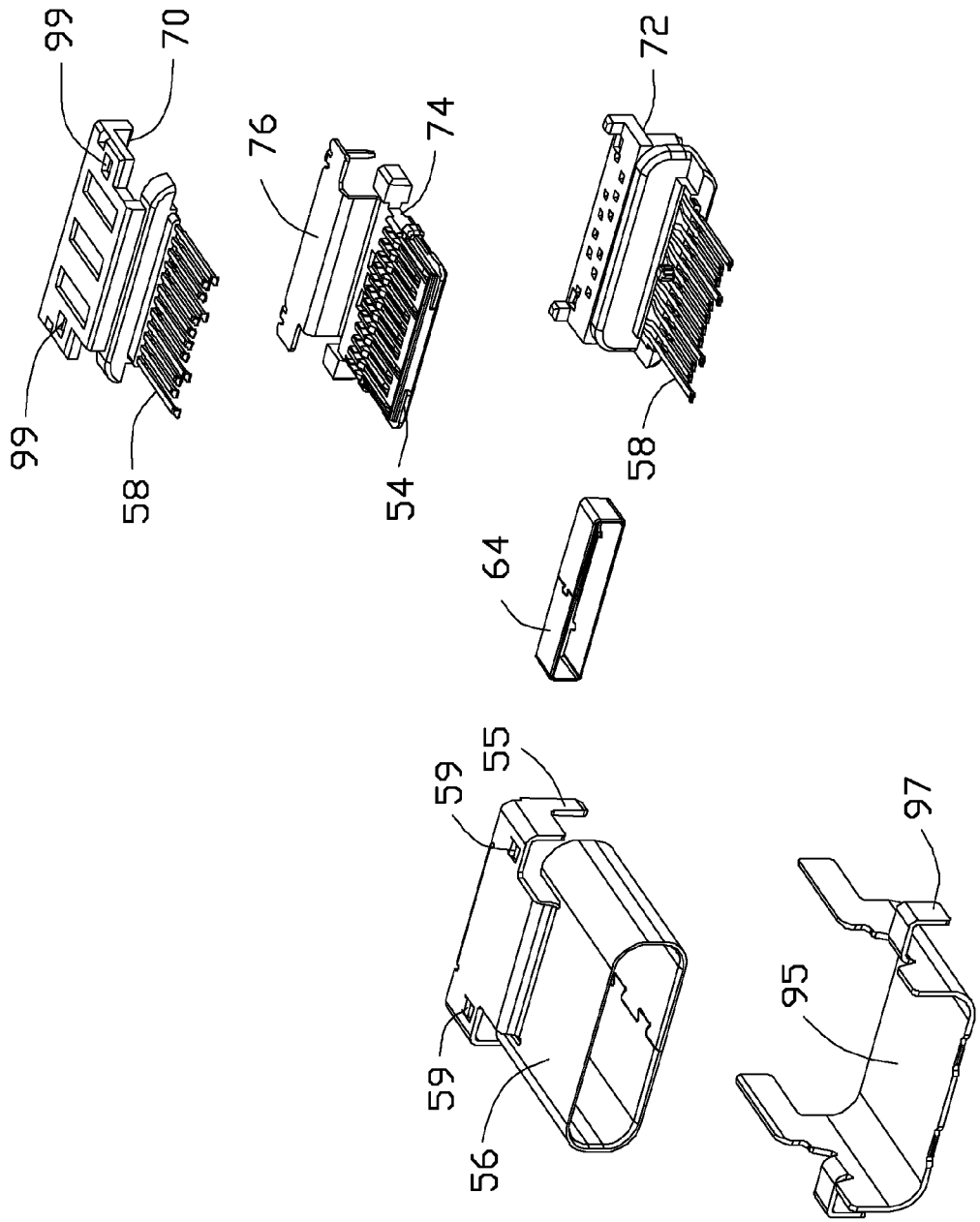
FIG. 8(A) is a front partially exploded perspective view of the receptacle connector of FIG. 1 wherein the housing and the contacts are pre-assembled together.
Figure 9:
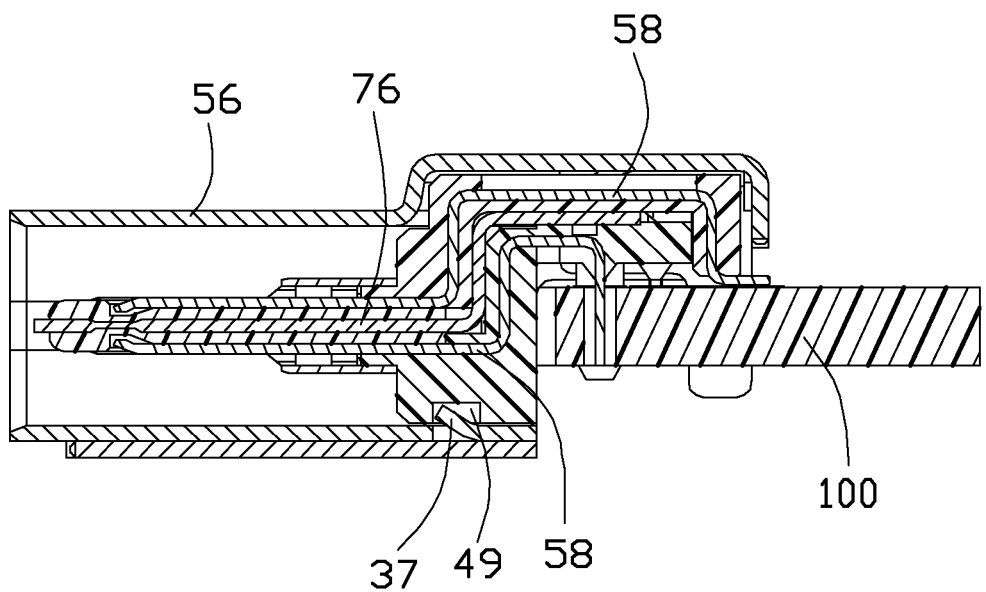
FIG. 9 is a cross-sectional view of the receptacle connector on the printed circuit board of FIG. 1 to show the retention tang of the shield.
Figure 9A:
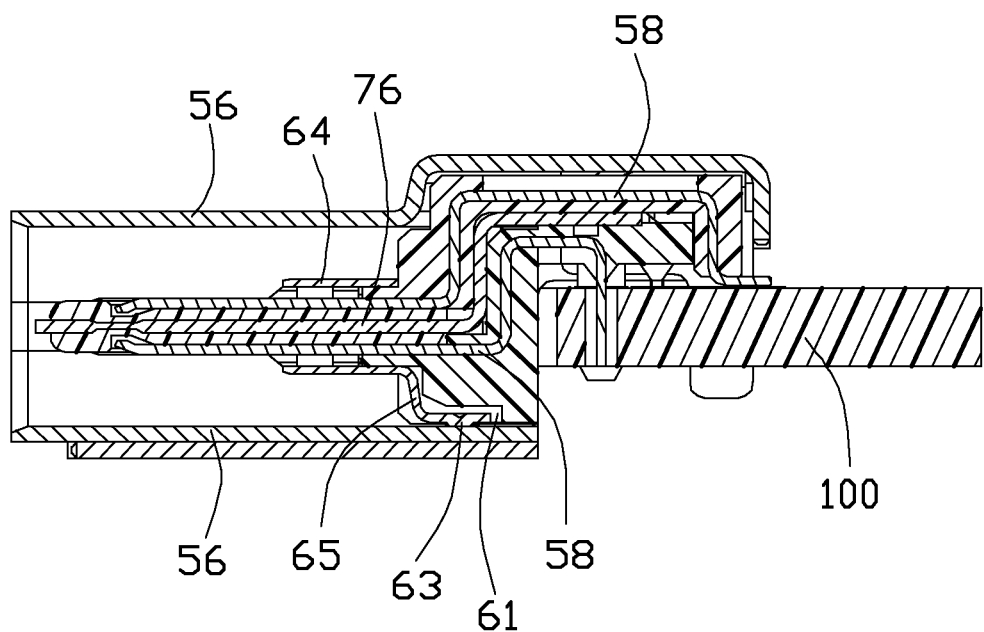
FIG. 9(A) is a cross-sectional view of the receptacle connector to show the extending plate of the collar.
Figure 10:
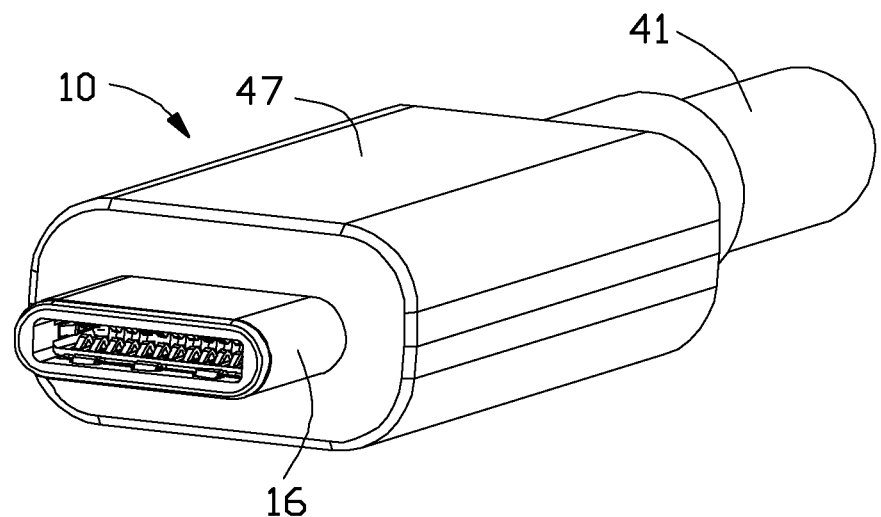
FIG. 10 is a front assembled perspective view of the plug connector of FIG. 1.
Figure 11A:
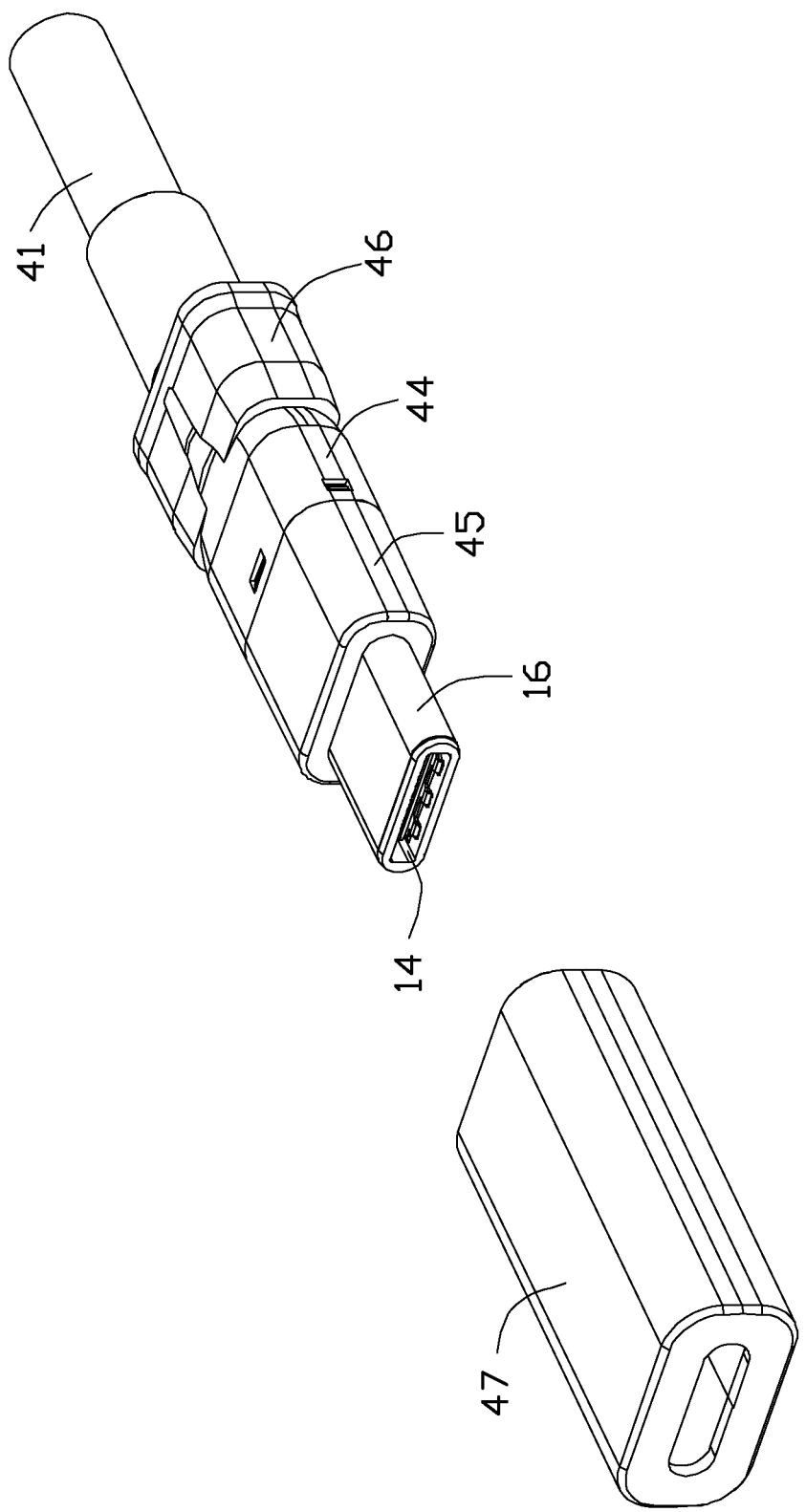
FIG. 11(A) is a front partially exploded perspective view of the plug connector of FIG. 1 wherein the cover is removed away from the remainder.
Figure 11B:
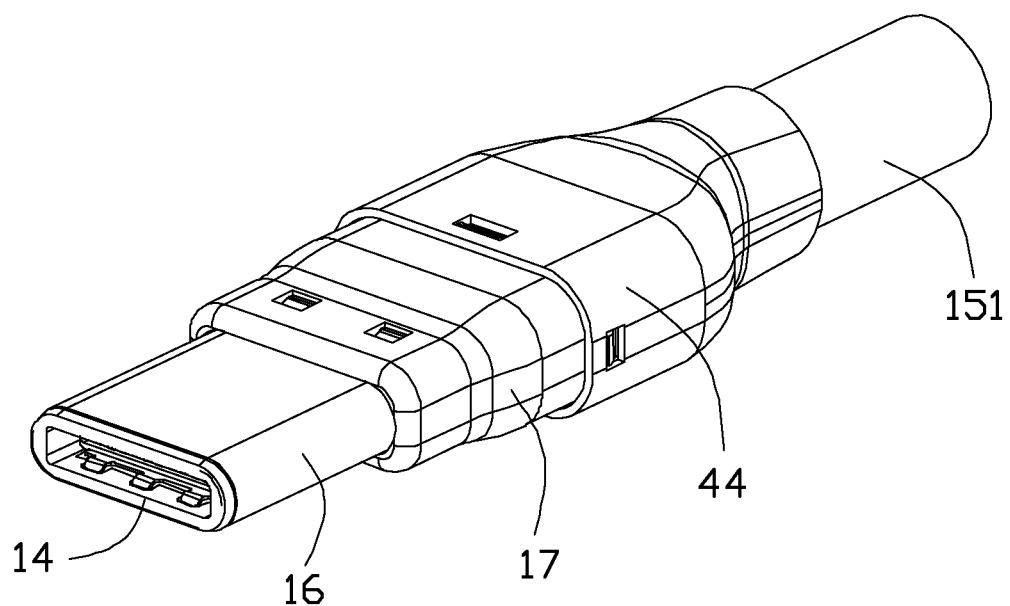
FIG. 11(B) is a front partially exploded perspective view of the plug connector of FIG. 11(A) wherein the front and rear over-moldings have been further removed.
Figure 12A:
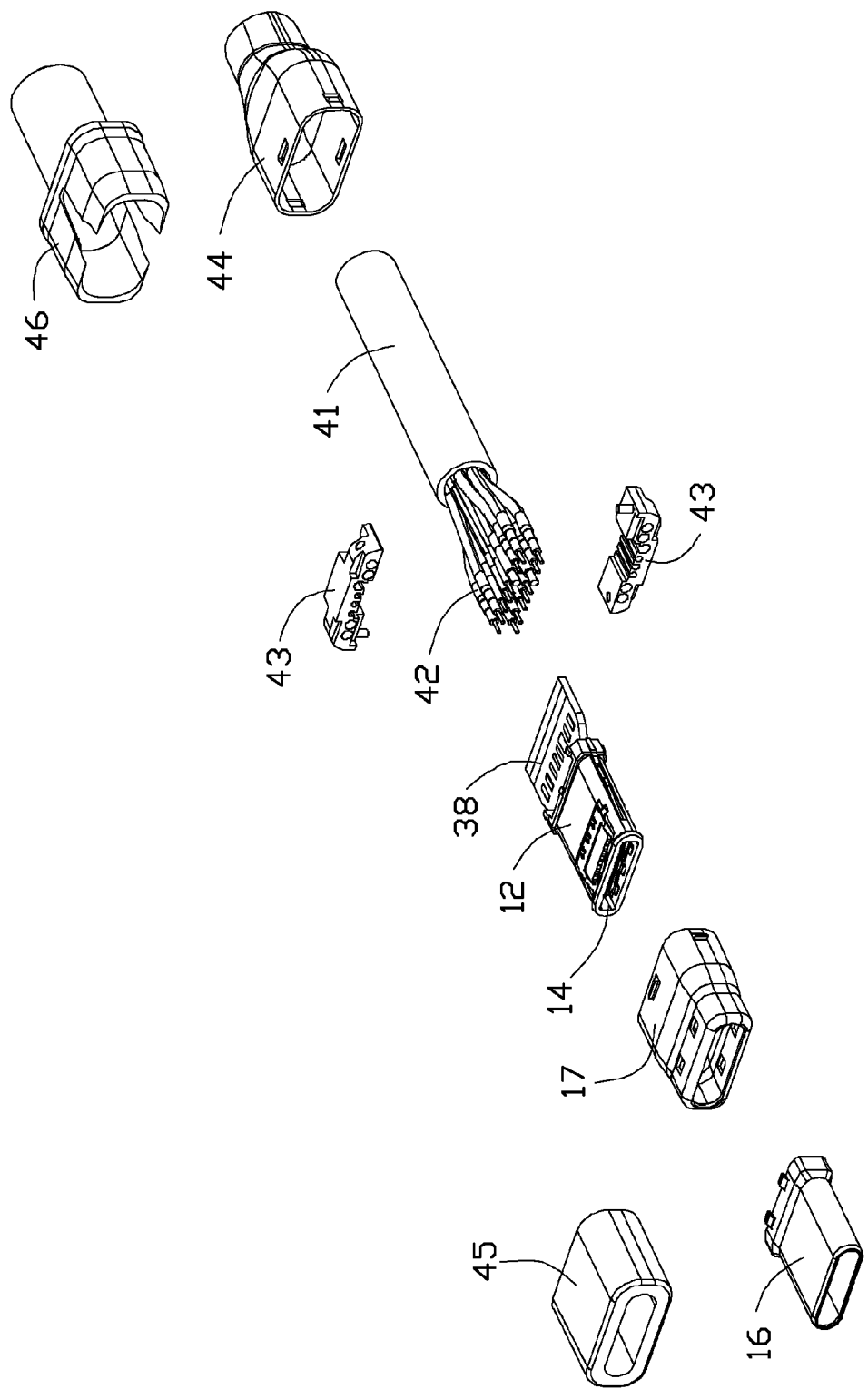
FIG. 12(A) is a front partially exploded perspective view of the plug connector of FIG. 1 without the cover thereof.
Figure 12B:
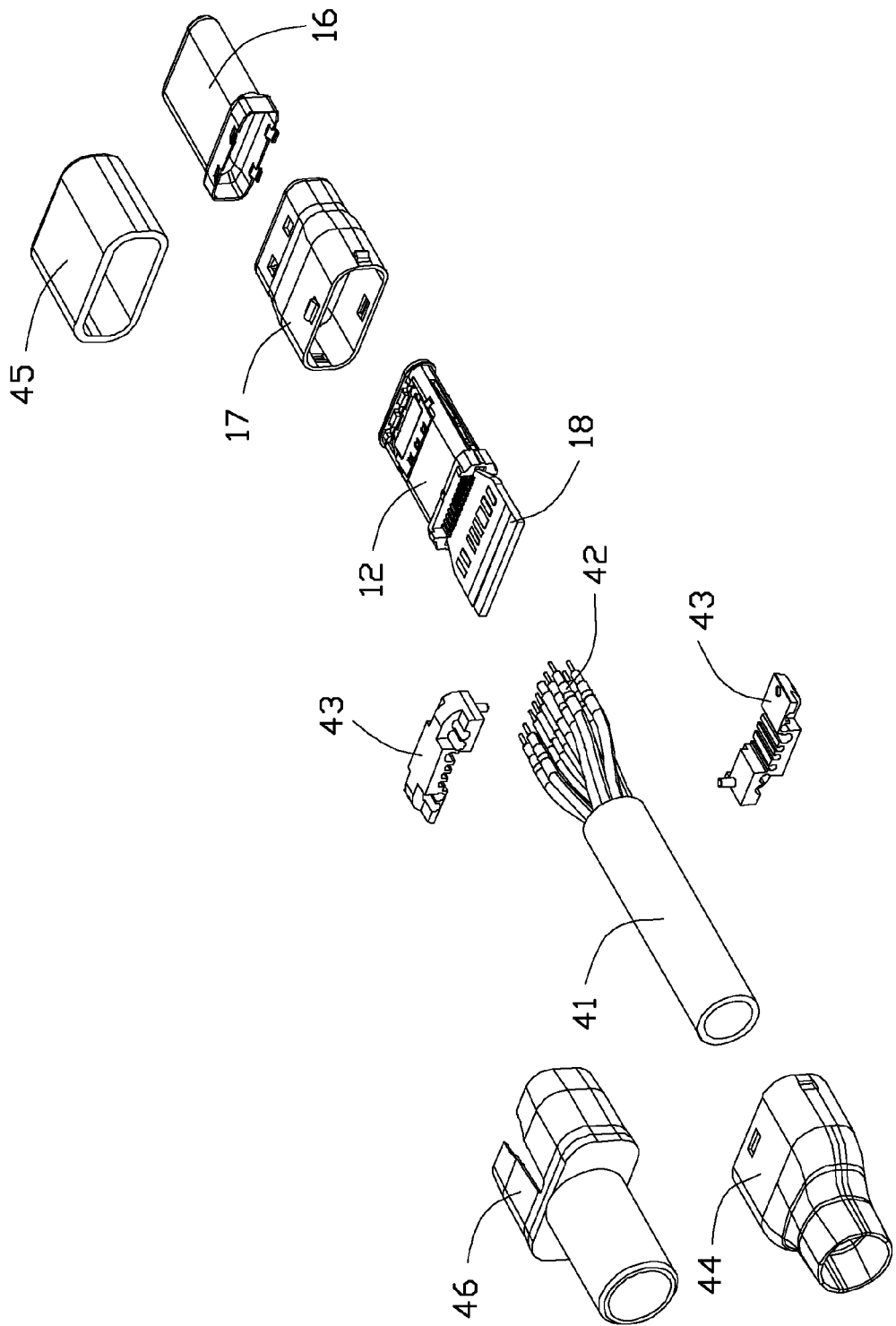
FIG. 12(B) is a rear partially exploded perspective view of the plug connector of FIG. 12(A).
Figure 13A:
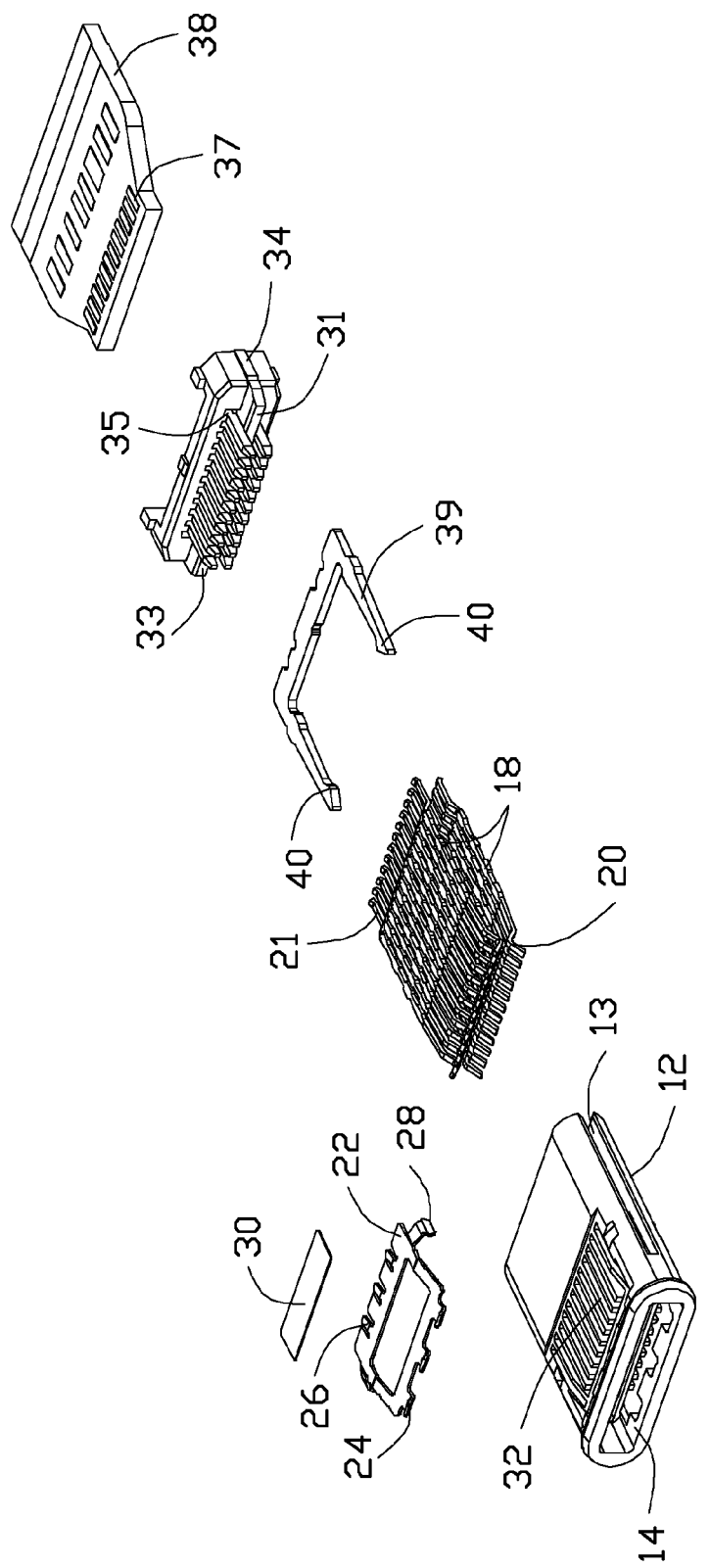
FIG. 13(A) is a front partially exploded perspective view of the plug connector of FIG. 12(A) by removal of additional parts therefrom.
Figure 13B:
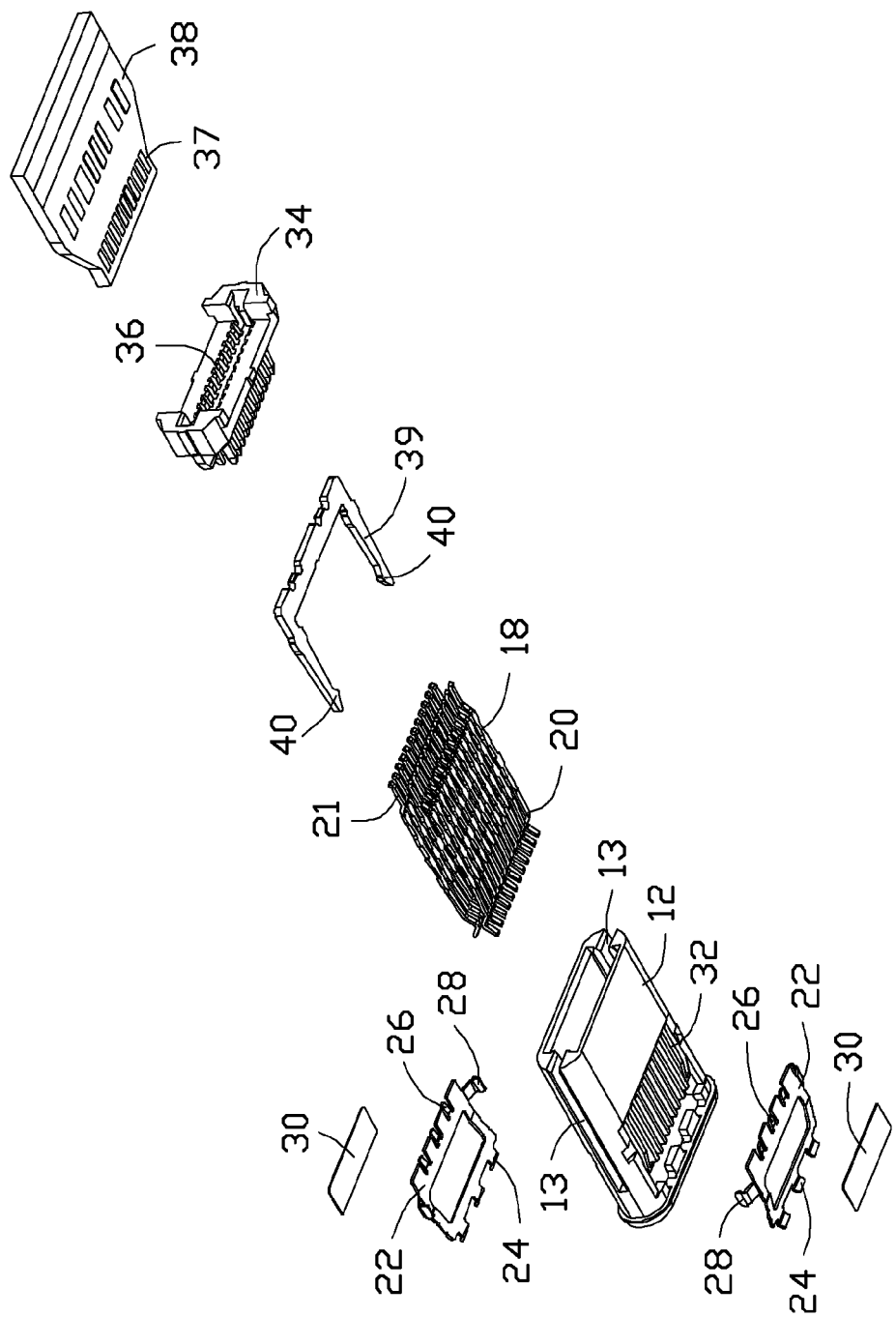
FIG. 13(B) is a rear partially exploded perspective view of the plug connector of FIG. 13(A).

Reference will now be made in detail to the preferred embodiment of the present invention. FIGS. 1 through 14 illustrate a first embodiment of the invention. FIGS. 1-2(B) show a plug connector 10 mated with a receptacle connector 50 mounted in a notch 102 of a printed circuit board. 100. Referring to FIGS. 3-9, the receptacle connector 50 includes an insulative housing 52 with a mating tongue 54 forwardly extending in a capsular mating cavity 57 of a metallic shield 56 which encloses the housing 52. Opposite upper and lower rows of contacts 58 are disposed in the housing 52 with corresponding contacting sections 60 exposed upon opposite surfaces of the mating tongue 54 in a diagonally symmetrical arrangement mechanically and electrically so as to allow a so-called flappable insertion of the plug connector 10 thereinto. A step structure 62 is formed around a root of the mating tongue 54. A one piece metallic EMI collar 64 includes a loop structure 66 intimately surrounding the step structure 62. The collar 64 further includes an L-shaped extending plate 65 equipped with embossments 63 thereon and received in the recess 61 of the lower piece 72 of the housing 52 (illustrated later) for mechanically and electrically connecting to the shield 56.

The housing 52 is composed of the upper piece 70 and a lower piece 72 commonly sandwiching therebeween a middle piece 74 which forms the mating tongue 54. The upper row contacts 58 are associated with the upper piece 70, the lower row contacts 58 are associated with a lower piece 72 and the shielding plate 76 is associated with the middle piece 74 via an insert molding process wherein the contacting sections 60 of the upper row contacts 58 and those of the lower rows contacts 58 are seated upon opposite upper surface and lower surface of the mating tongue 54, respectively, as mentioned before. Understandably, the housing 52 and the associated contacts 58 may be deemed wholly as a so-called terminal module implying the terminals being integrally formed within an insulator. A rear portion of the step structure 62 is removed to have a front edge region 71 of the upper piece 70 and the front edge region 73 of the lower piece 72 sandwiched between the middle piece 74 and the loop structure 66 of the EMI collar 64 so as to enhance the strength during mating under some bending. In this embodiment, the shielding plate 76 defines an opening 77 and a thinner area 78 for both securing and impedance consideration, and further a pair of mounting legs 79 so as to efficiently separate the upper row contacts 58 and the lower row contacts 58 from each other wherein the upper row contacts 58 form the surface mount type tail sections while the lower row contacts 58 form the through hole type tail sections. In an alternate embodiment, the thinner area 78 may be totally removed from the shielding plate 76. The lower piece 72 includes a pair of mounting posts 80 receiving in the corresponding through hole for mounting the housing 52 to the printed circuit board 100. The lower piece 72 further forms a pair of recessions 49 to receive the corresponding retention tangs 37 of the shield 56.

In this embodiment, the middle piece 74 forms a pair of recesses 82 to respectively receive the corresponding protrusions 84 of the upper piece 70 and the lower piece 72 for securing the upper piece 70, the lower piece 72 and the middle piece 74 therebetween in a stacked manner wherein the upper piece 70 further include a pair of downward assembling poles 84 received in the corresponding alignment holes 86 of the middle piece 74, and the lower piece 72 further includes an upward assembling pole 85 received in the corresponding alignment holes 86 of the middle piece 74, and the lower piece 72 further forms a pair of upward locating posts 87 received within the corresponding recesses 89 in the upper piece 70. In this embodiment, the lower piece 72 defines a plurality of through holes 91 and 93 to receive the tail sections of the lower row contacts 58 and the mounting legs 79 of the shielding plate 76 to extend therethough as an alignment spacer. Notably, the shielding plate 76 forms a front edge section 69 extending forwardly beyond a front edge of the mating tongue 54 for anti-mismating consideration, and a pair of lateral edge sections 67 extending either beyond or behind the side edge of the mating tongue 54 for locking with a latch 39 of the plug connector 10 (illustrated later). Understandably, the latch 39 may continuously contact the lateral edge sections 67 during the mating procedure from the initial mating position around the corner of the shielding plate 76 to the final locking position around a notch structure of the lateral edge section 67. In brief, the shielding plate 76 is essentially multifunctional to perform shielding, grounding, reinforcing, anti-mis-mating and locking. A metallic bracket 95 is soldered under the shield 56 and forms a pair of supporting legs 97 mounted into the through hole 103 of the printed circuit board 100 for supporting the receptacle connector 50 within the notch 102 of the printed circuit board 100. The shield 56 further includes an upside-down U-shaped structure (not labeled) on a rear portion covering the rear portion of the housing 52 with a pair of mounting legs 55 received in the through holes 104 for mounting to the printed circuit board 100 and a pair of locking tabs 59 received in the recesses 99 of the upper piece 70 after the shield 56 is rearwardly assembled to the housing 52 in a front-to-back direction. Notably, the mounting leg 79 of the shielding plate 76 share the same through hole with the neighboring grounding contact tail for enhancing grounding effect.

Figure 14:
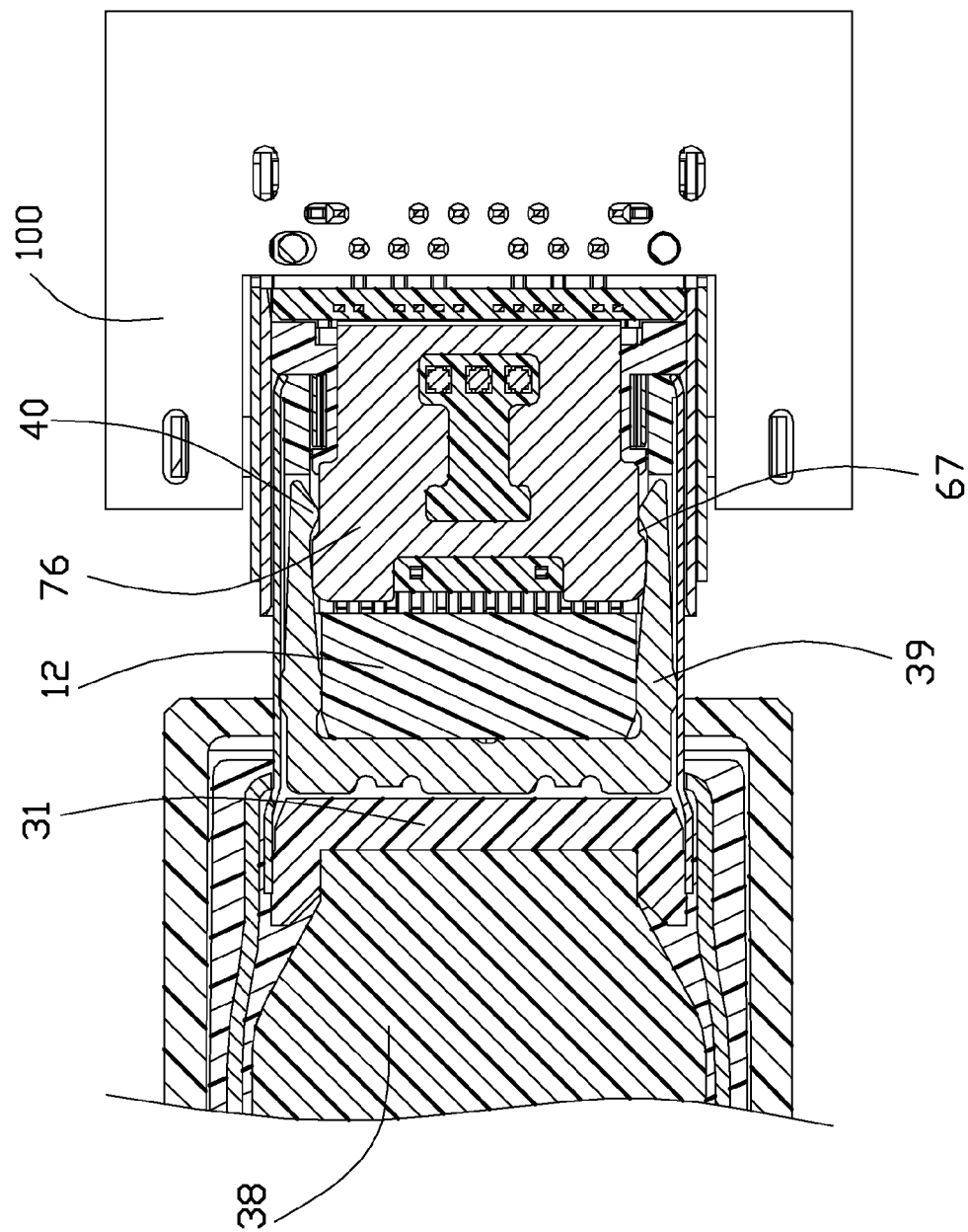
FIG. 14 is a cross-sectional view of the mated plug connector and receptacle connector of FIG. 1 to show how the latch of the plug connector is lockable engaged with the shielding plate of the receptacle connector.
Figure 15A:
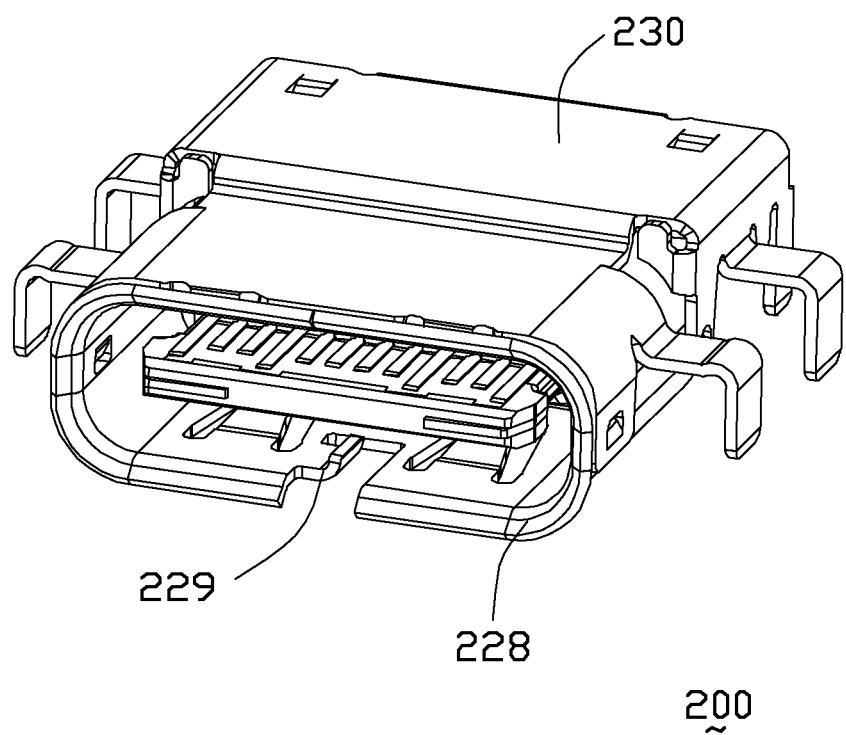
FIG. 15(A) is a front perspective view of a second embodiment of the receptacle connector according to the invention.
Figure 15B:
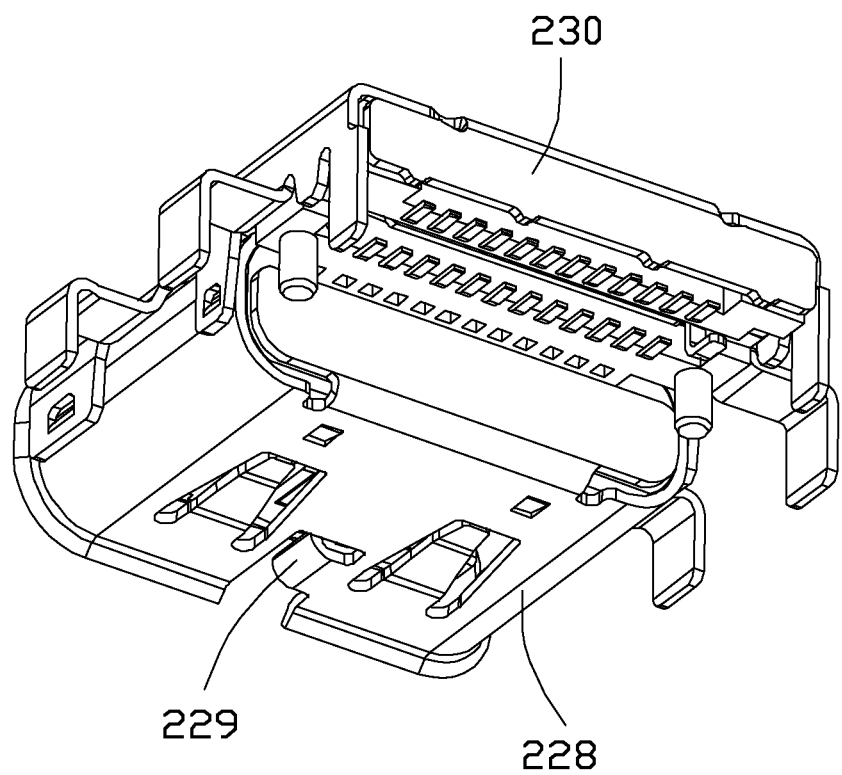
FIG. 15(B) is a rear perspective view of the receptacle connector of FIG. 15(A).
Figure 16A:
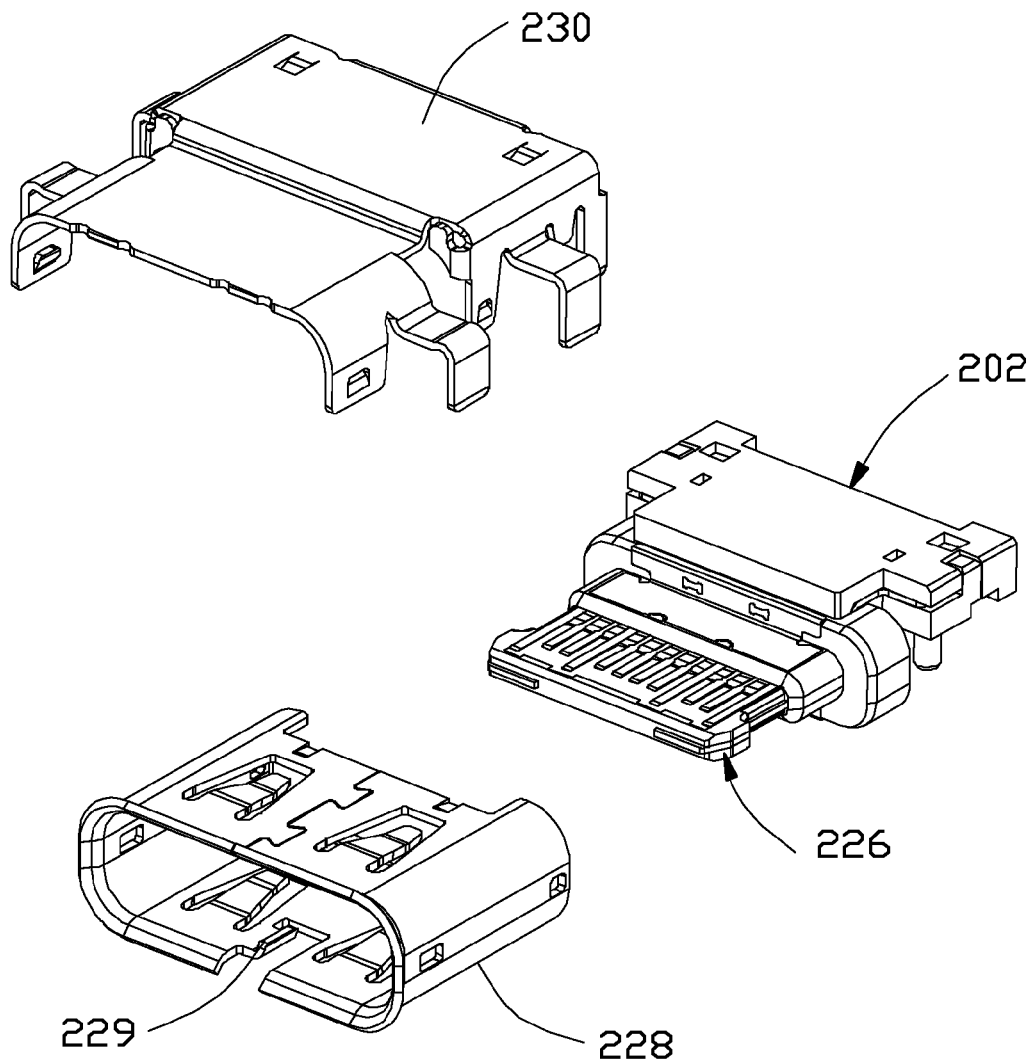
FIG. 16(A) is a front exploded perspective view of the receptacle connector of FIG. 15(A).
Figure 16B:
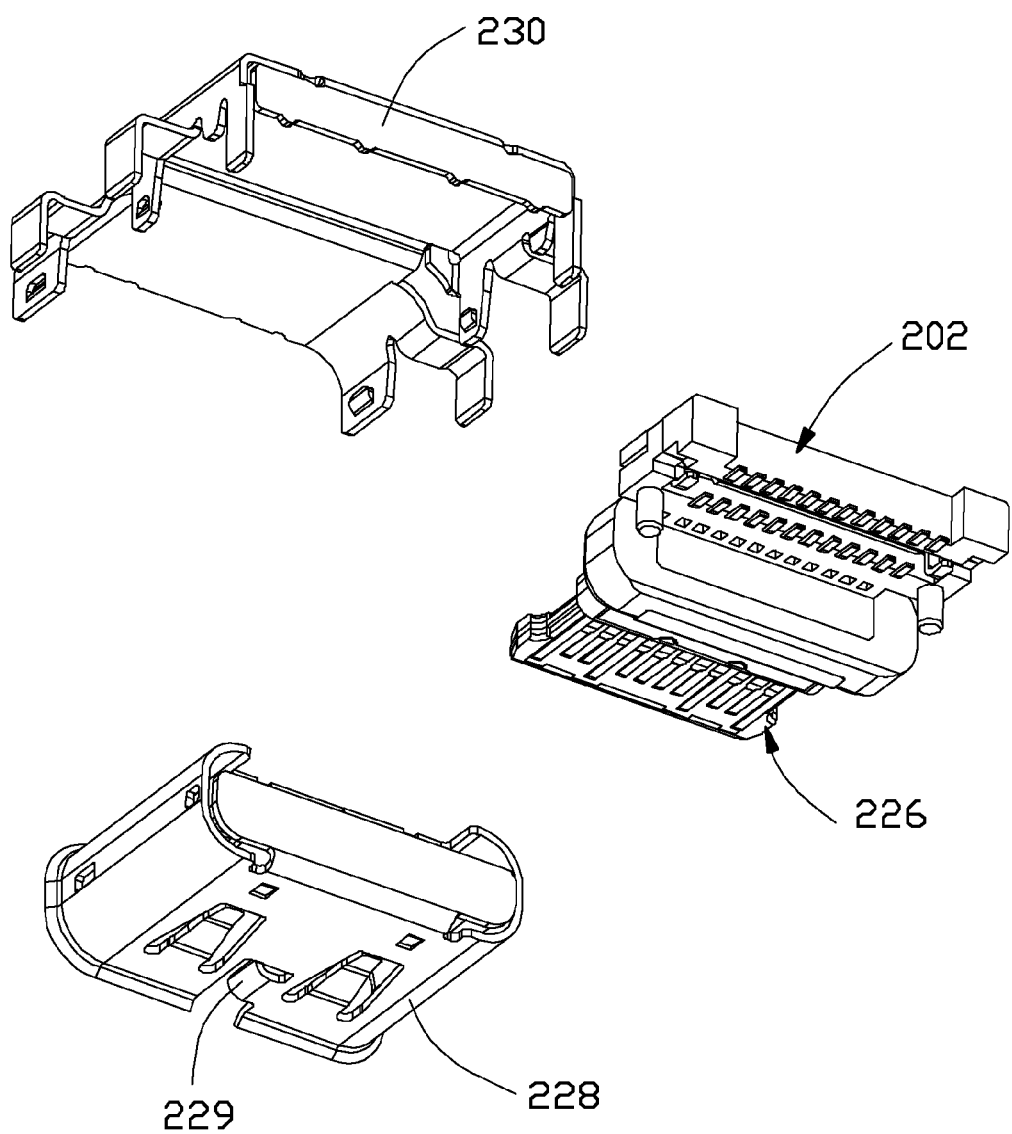
FIG. 16(B) is a rear exploded perspective view of the receptacle connector of FIG. 15(B)
Figure 17A:
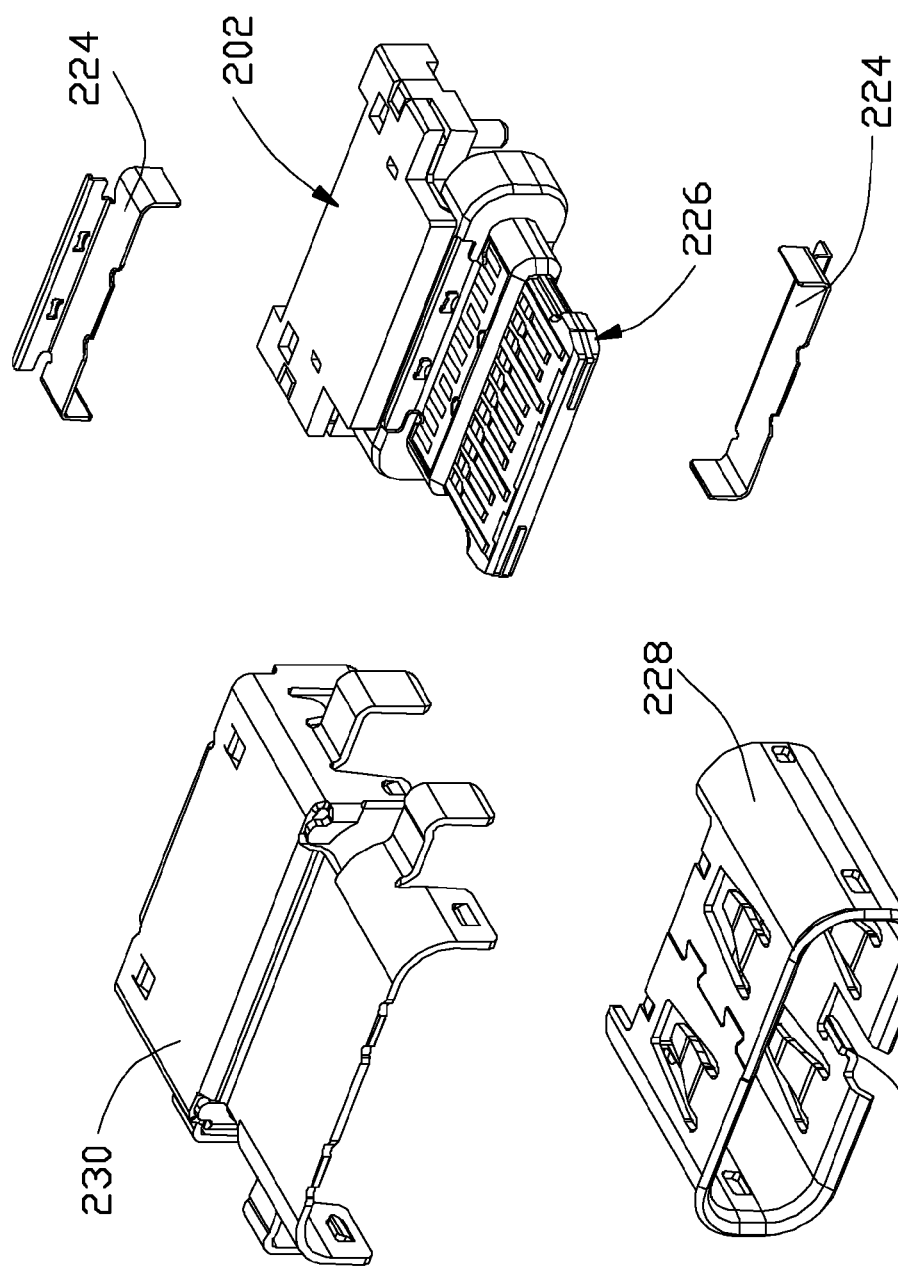
FIG. 17(A) is a further front exploded perspective view of the receptacle connector of FIG. 16 (A).
Figure 17B:
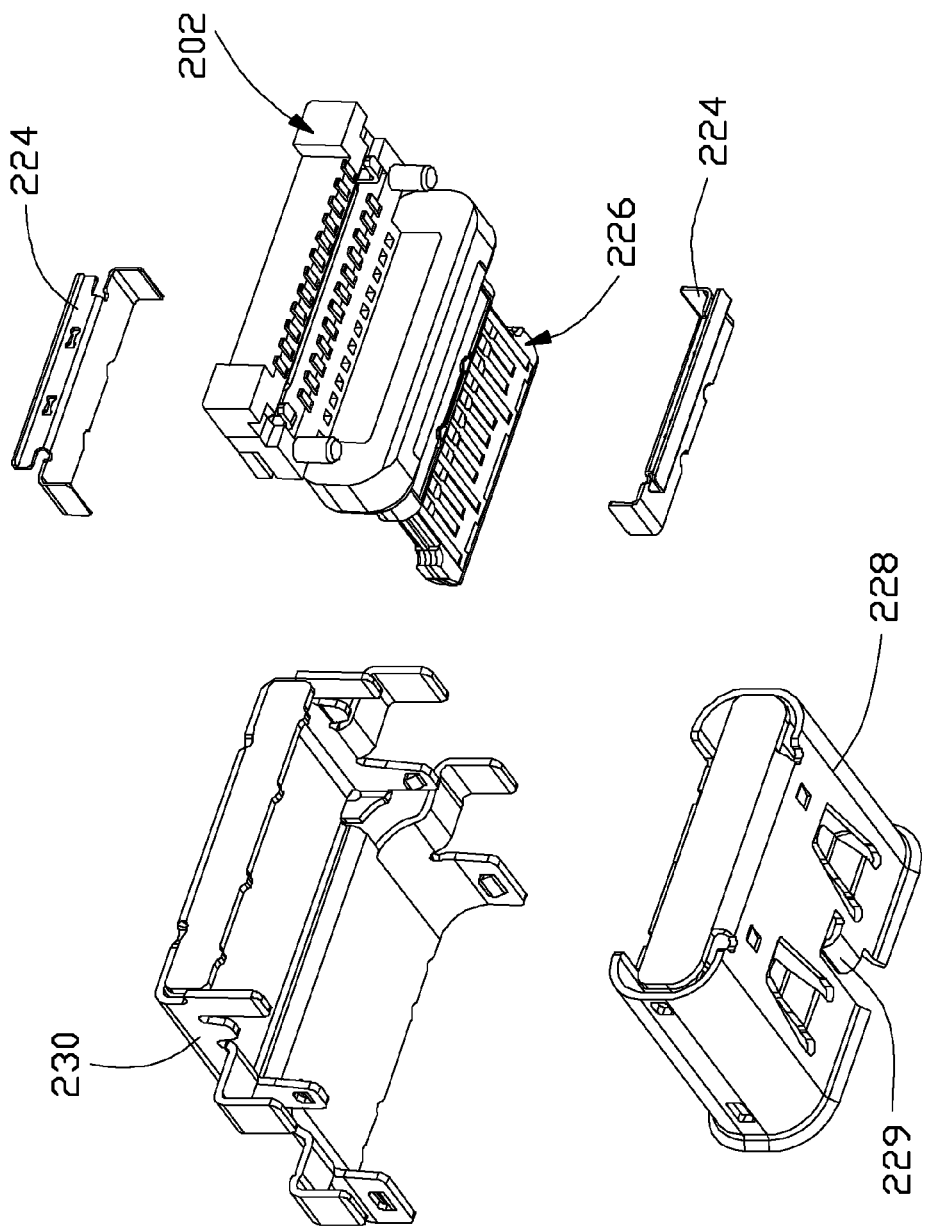
FIG. 17(B) is a further rear exploded perspective view of the receptacle connector of FIG. 16(B).
Figure 18A:
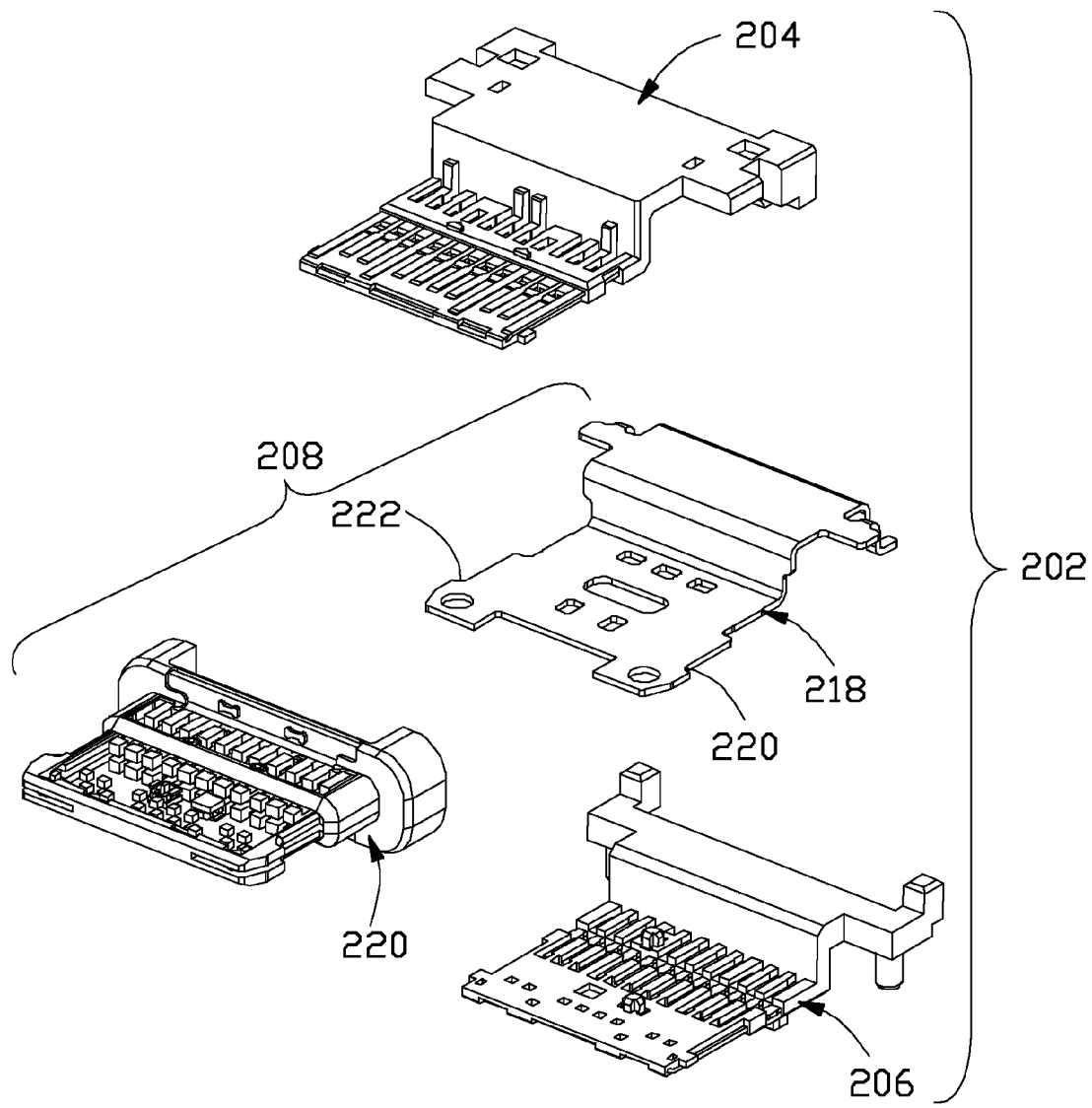
FIG. 18(A) is a further front exploded perspective view of the receptacle connector of FIG. 17(A).
Figure 18B:
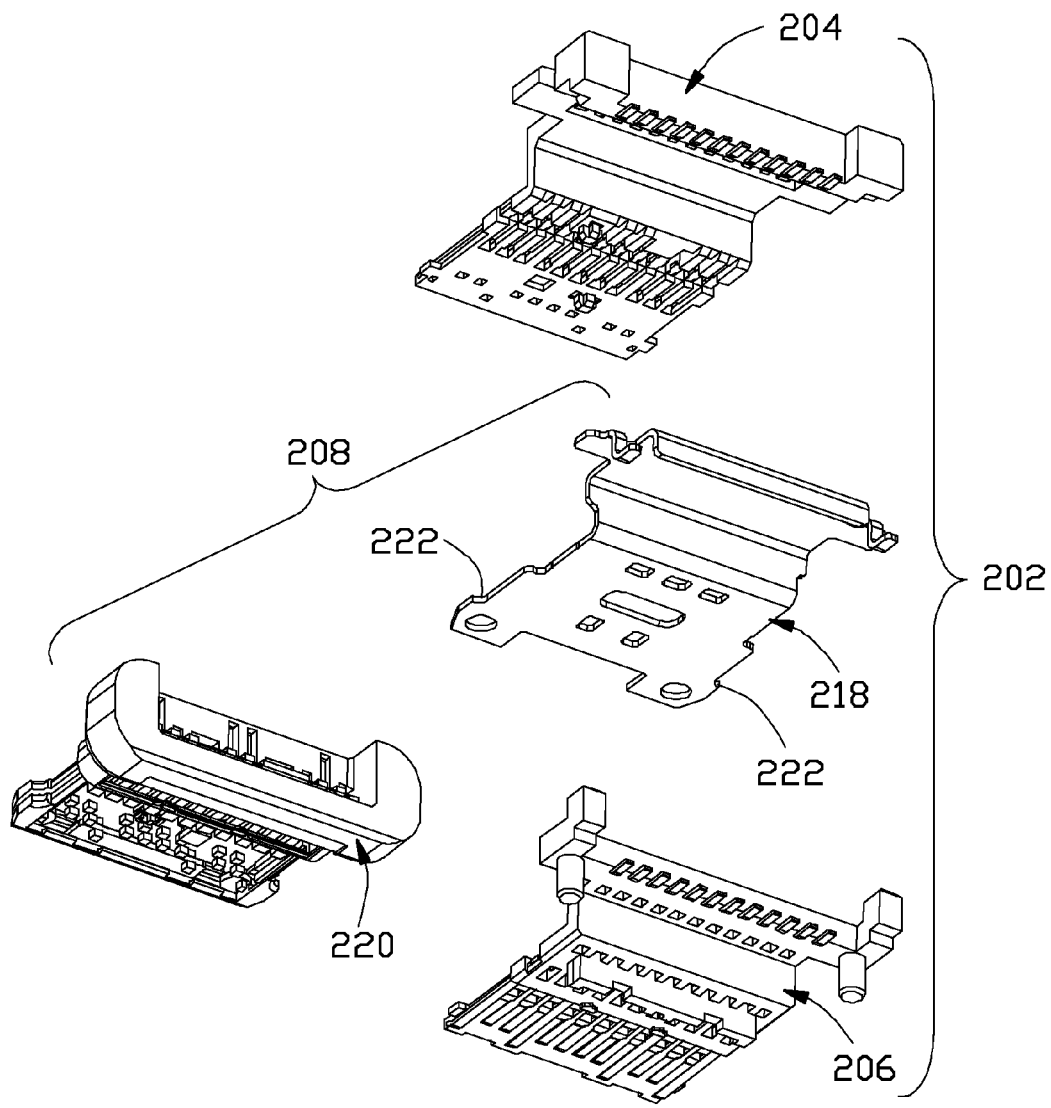
FIG. 18(B) is a further rear exploded perspective view of the receptacle connector of FIG. 17(B).
Figure 19A:
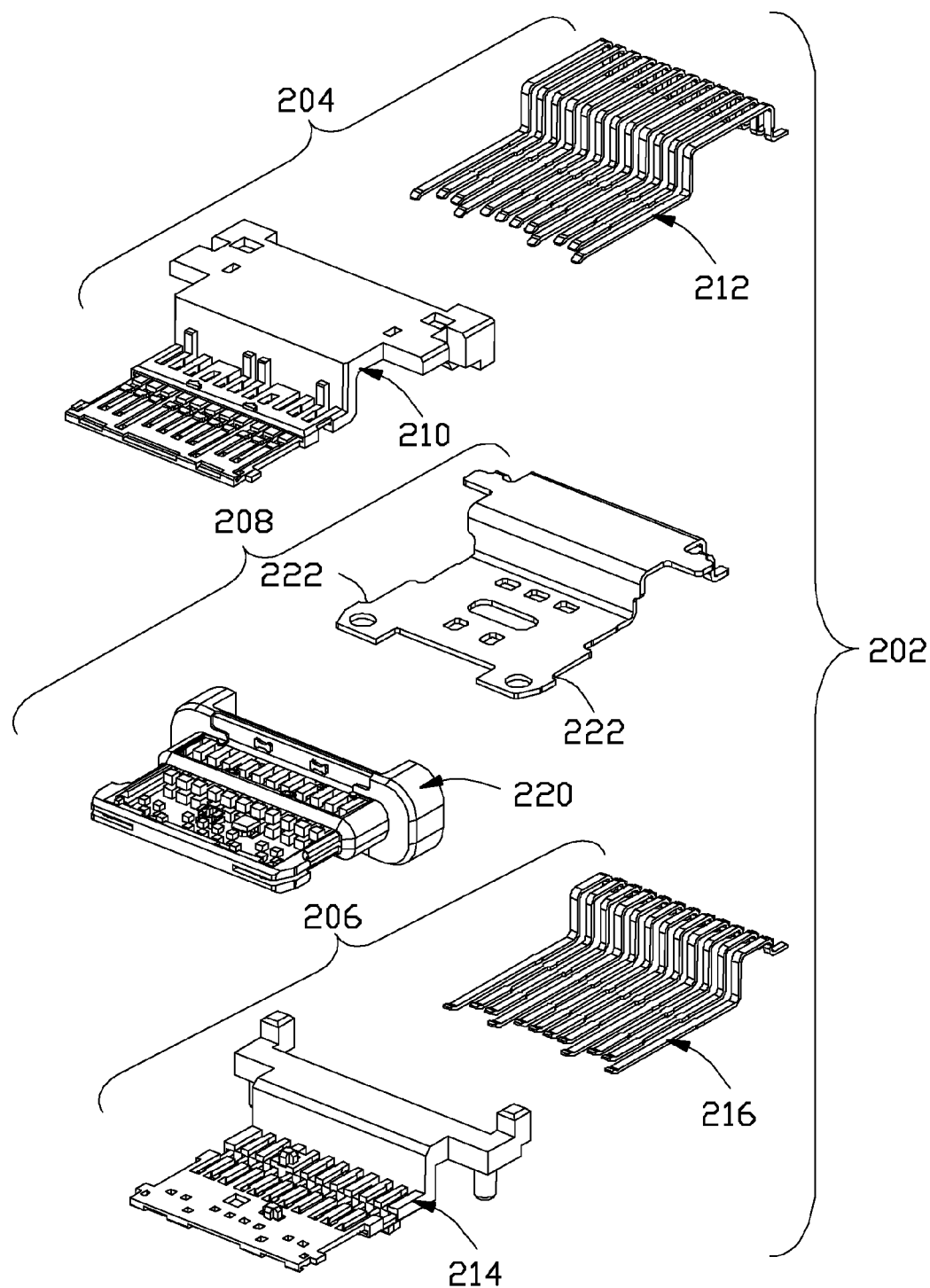
FIG. 19(A) is further front exploded perspective view of the receptacle connector of FIG. 18(A).
Figure 19B:
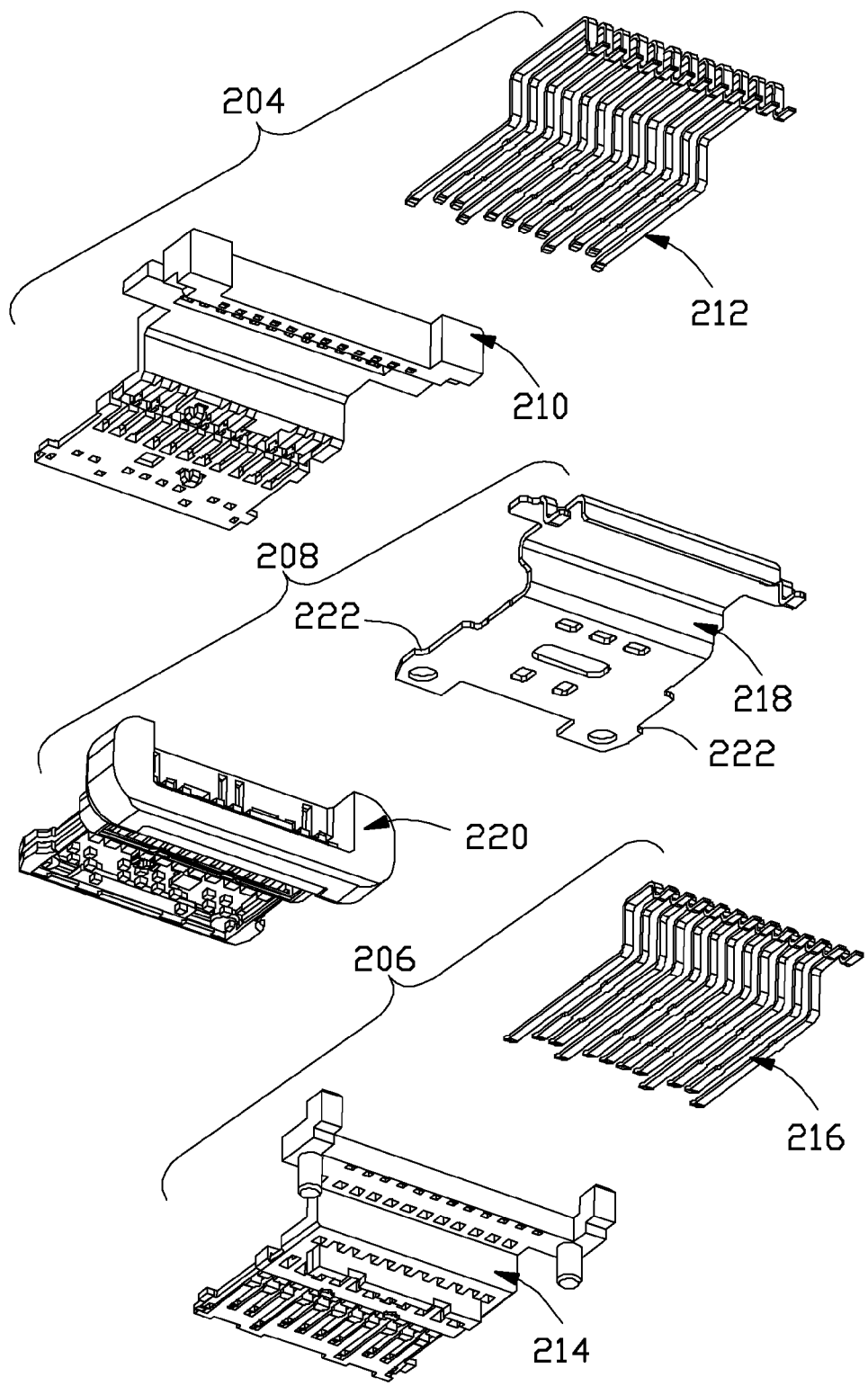
FIG. 19(B) is a further rear exploded perspective view of the receptacle connector of FIG. 18(B).
Figure 20:
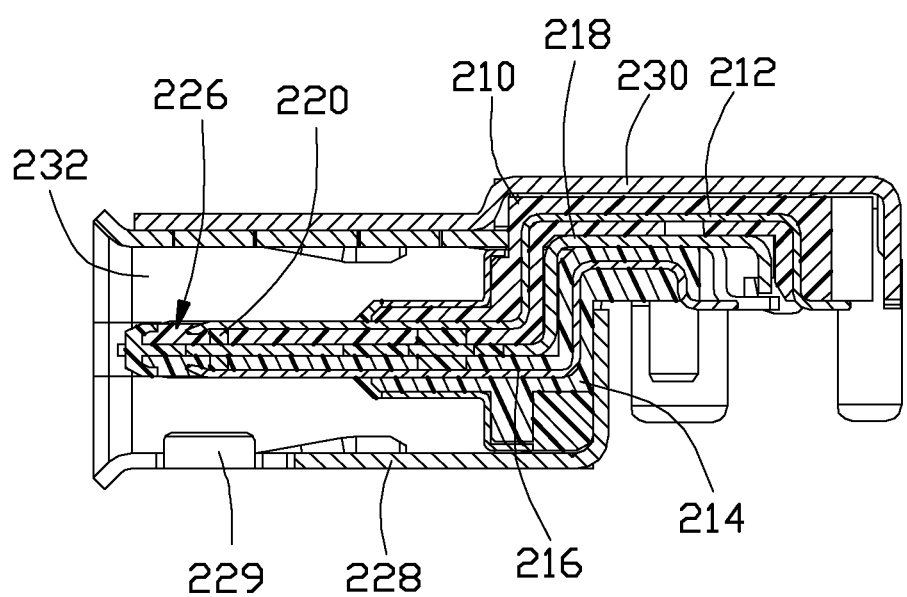
FIG. 20 is a cross-sectional view of the receptacle connector of FIG. 15(A).
Figure 21A:
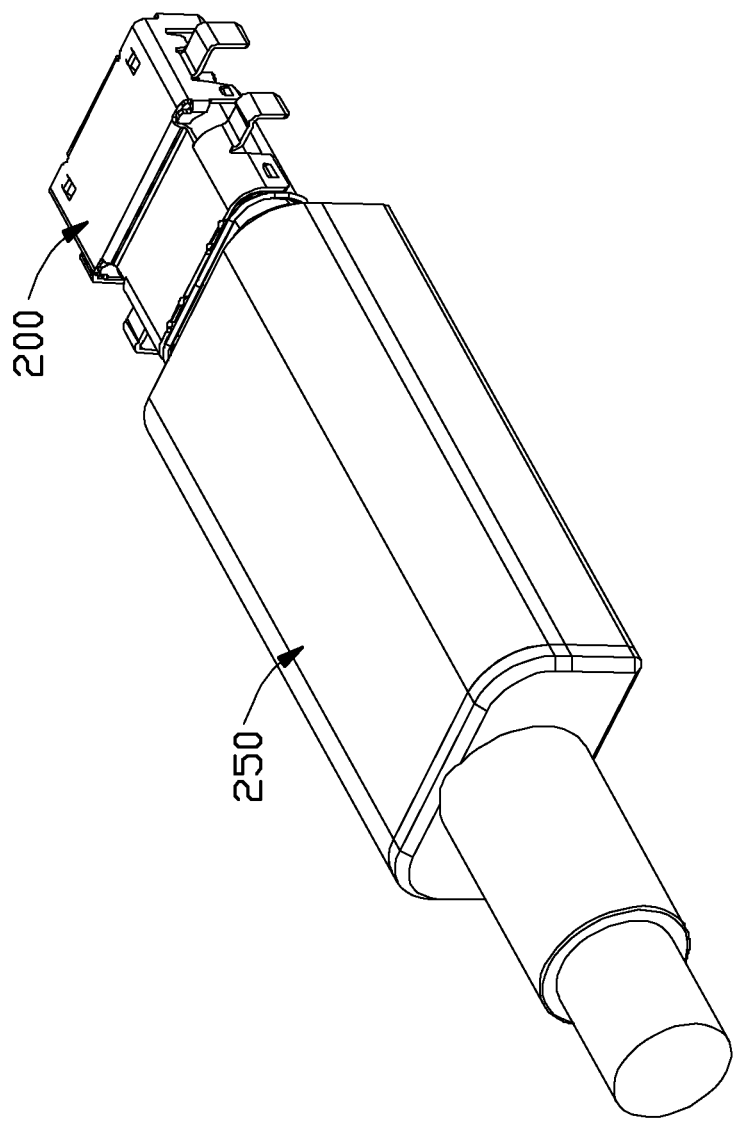
FIG. 21(A) is a front assembled perspective view of the receptacle connector of FIG. 15(A) and the complementary plug connector mated with each other.
Figure 21B:
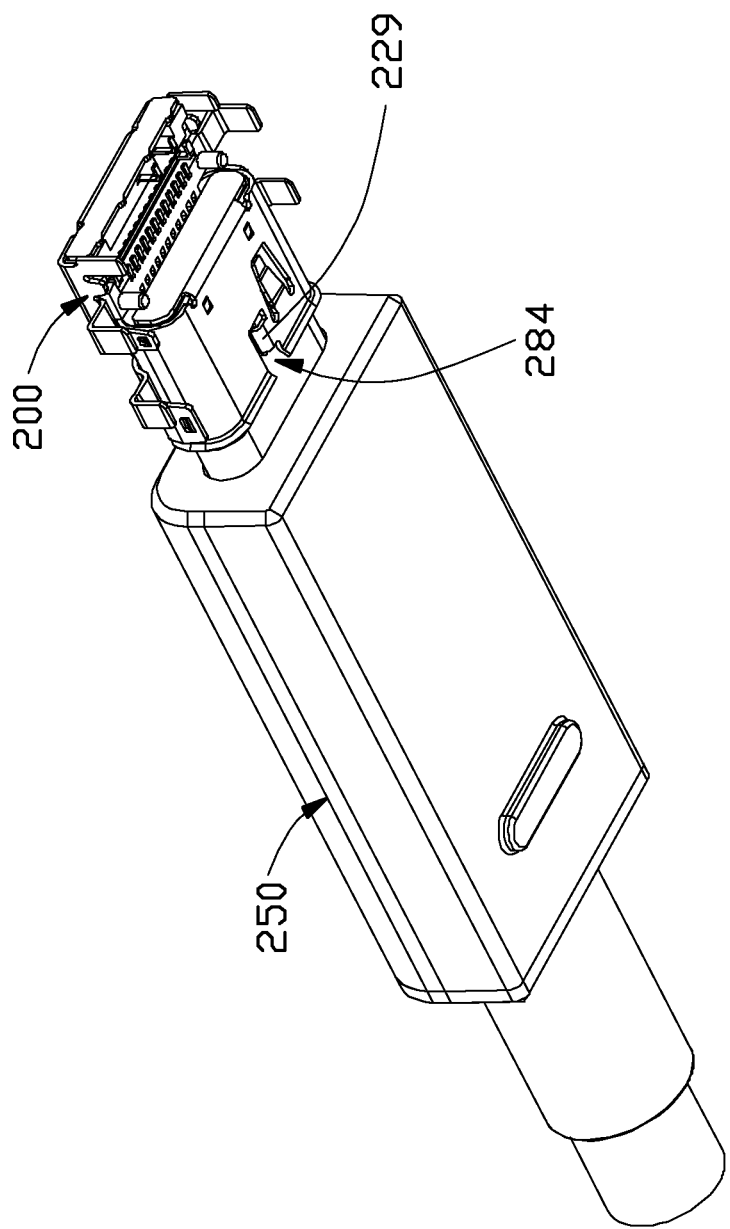
FIG. 21(B) is a rear assembled perspective view of the receptacle connector and the plug connector of FIG. 21(A).
Figure 22A:
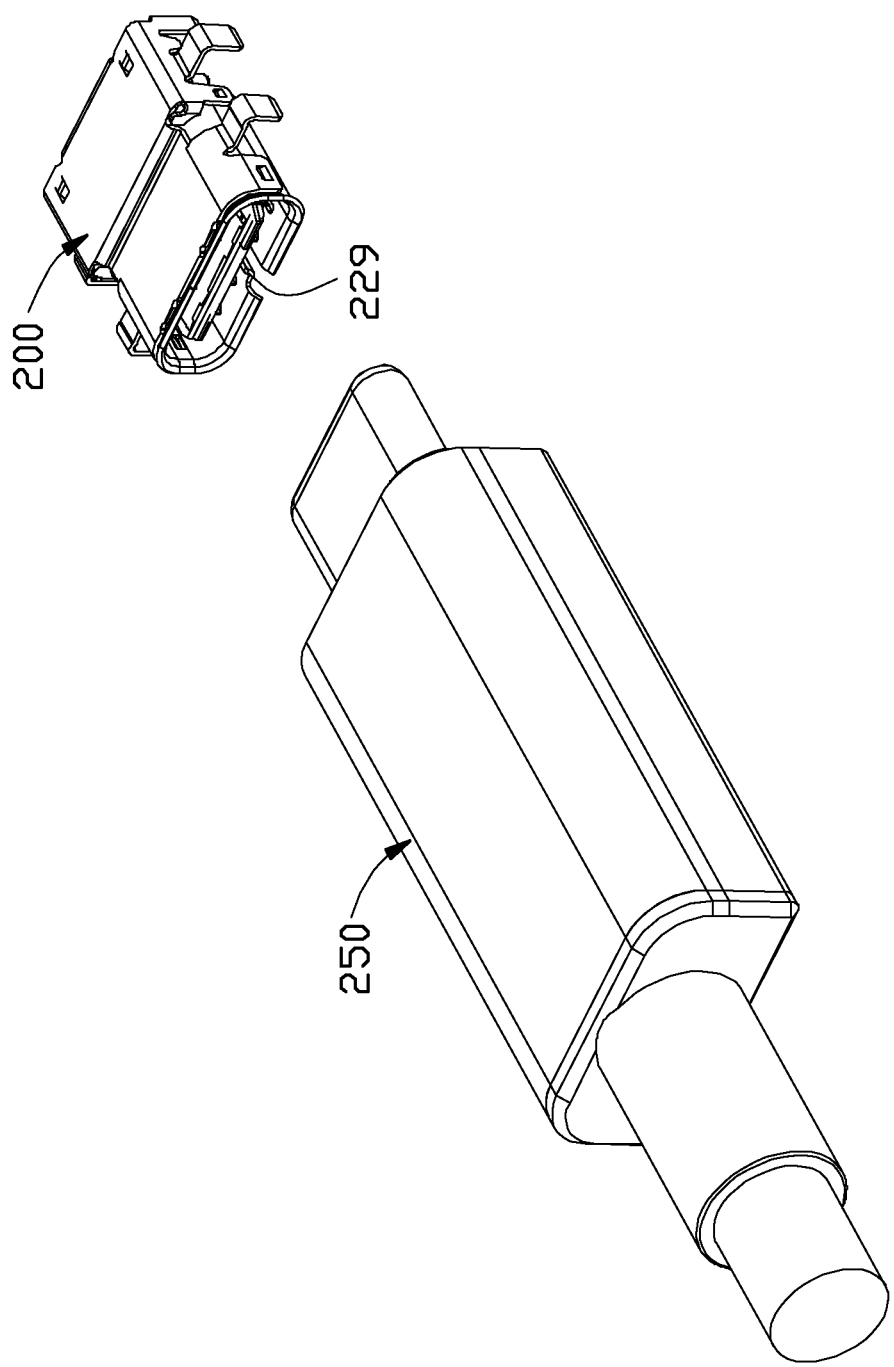
FIG. 22(A) is a front disassembled perspective view of the receptacle connector and the plug connector of FIG. 21(A).
Figure 22B:
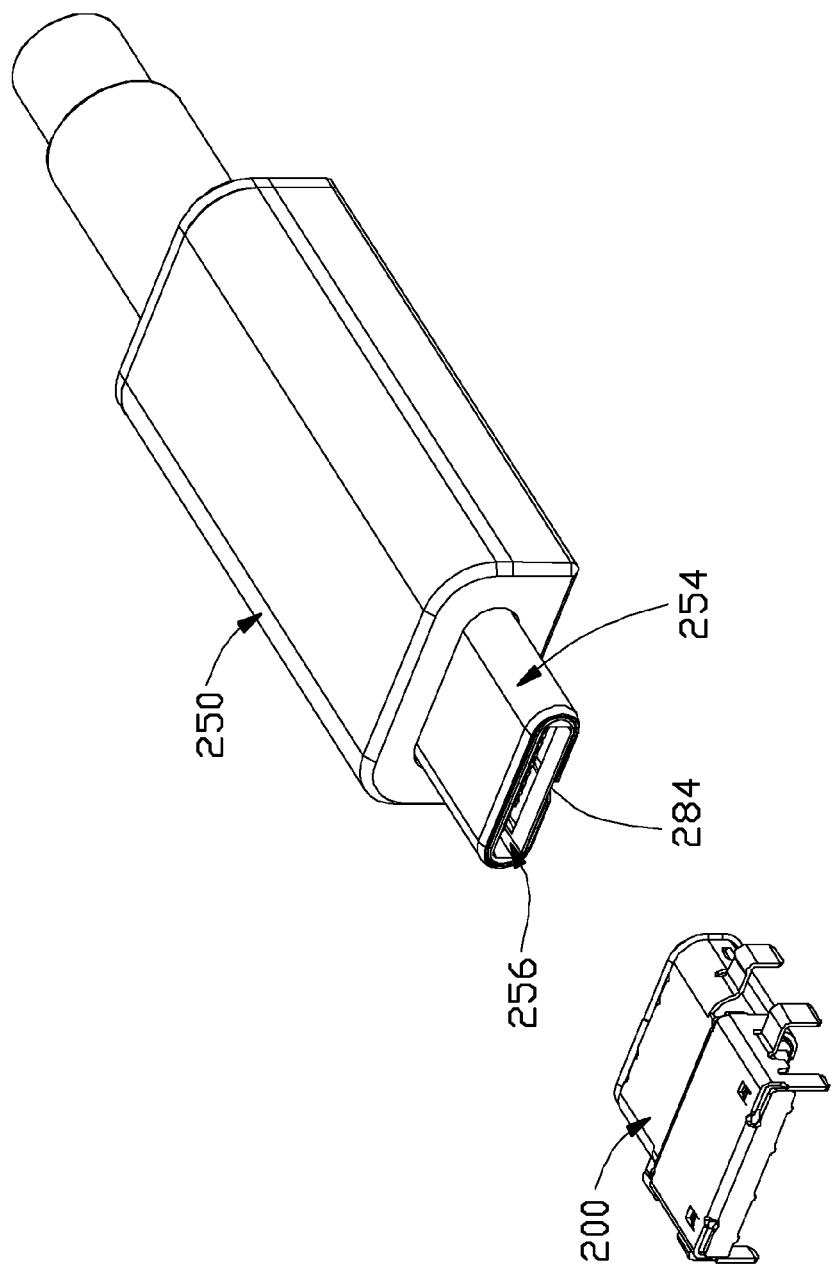
FIG. 22(B) is another front disassembled perspective view of the receptacle connector and the plug connector of FIG. 21(A).
Figure 22C:
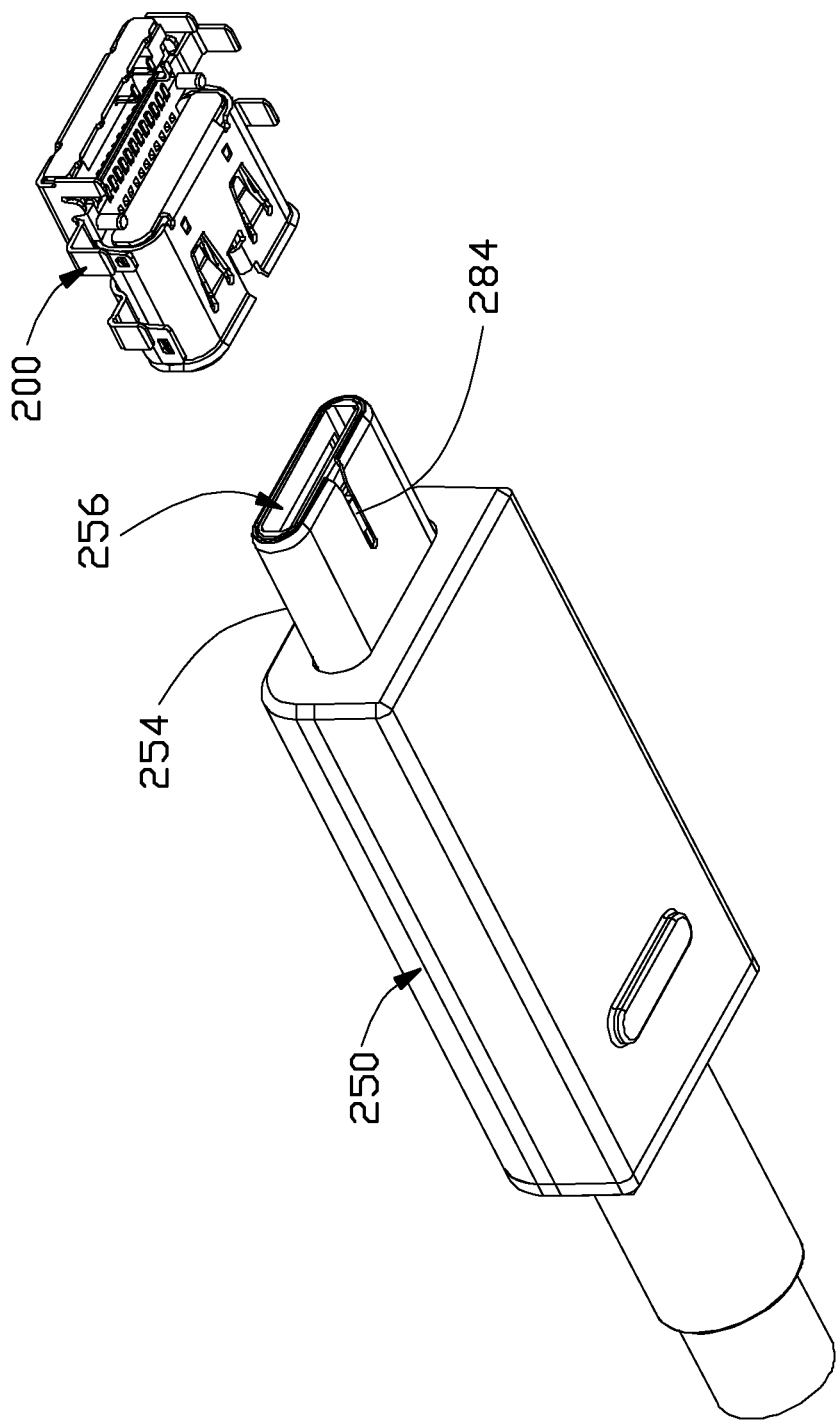
FIG. 22(C) is a rear disassembled perspective view of the receptacle connector and the plug connector of FIG. 22(A).
Figure 24:
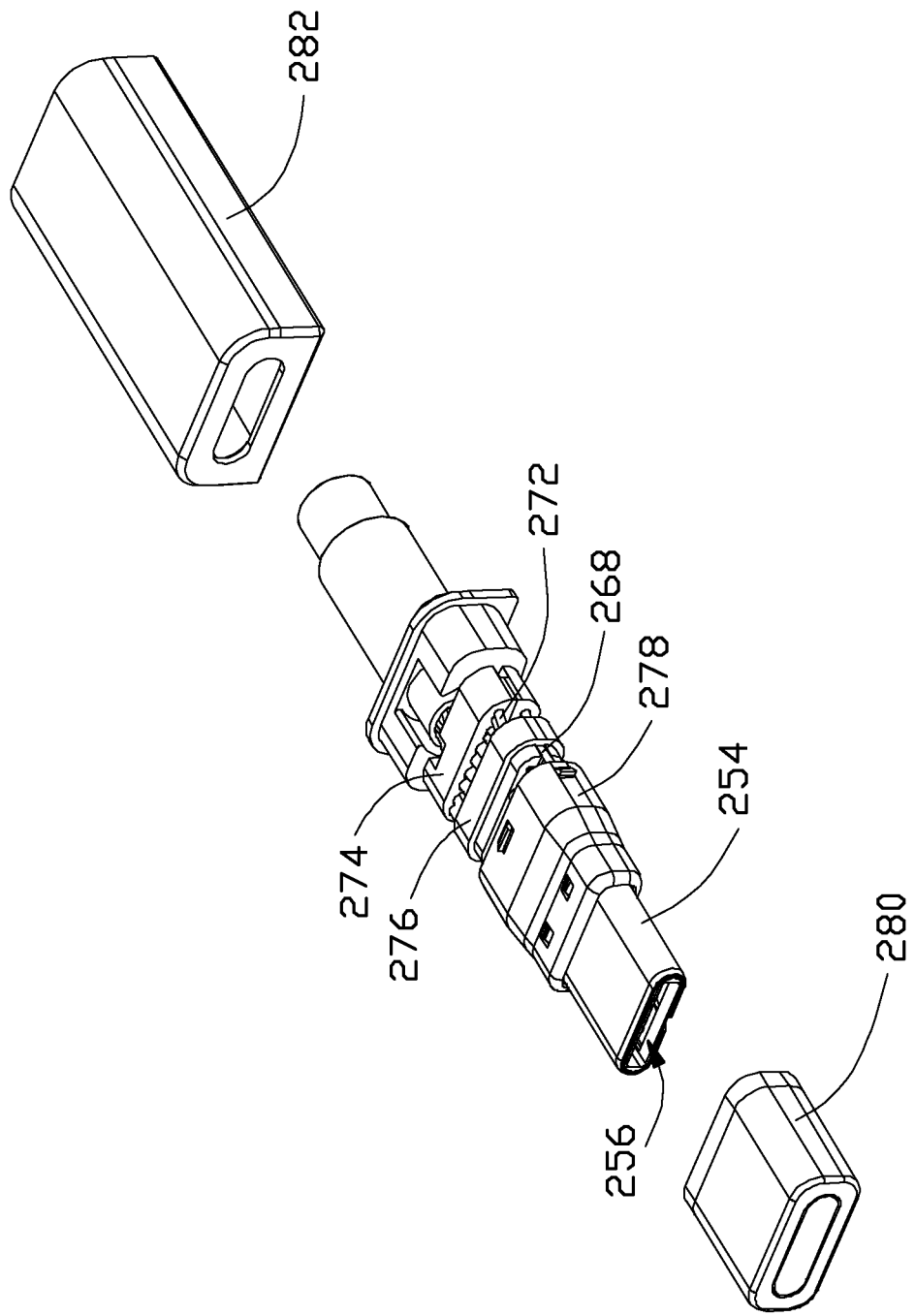
FIG. 24 is a further front exploded perspective view of the plug connector of FIG. 23.
Figure 25:
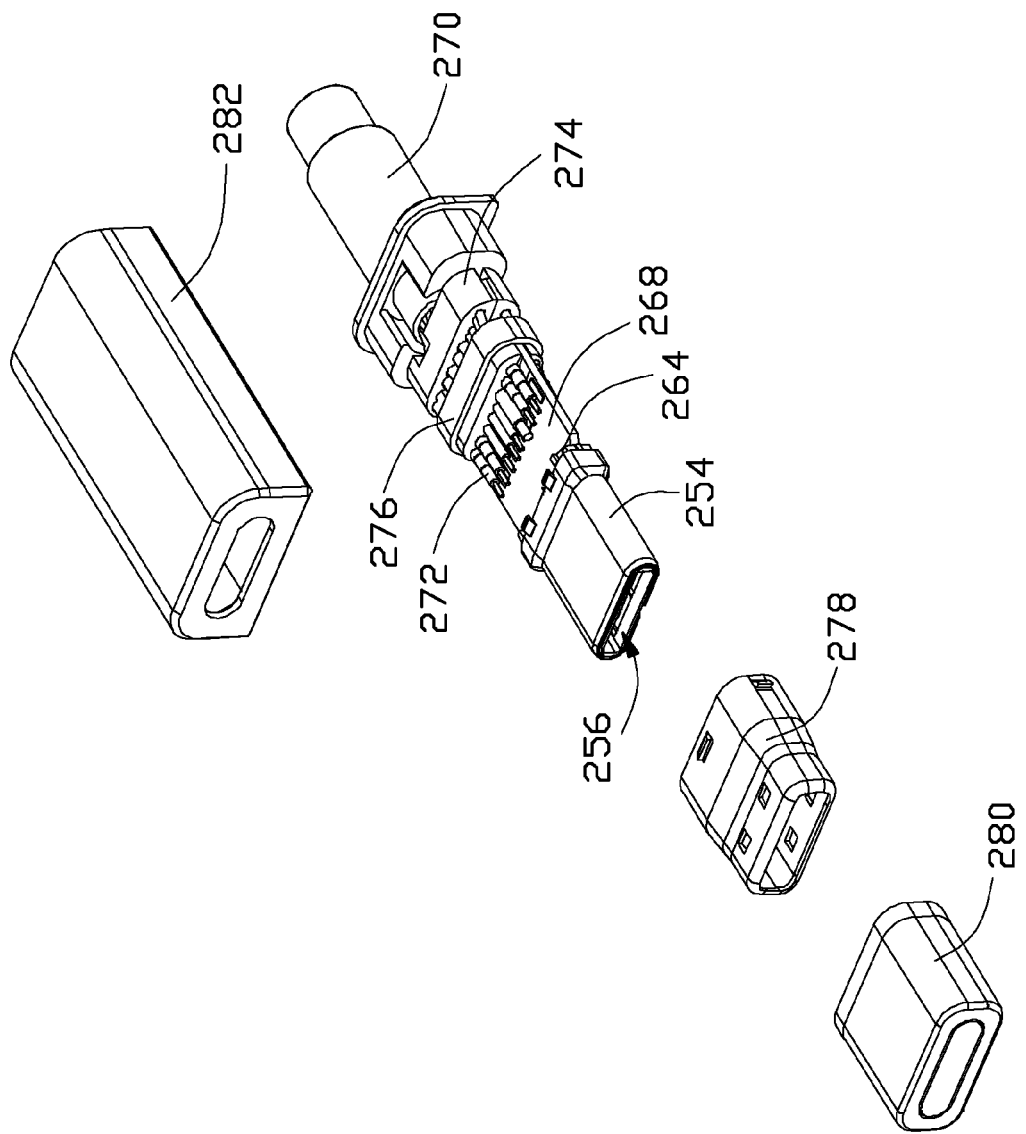
FIG. 25 is a further front exploded perspective view of the plug connector of FIG. 24.
Figure 26A:
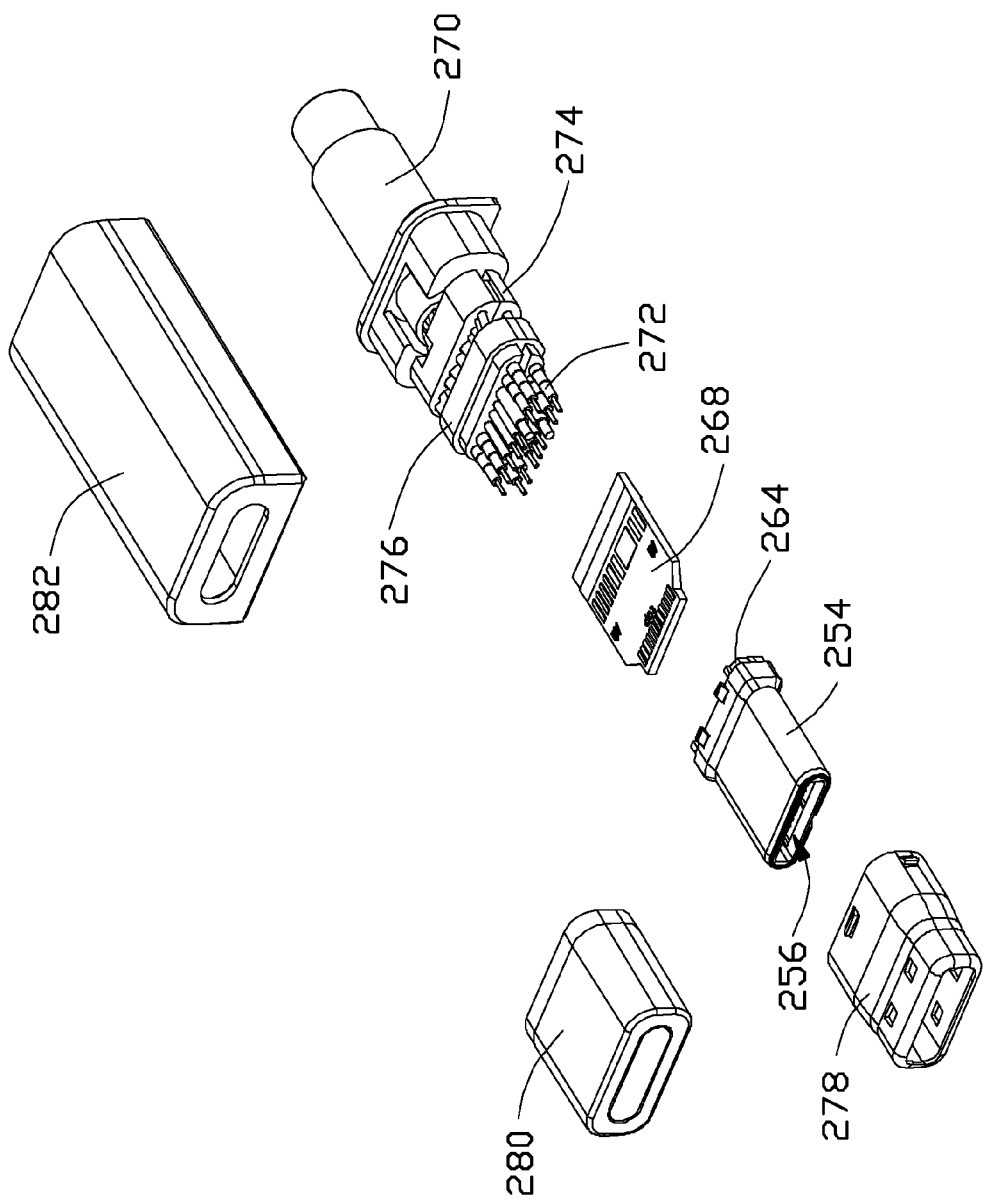
FIG. 26(A) is a further front exploded perspective view of the plug connector of FIG. 25.
Figure 26B:
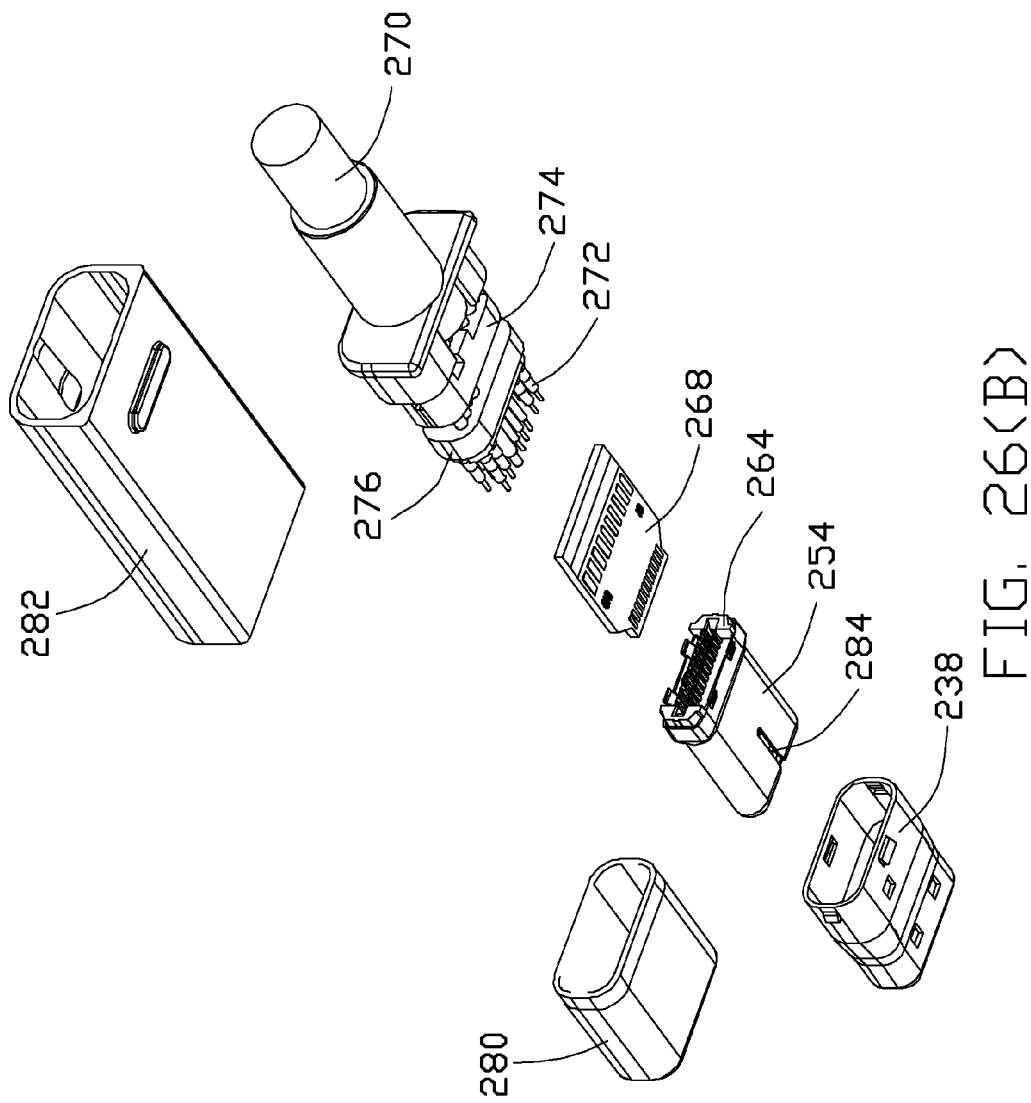
FIG. 26(B) is a further rear exploded perspective view of the plug connector of FIG. 25.
Figure 27A:
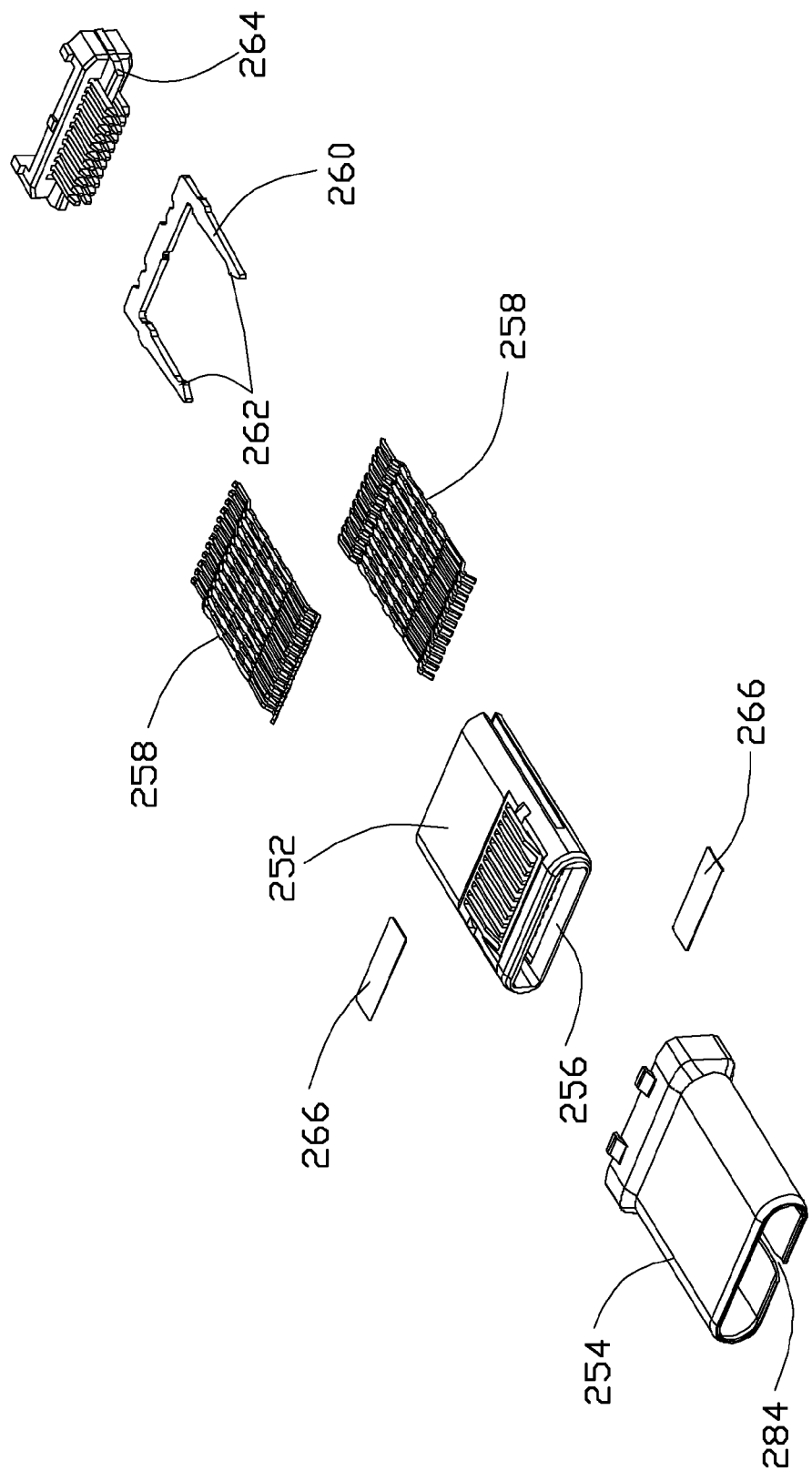
FIG. 27(A) is a further front exploded perspective view of a front portion of the plug connector of FIG. 17(B).
Figure 27B:
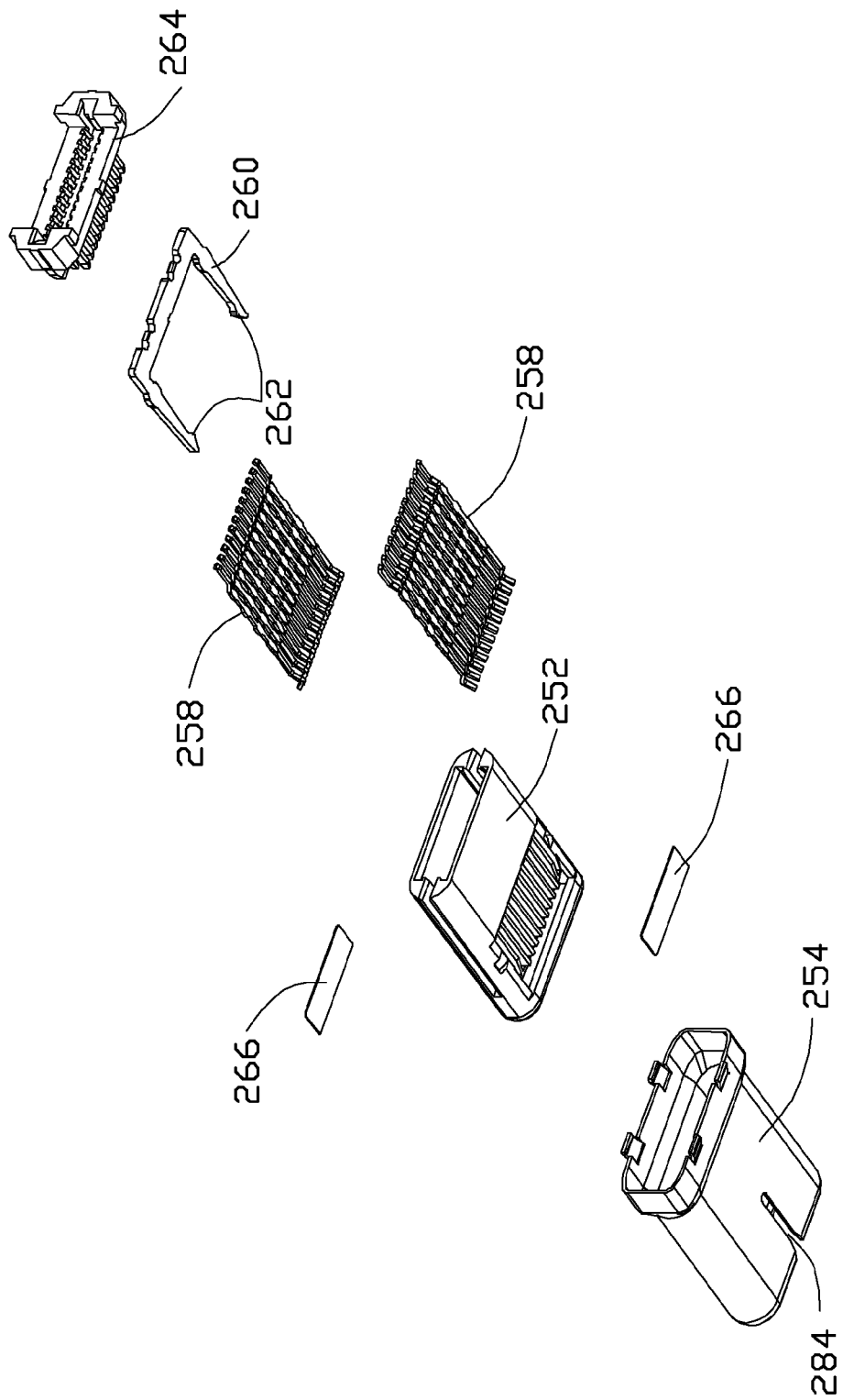
FIG. 27(B) is a further rear exploded perspective view of the front portion of the plug connector of FIG. 27(A).
Figure 28:
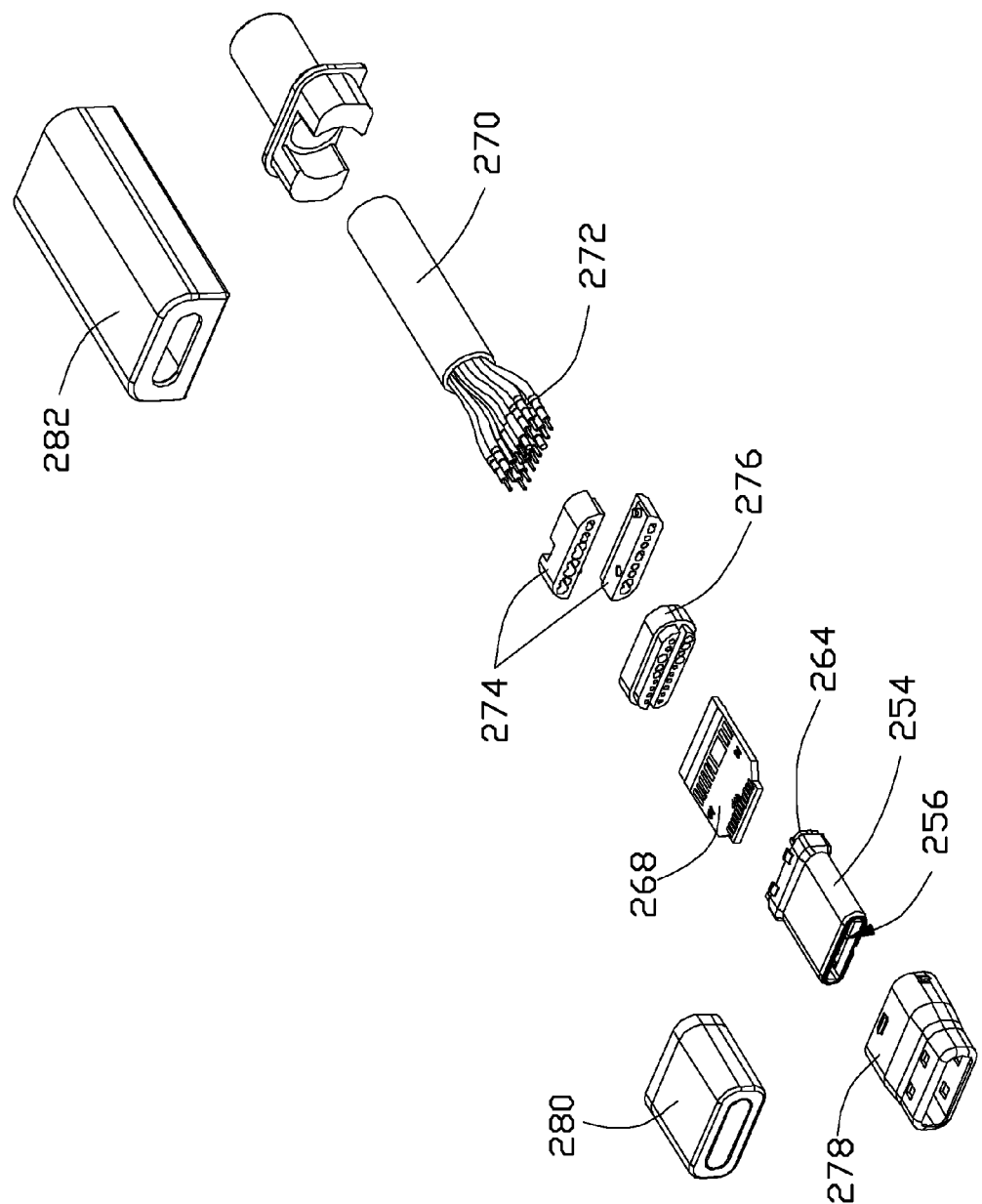
FIG. 28 is a detailed front exploded perspective view of the plug connector of FIG. 21(A).
Figure 29:
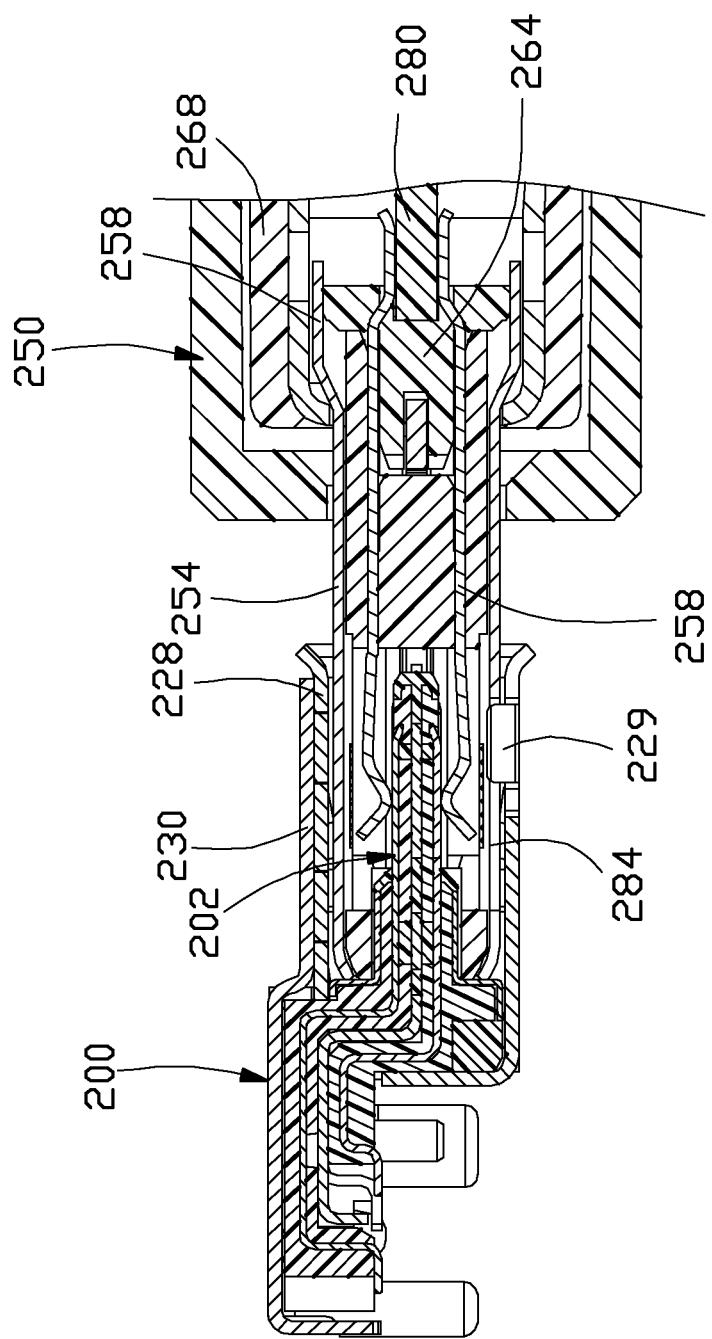
FIG. 29 is a cross-sectional view of the assembled receptacle connector and plug connector of FIG. 21(A).
Figure 30A:
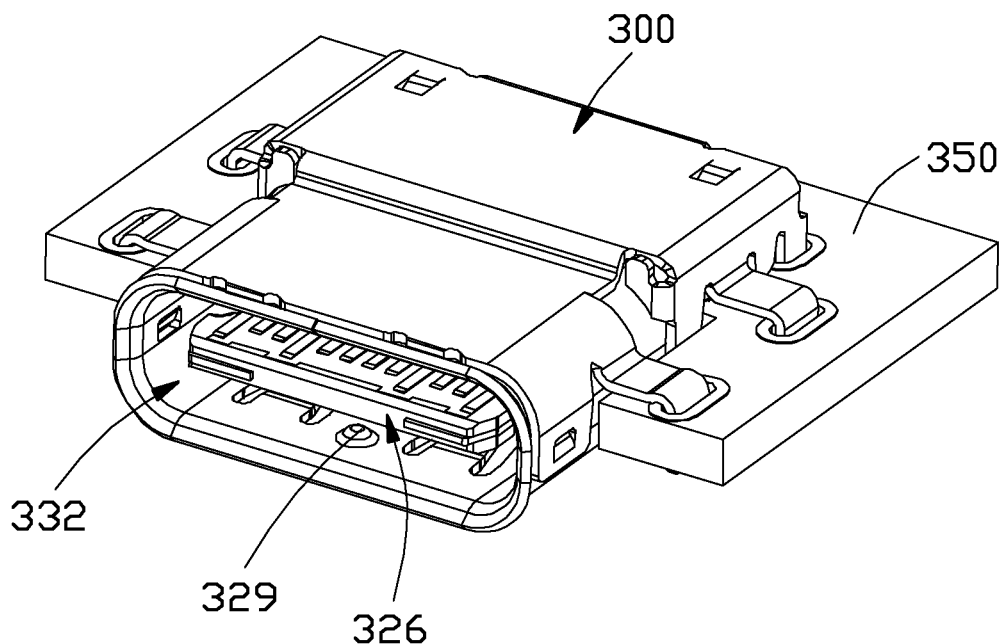
FIG. 30(A) is a front assembled perspective view of a third embodiment of the receptacle connector mounted upon a printed circuit board according to the invention.
Figure 30B:
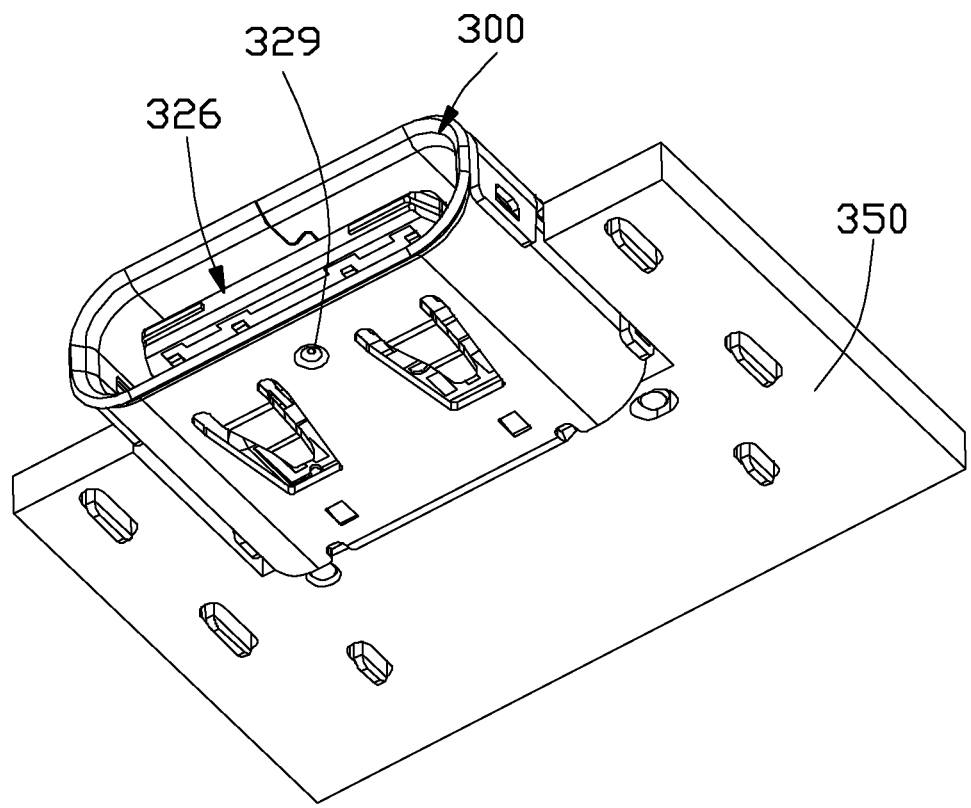
FIG. 30(B) is a rear assembled perspective view of the receptacle connector mounted upon the printed circuit board of FIG. 30(A).
Figure 31A:
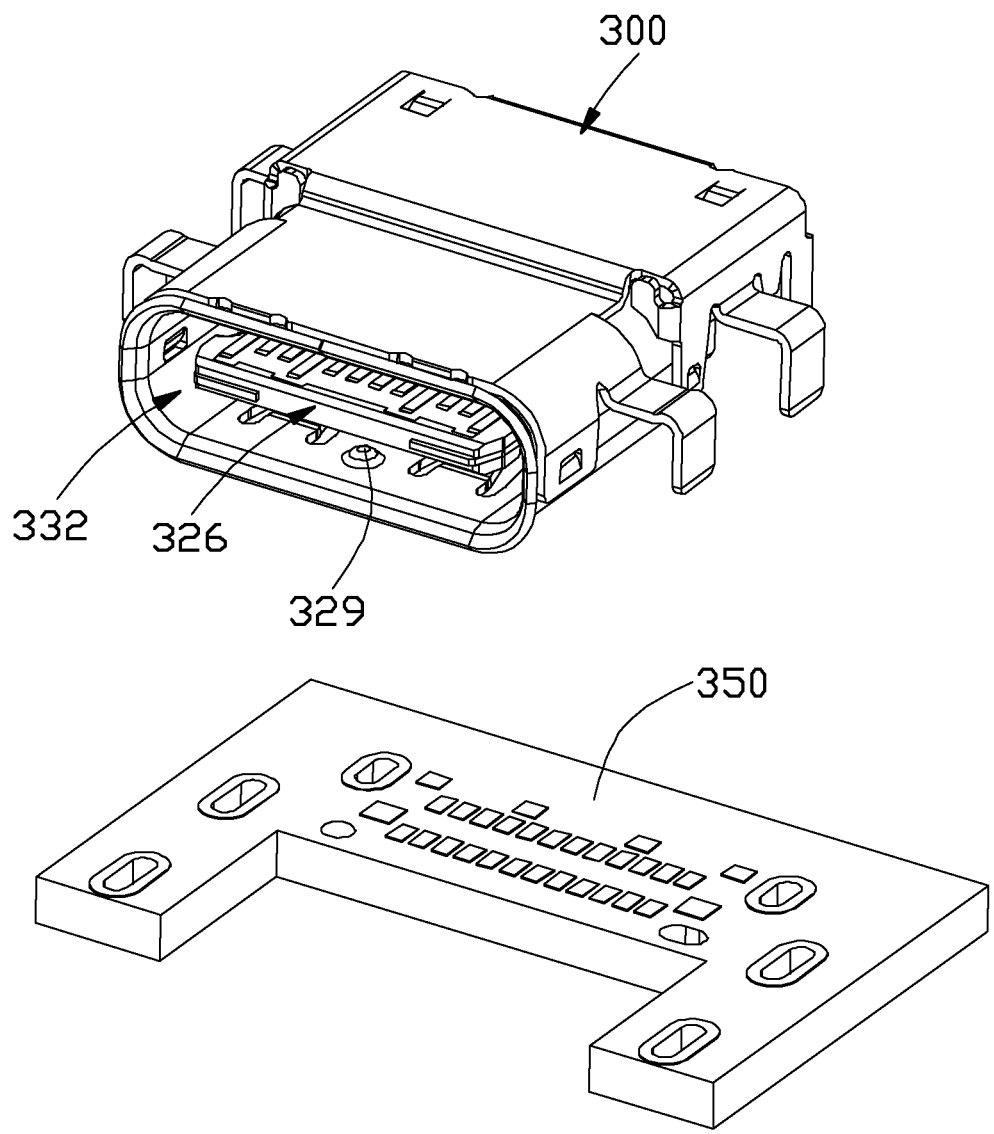
FIG. 31(A) is a front disassembled perspective view of the receptacle connector away from the printed circuit board of FIG. 30(A).
Figure 31B:
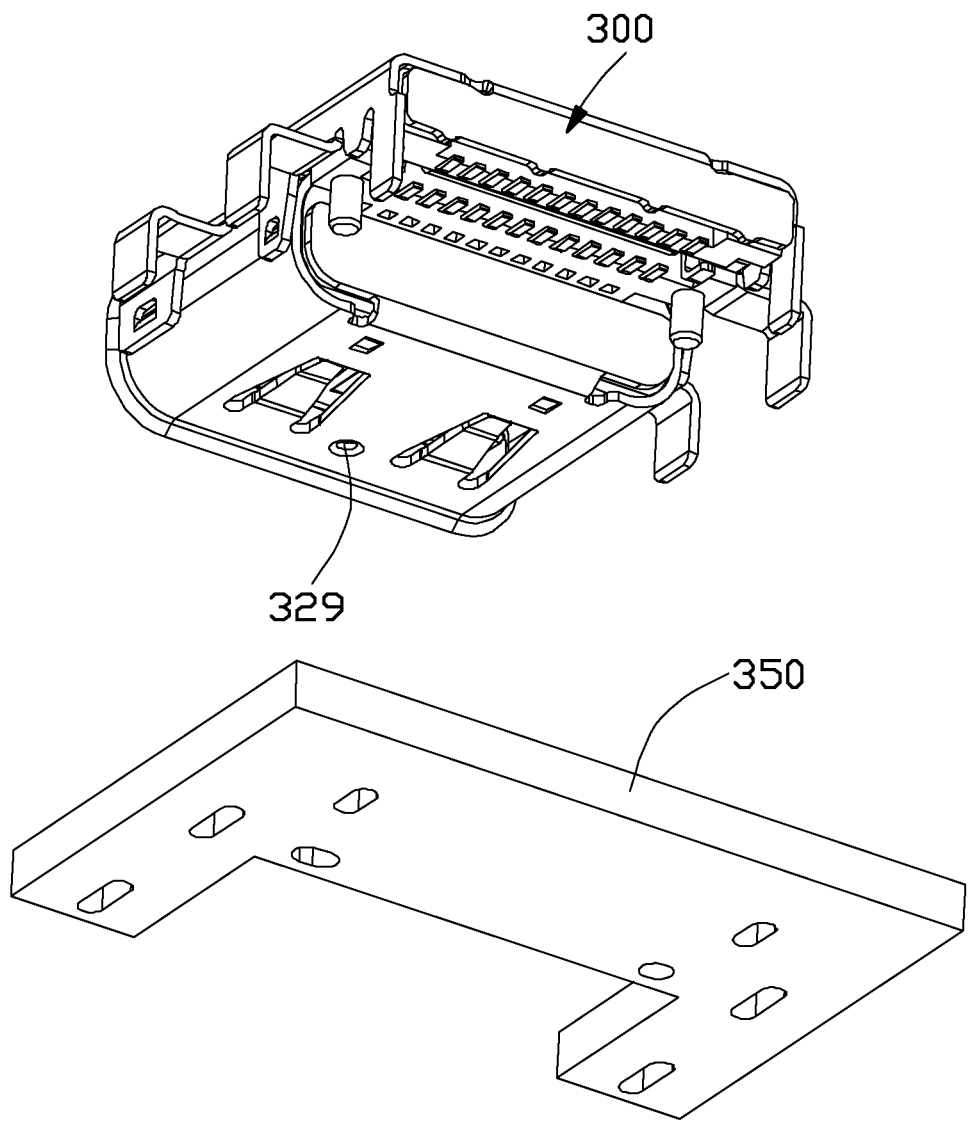
FIG. 31(B) is a rear disassembled perspective view of the receptacle connector away from the printed circuit board of FIG. 39(B).
Figure 32A:
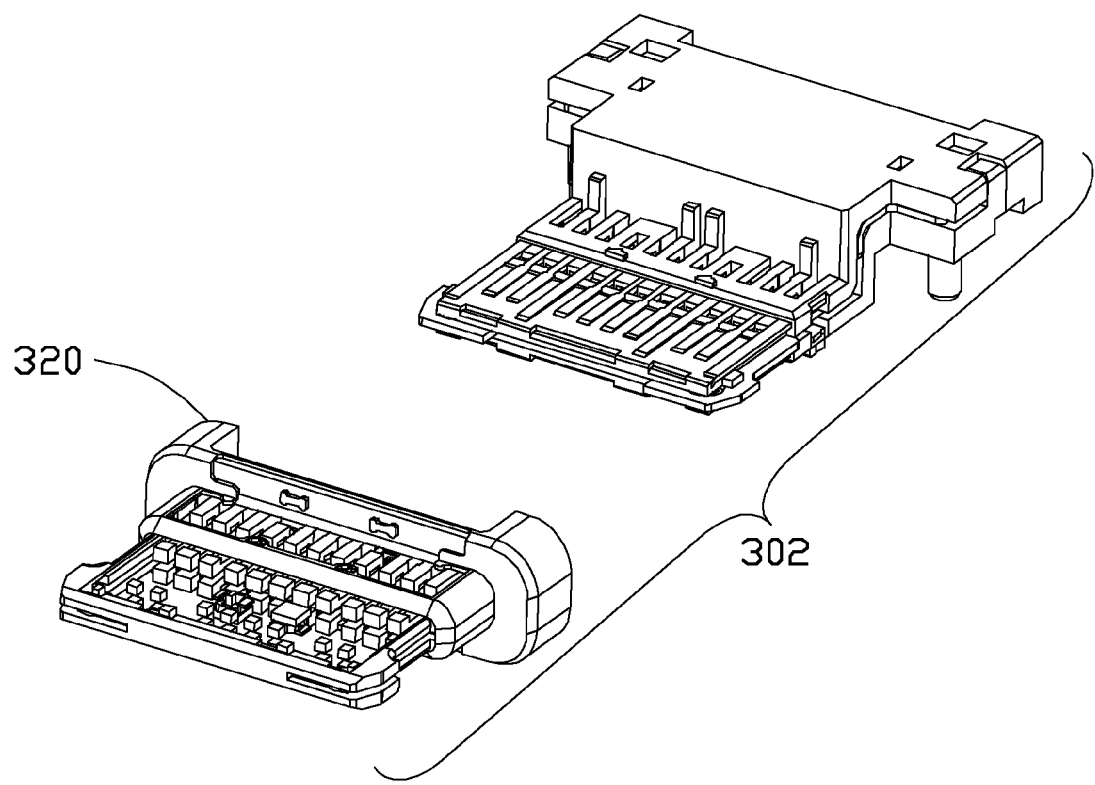
FIG. 32(A) is a front exploded perspective view of the terminal module of the receptacle connector of FIG. 30(A).
Figure 32B:
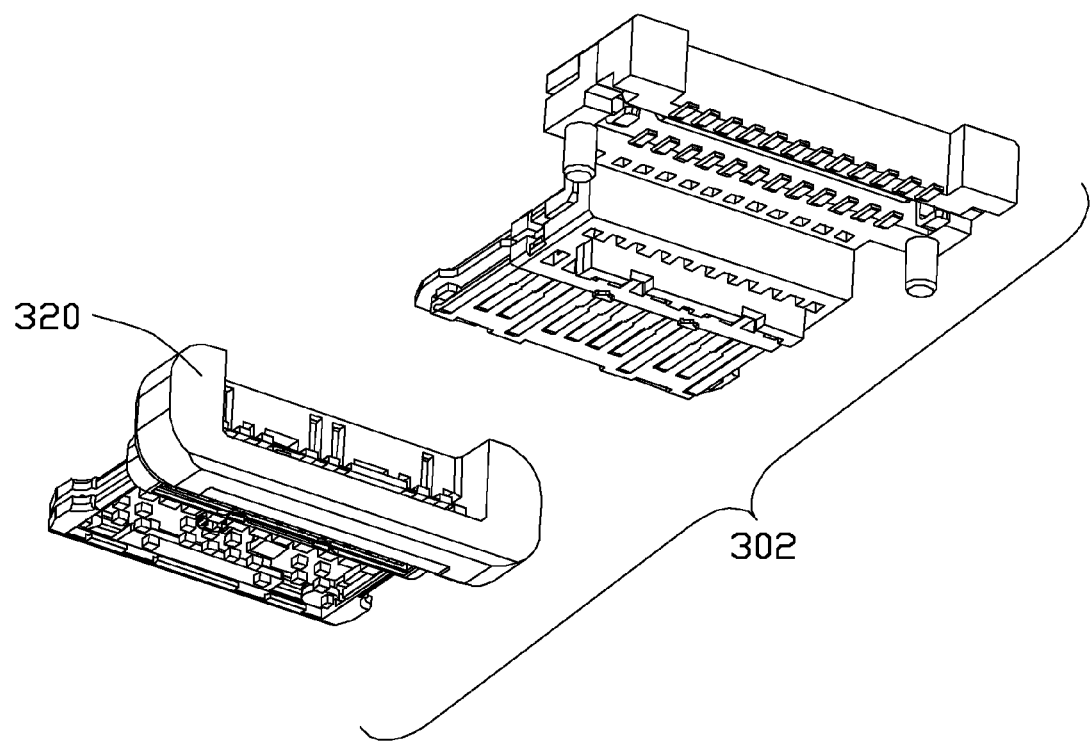
FIG. 32(B) is a rear exploded perspective view of the terminal module of the receptacle connector of FIG. 32(A).
Figure 33B:
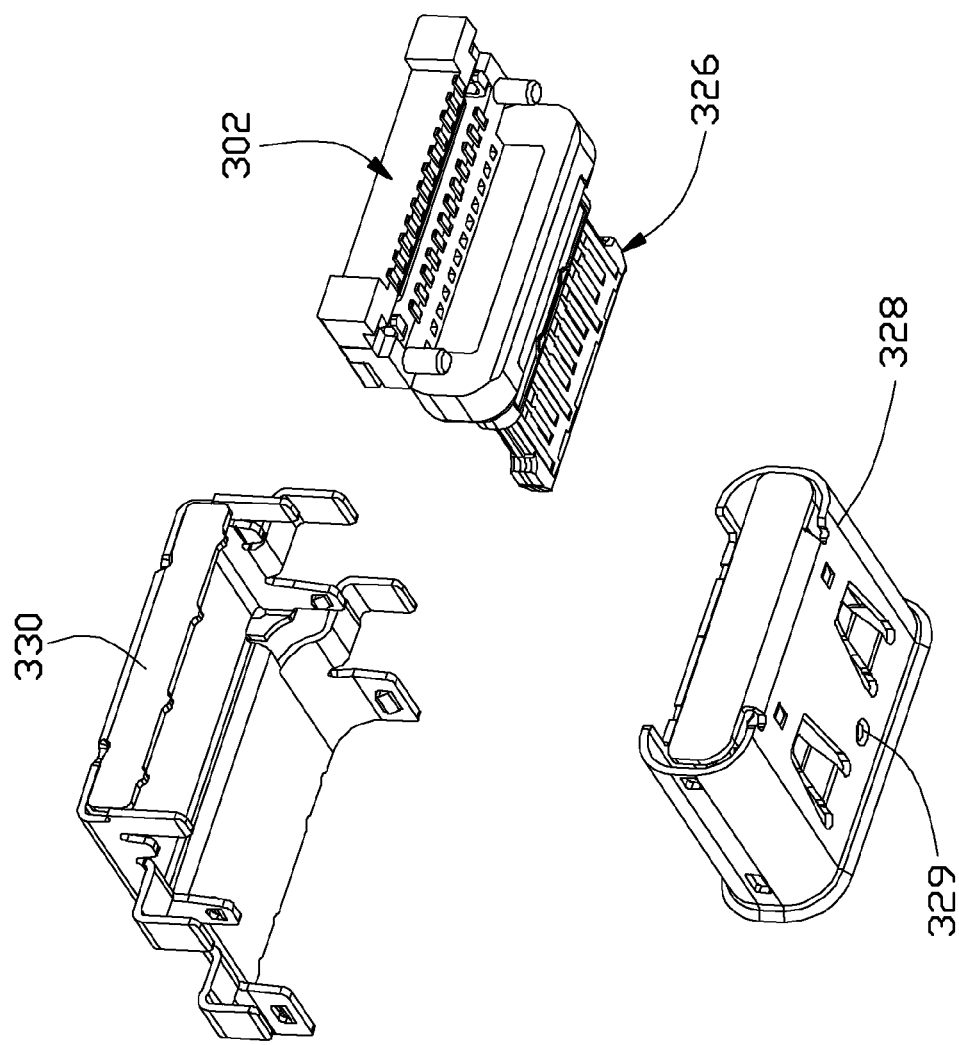
FIG. 33(B) is a rear exploded perspective view of the receptacle connector of FIG. 33(A).
Figure 34A:
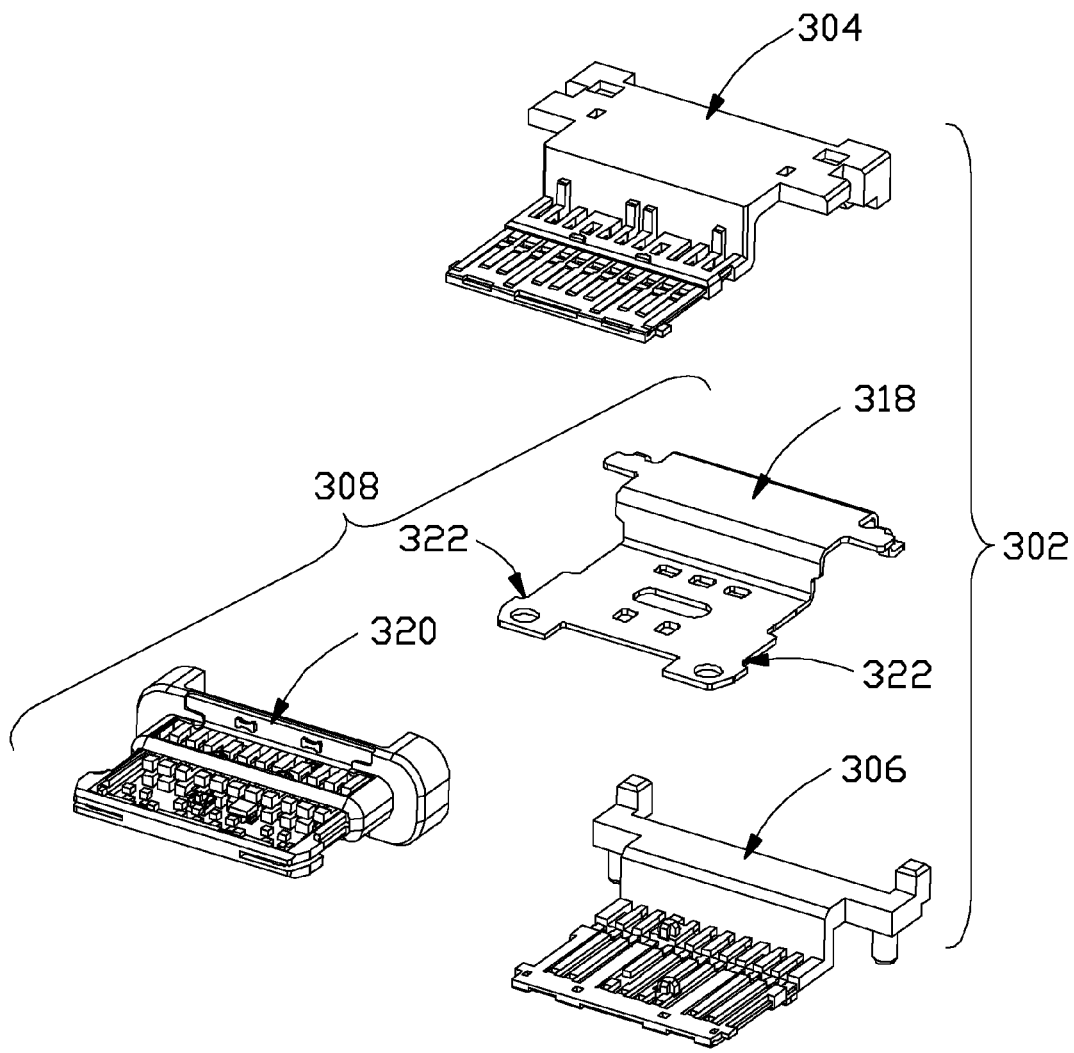
FIG. 34(A) is a further front exploded perspective view of the receptacle connector of FIG. 33(A).
Figure 34B:
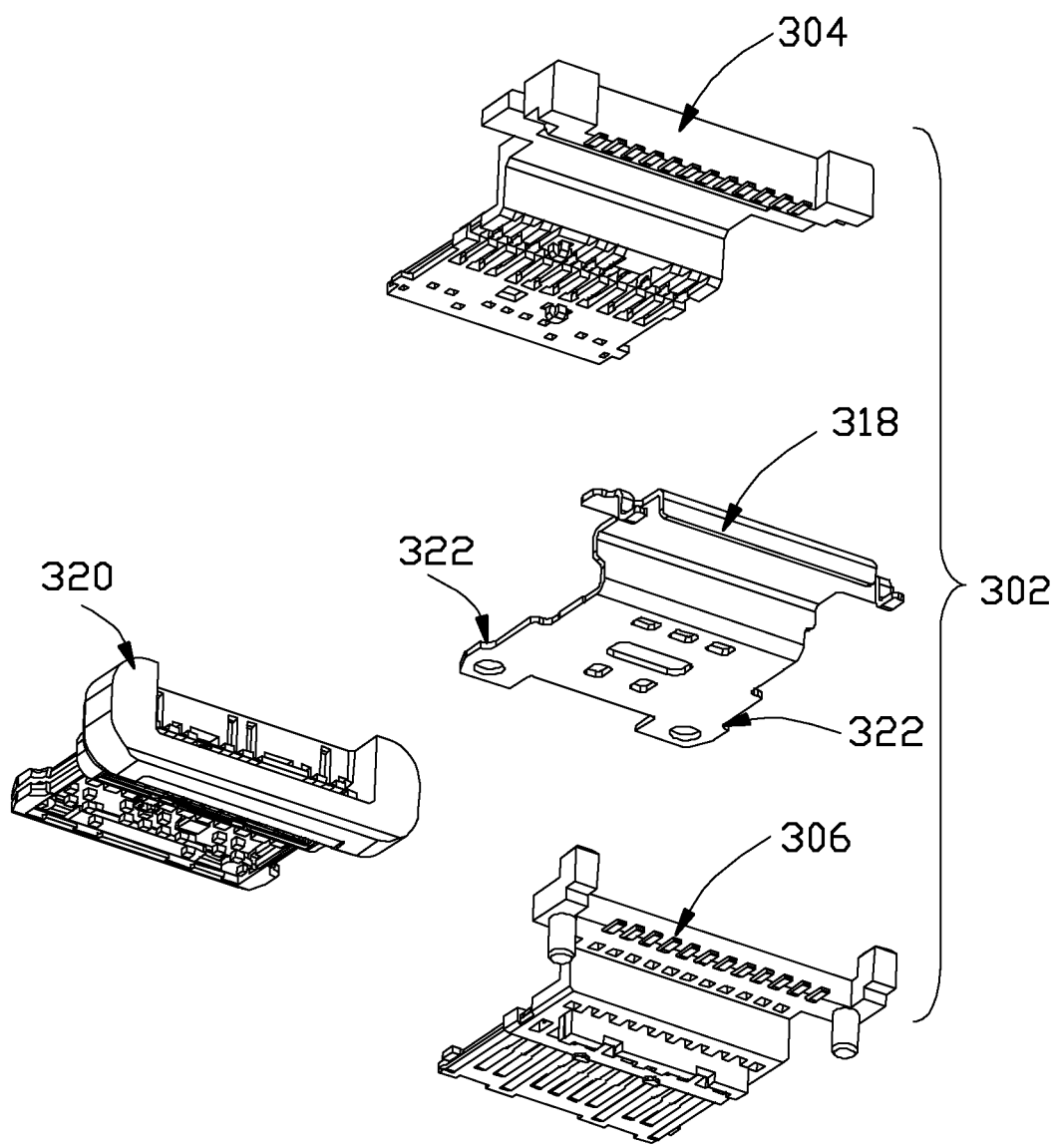
FIG. 34(B) is a further rear exploded perspective view of the receptacle connector of FIG. 33(B).
Figure 35A:
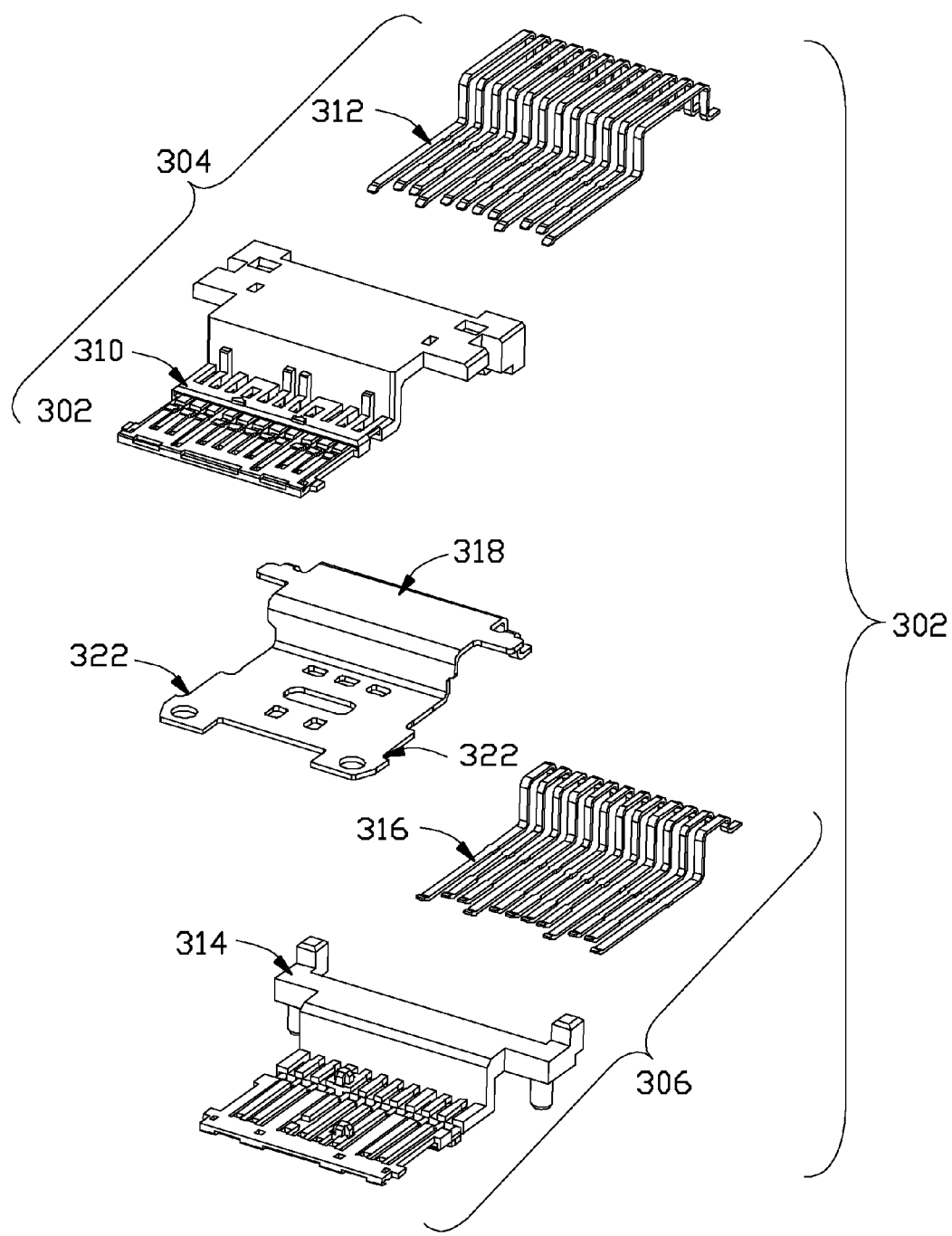
FIG. 35(A) is a further front exploded perspective view of the receptacle connector of FIG. 34(A).
Figure 35B:
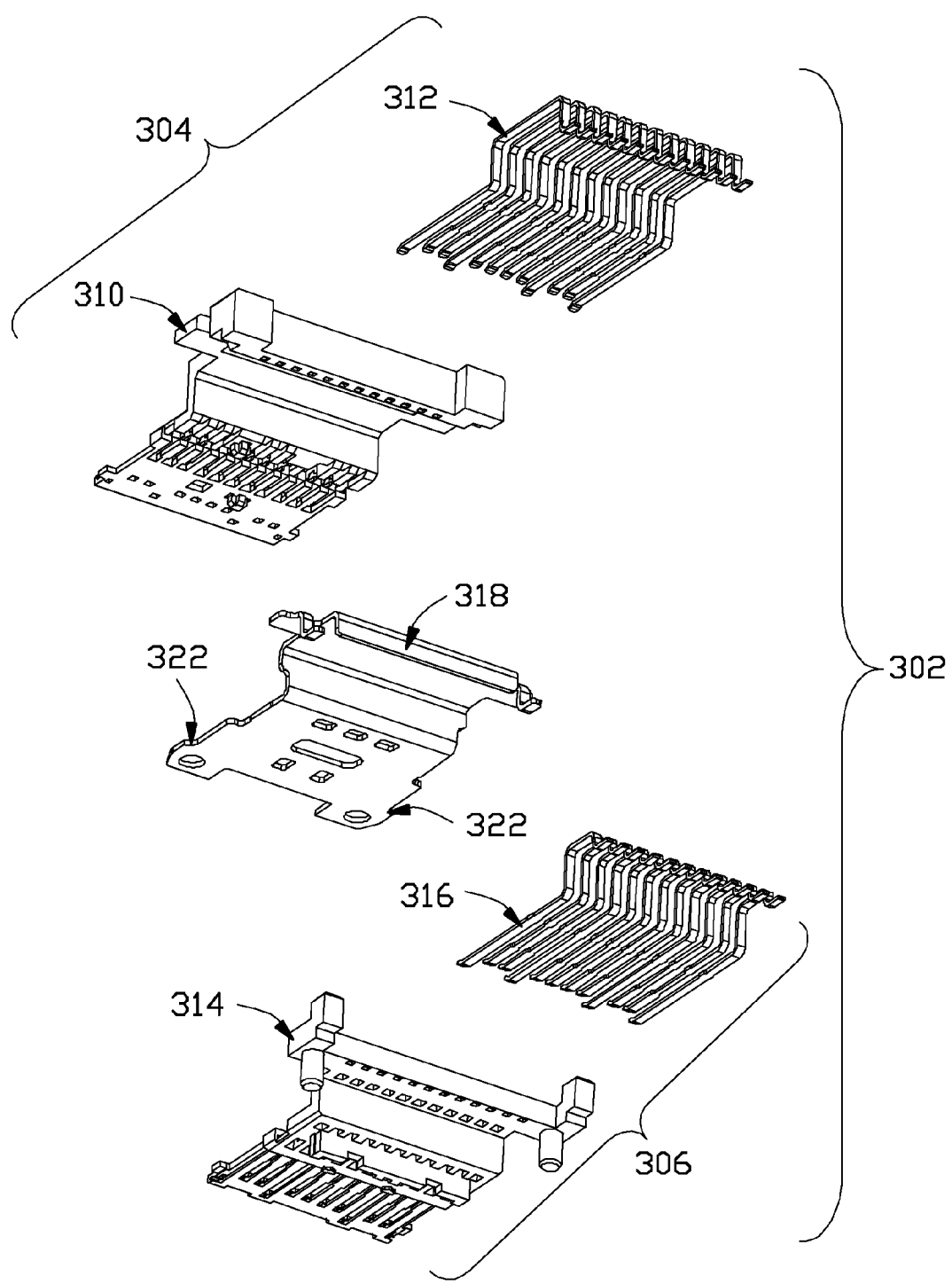
FIG. 35(B) is a further rear exploded perspective view of the receptacle connector of FIG. 34(B).
Figure 36:
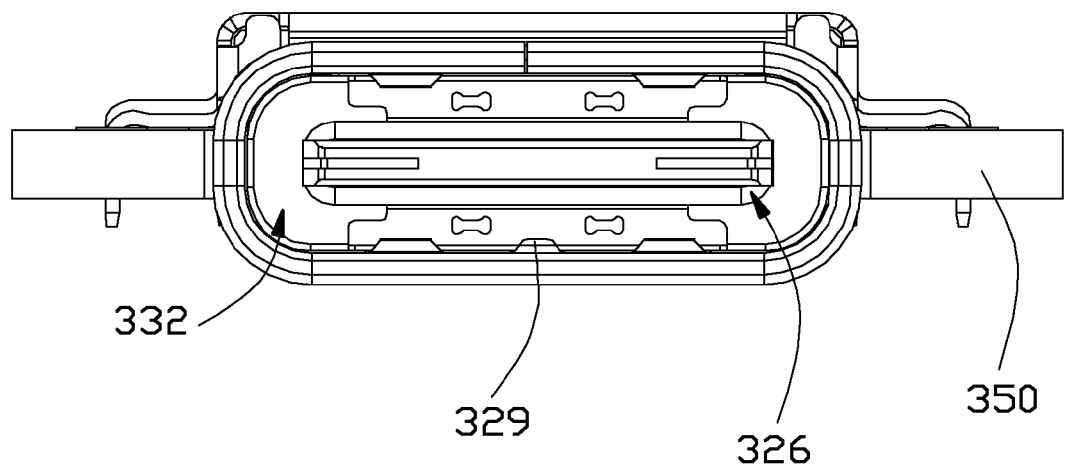
FIG. 36 is a front view of the receptacle connector mounted upon the printed circuit board of FIG. 30(A).
Figure 37:
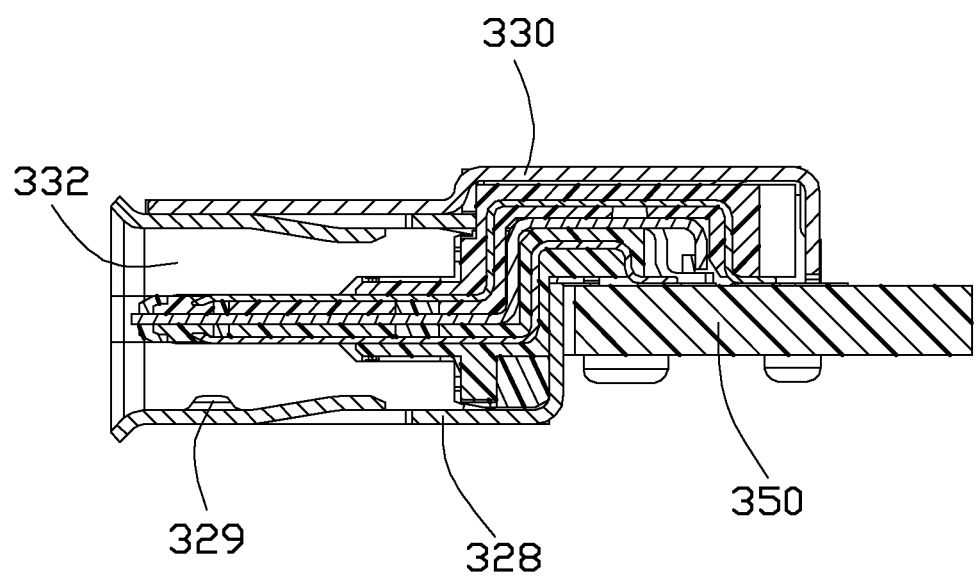
FIG. 37 is a cross-sectional view of the receptacle connector mounted upon the printed circuit board of 30(A).
Figure 38:
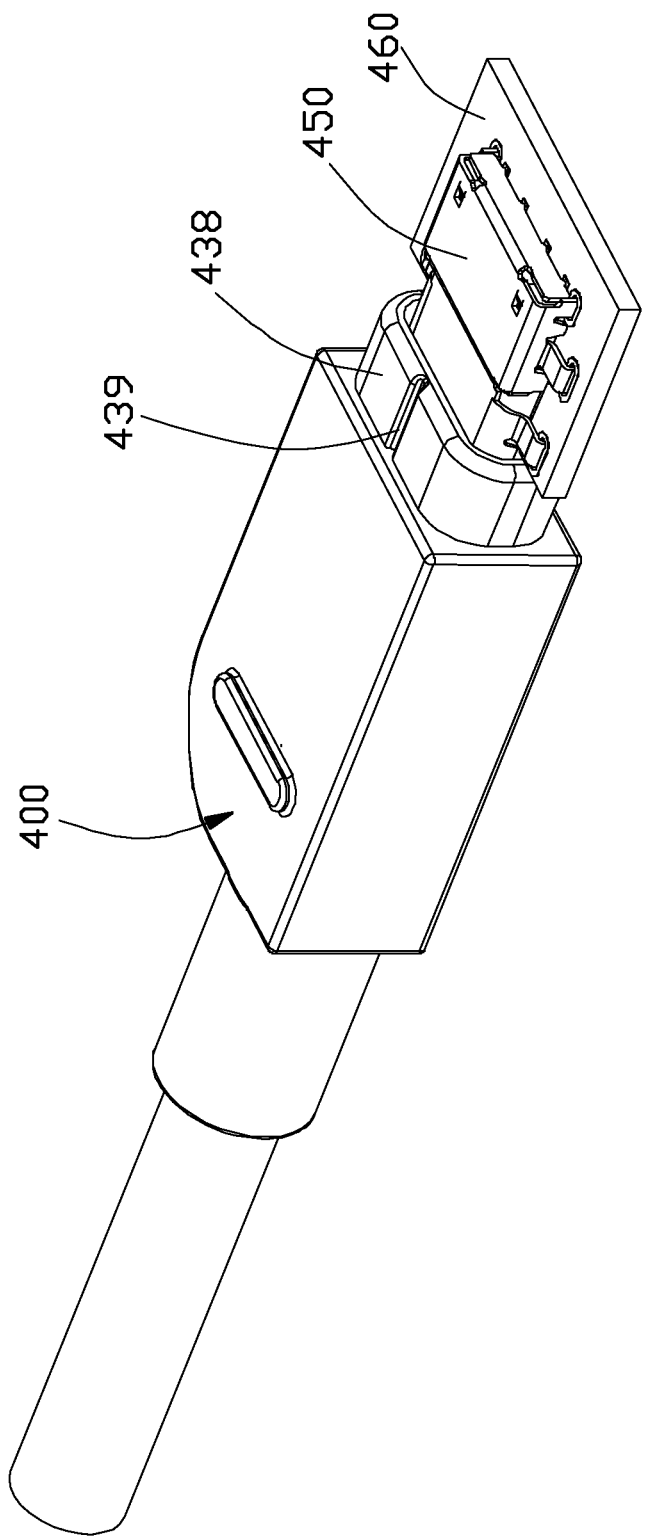
FIG. 38 is an assembled perspective view of the plug connector and the receptacle connector mounted upon the printed circuit board according to a fourth embodiment of the invention.
Figure 39:
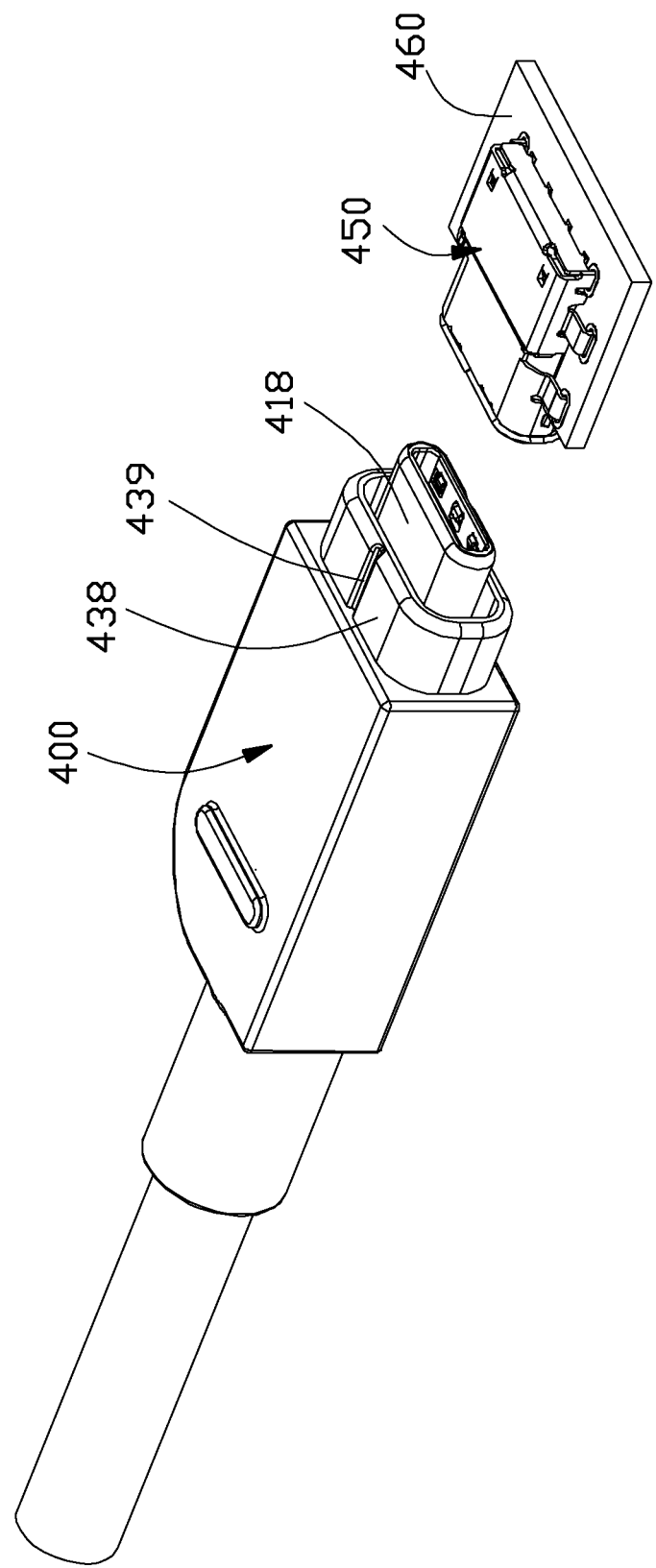
FIG. 39 is a disassembled perspective view of the plug connector and the receptacle connector mounted upon the printed circuit board of FIG. 38.
Figure 40:
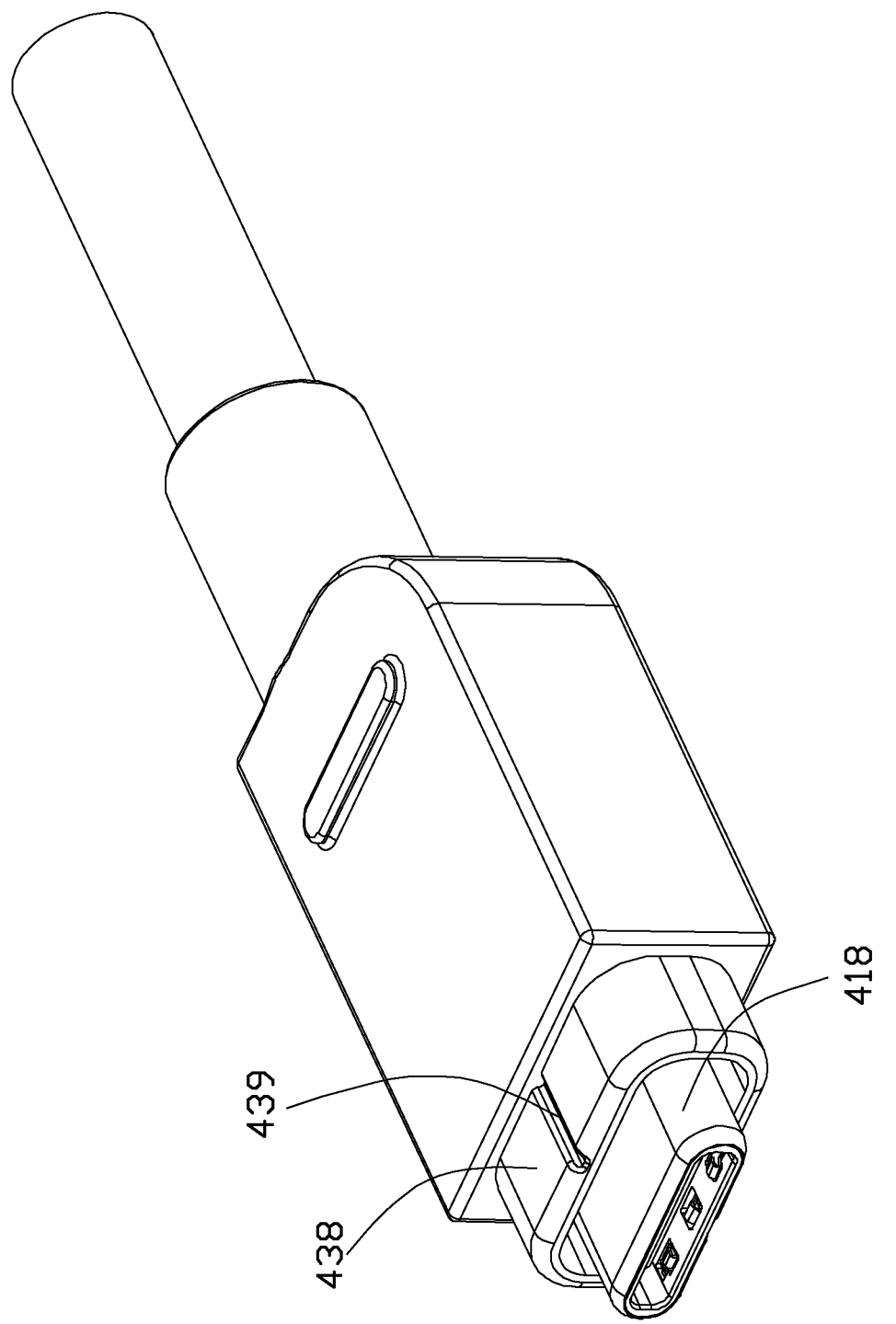
FIG. 40 is a front perspective view of the plug connector of FIG. 38
Figure 41:
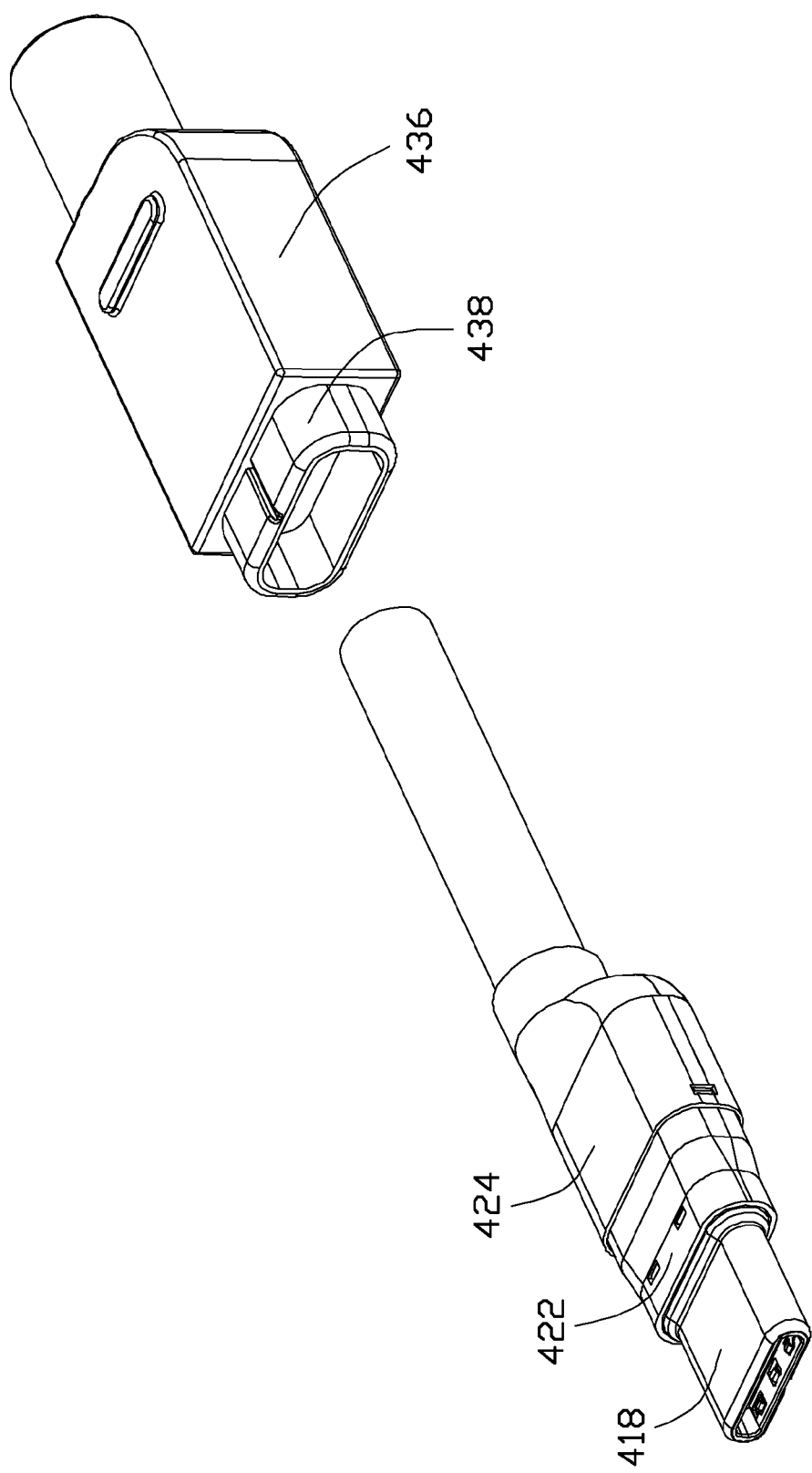
FIG. 41 is a front exploded perspective view of the plug connector of FIG. 40.
Figure 42:
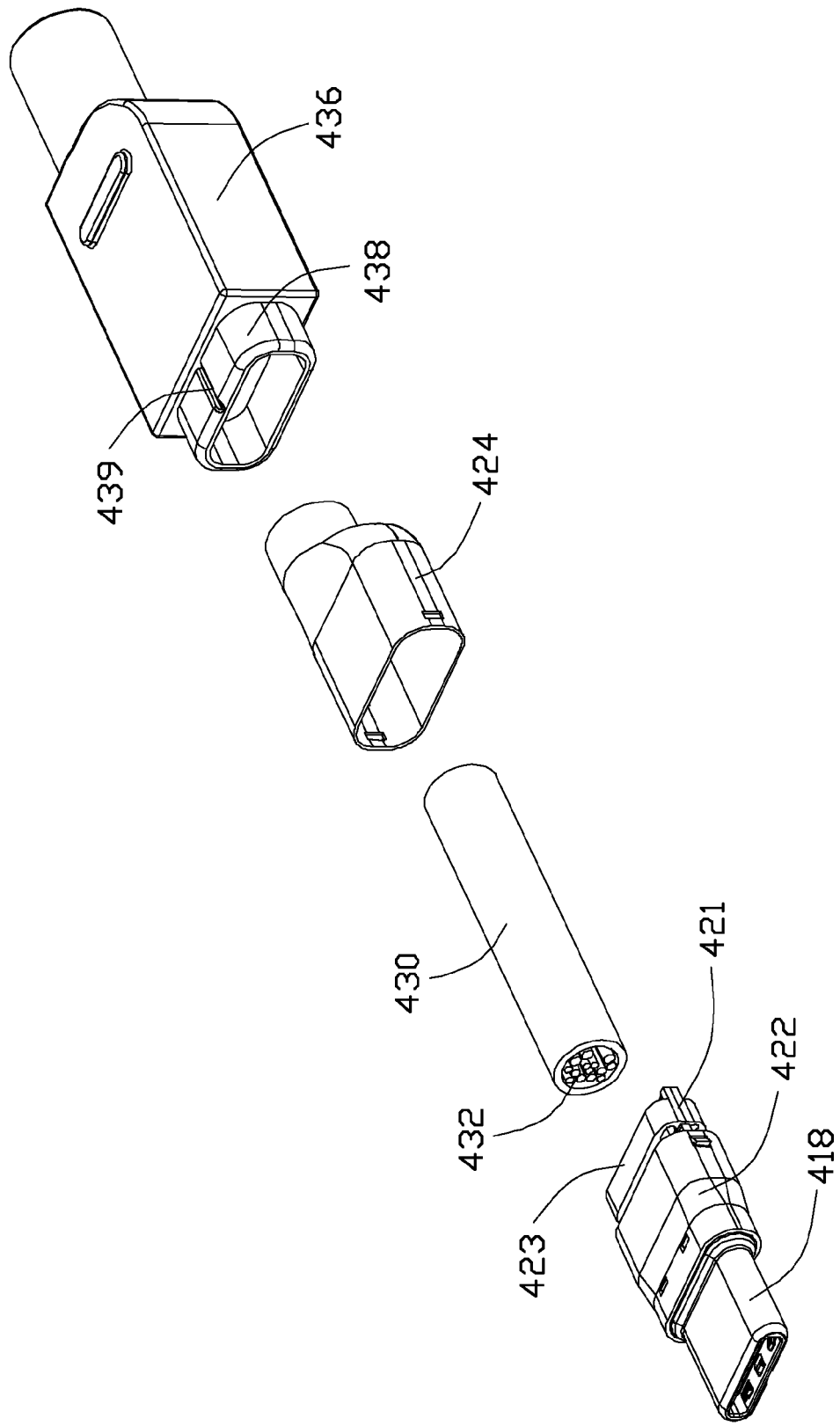
FIG. 42 is a further front exploded perspective view of the plug connector of FIG. 41.
Figure 43:
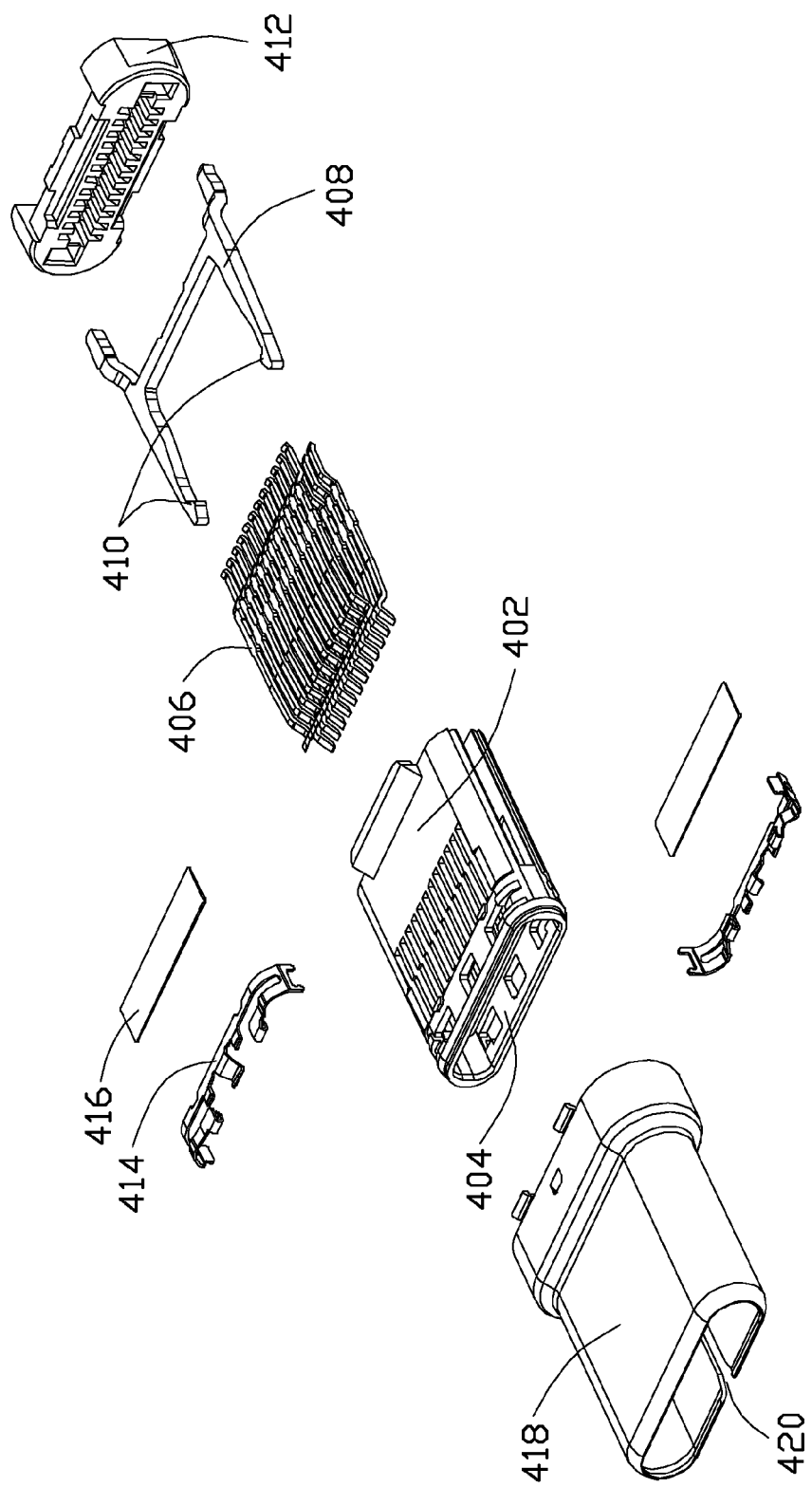
FIG. 43 is a further front exploded perspective view of the front mating portion of the plug connector of FIG. 41.
Figure 45:
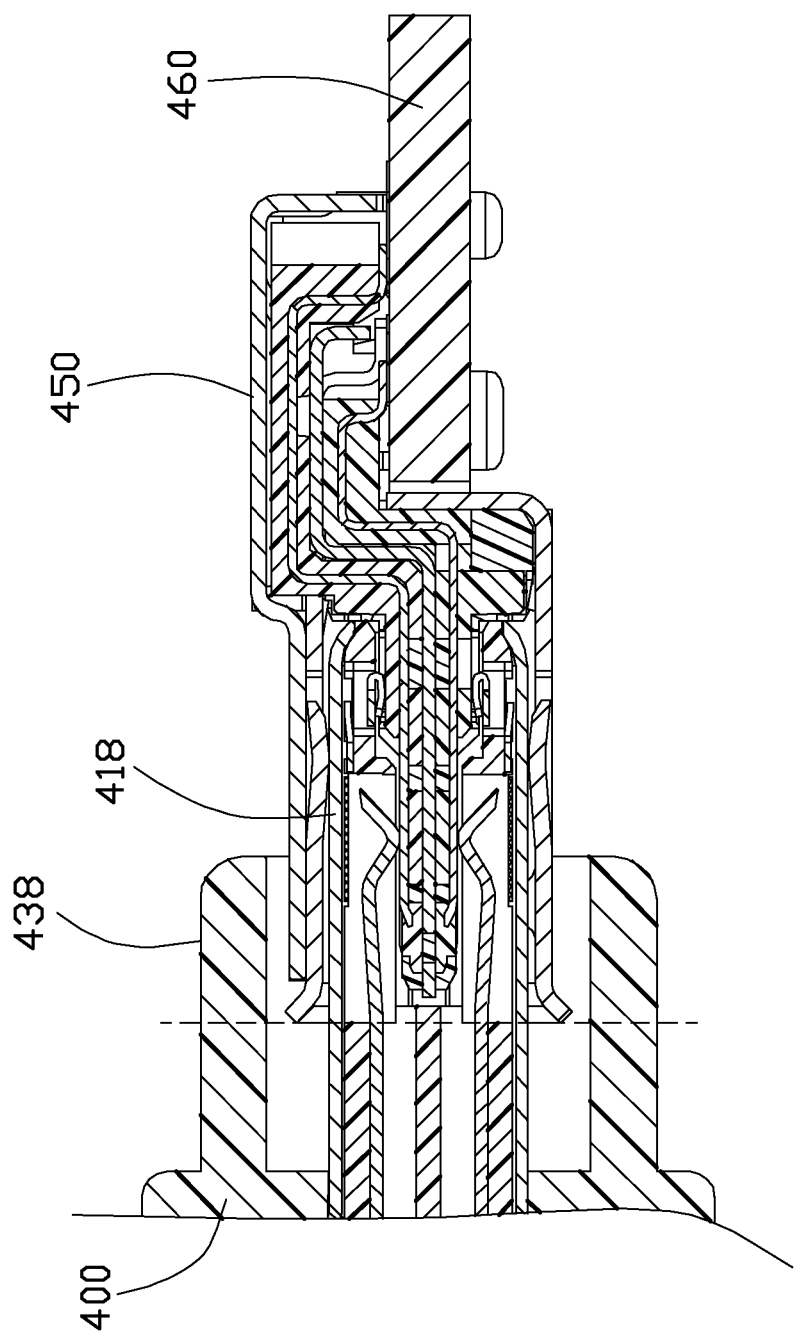
FIG. 45 is a cross-sectional view of the assembled plug connector and receptacle connector of FIG. 37.
Figure 46:
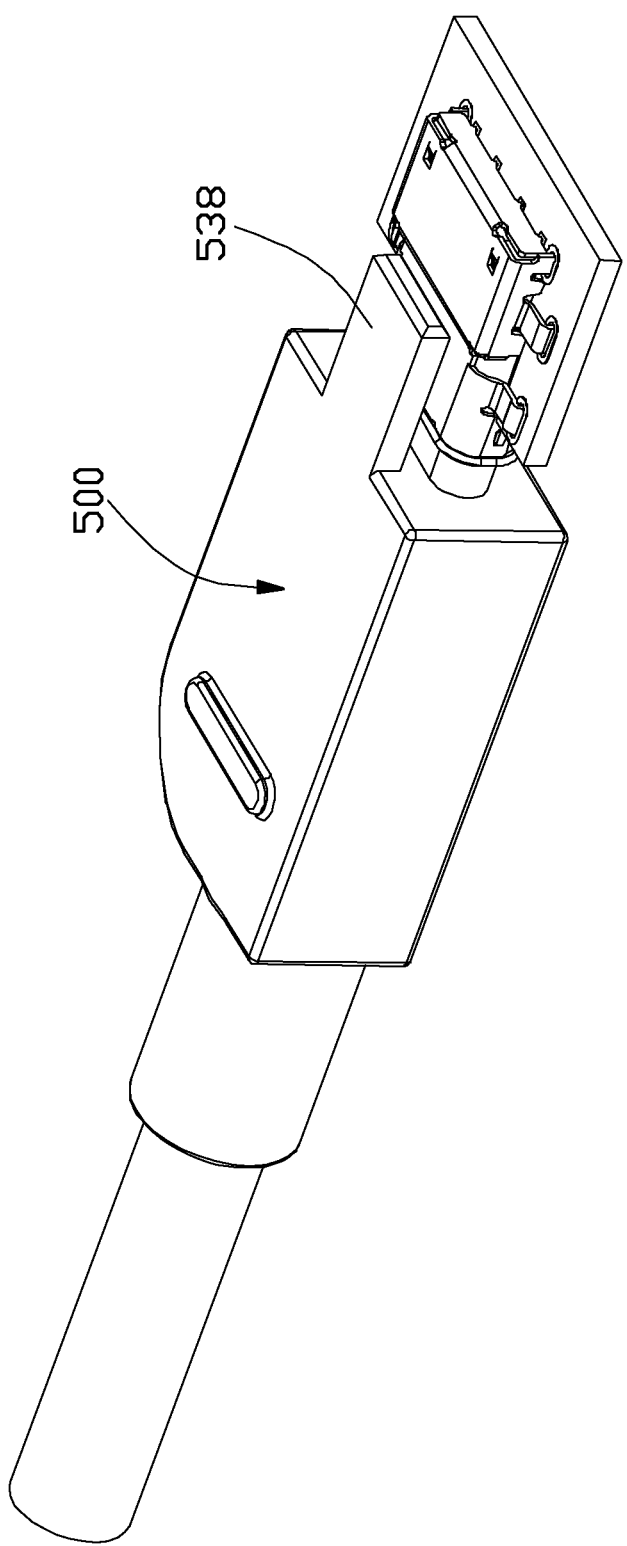
FIG. 46 is an assembled perspective view of the plug connector and the receptacle connector mounted upon the printed circuit board according to a fifth embodiment of the invention.
Figure 47:
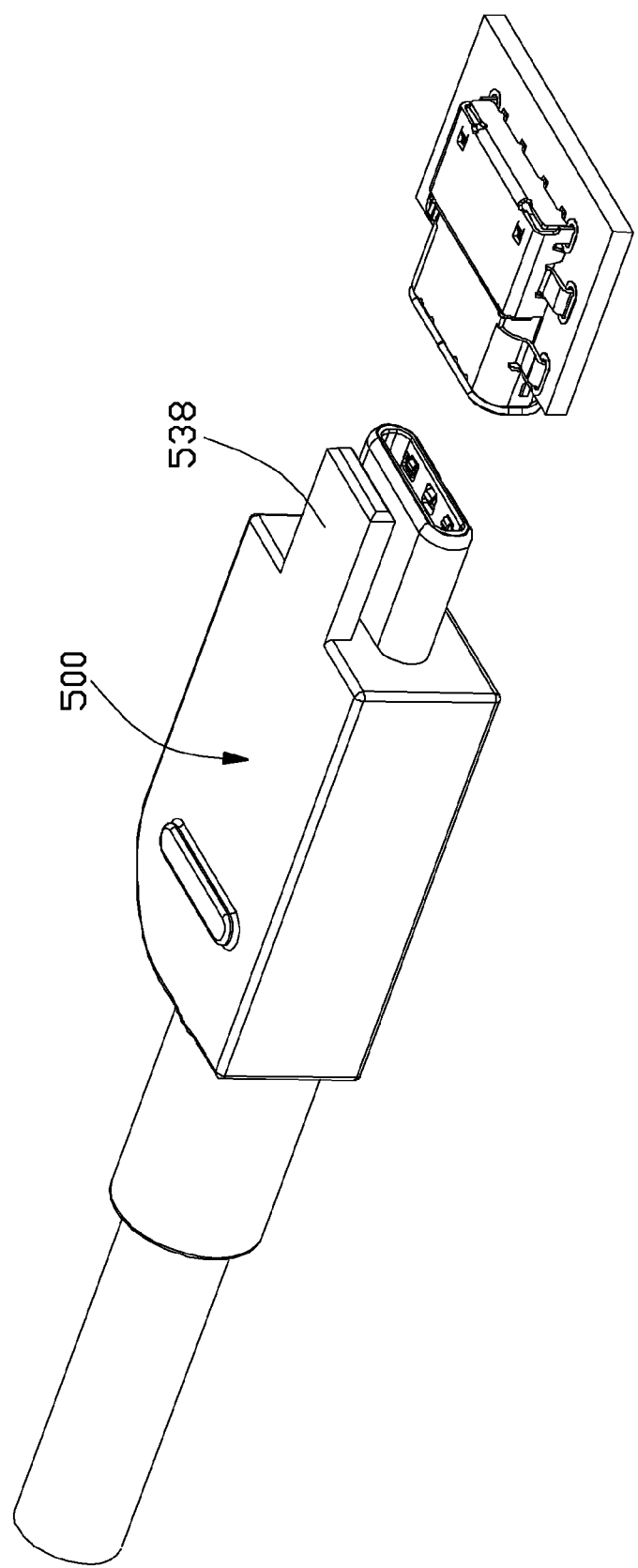
FIG. 47 is a disassembled perspective view of the plug connector and receptacle connector mounted upon the printed circuit board of FIG. 46.
Figure 48:
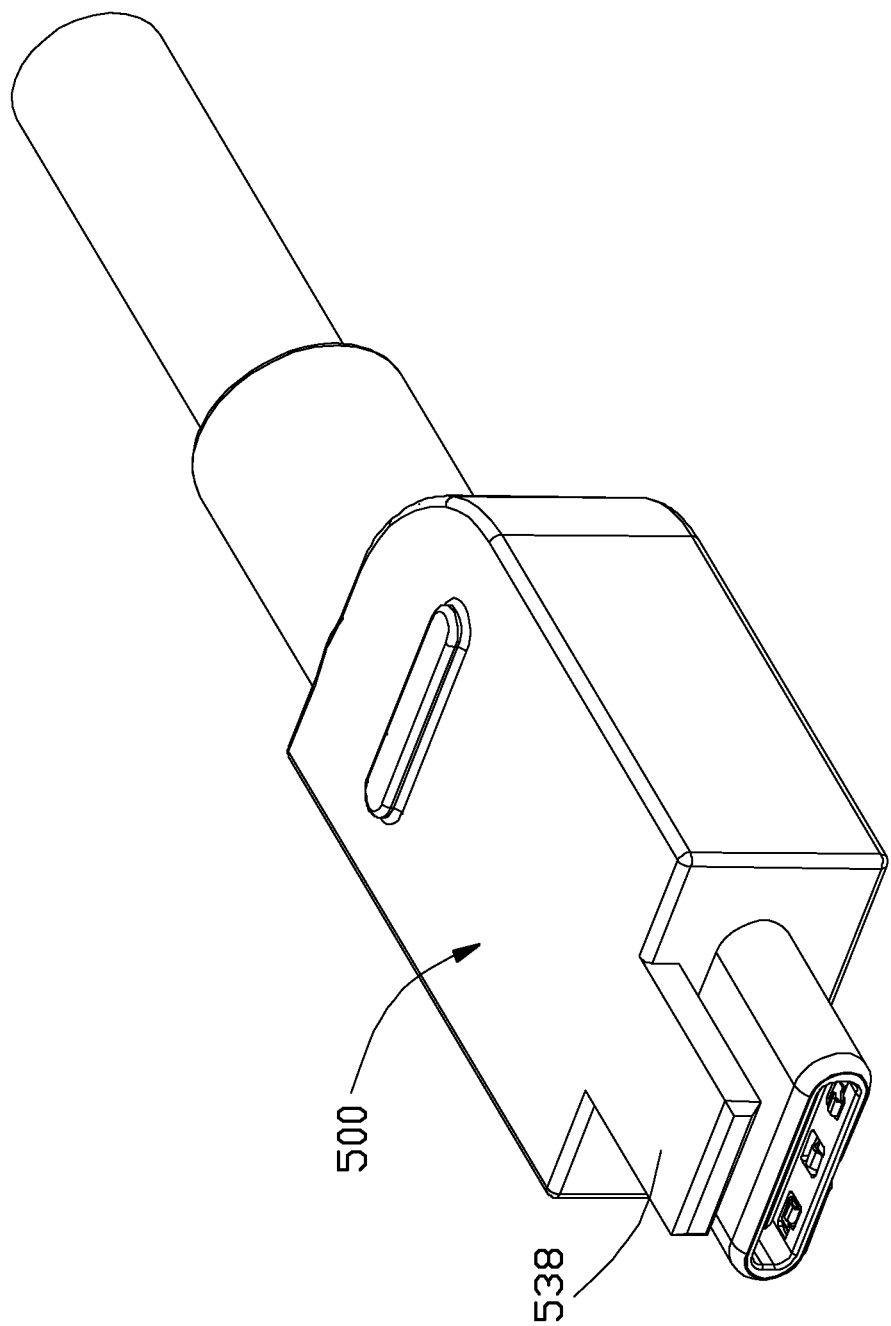
FIG. 48 is a front perspective view of the plug connector of FIG. 46.
Figure 49:
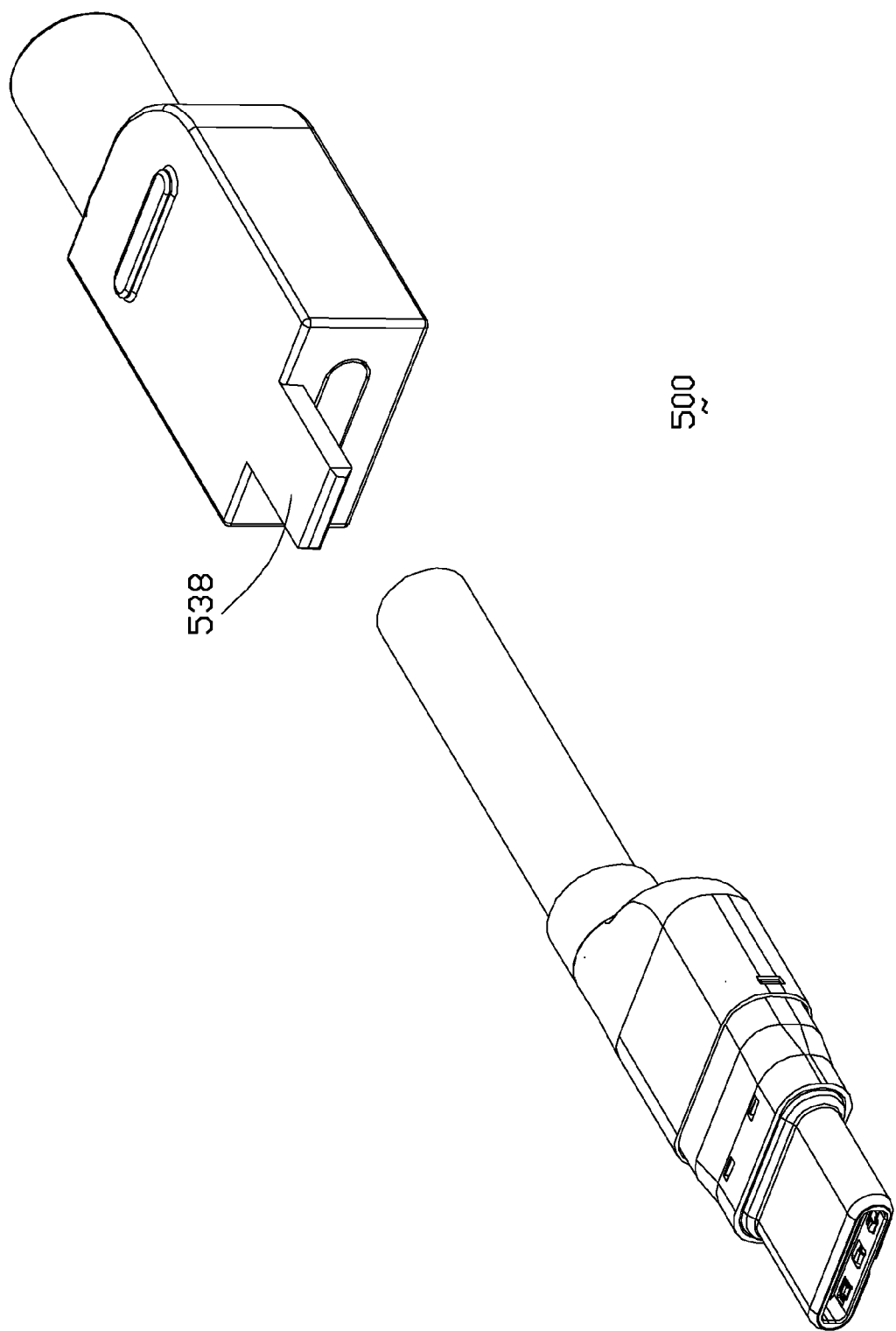
FIG. 49 is a front exploded perspective view of the plug connector of FIG. 48.
Figure 50:
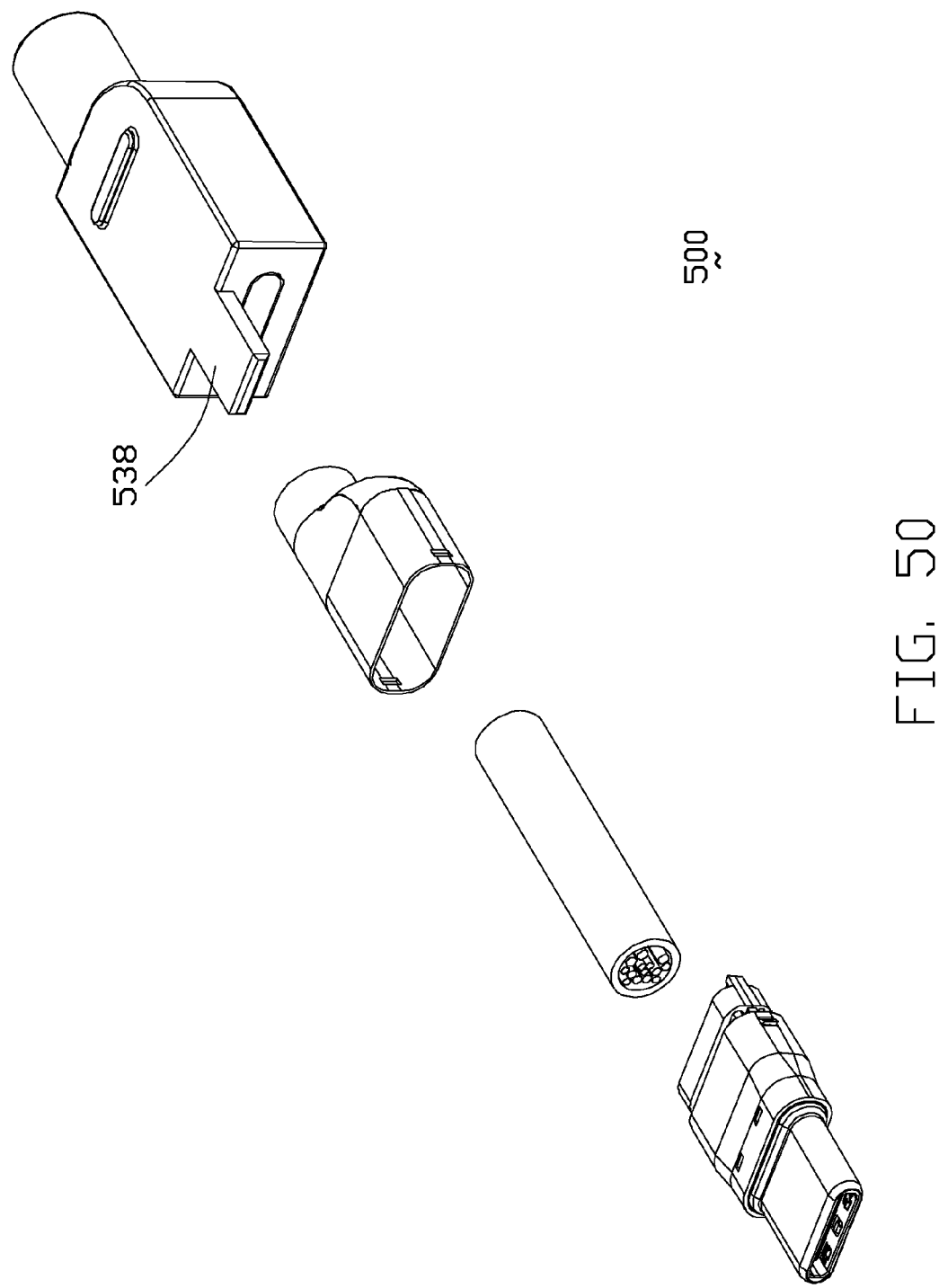
FIG. 50 is a further front exploded perspective view of the plug connector of FIG. 49.
Figure 52:
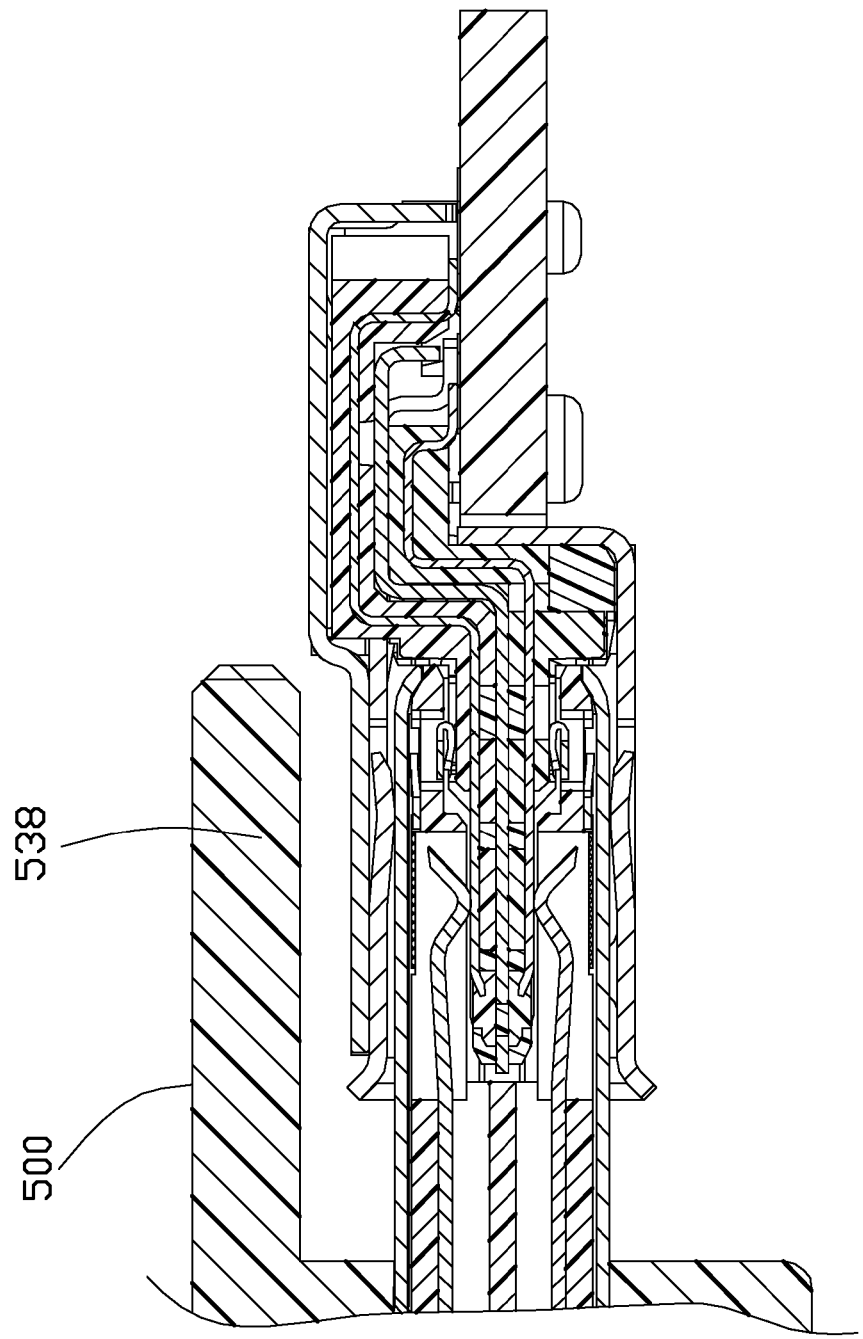
FIG. 52 is a cross-sectional view of the assembled plug connector and receptacle connector of FIG. 46.

Referring to FIGS. 10-13(B) and further FIG. 14, the plug connector 10 includes an insulative housing 12 having a capsular front contour with a rectangular receiving cavity 14 therein and enclosed in a metallic shell 16. Opposite upper and lower rows of contacts 18 are disposed in the corresponding passageways 32 of the housing with corresponding contacting sections 20 extending into the receiving cavity 14 wherein the upper and lower rows of contacts 18 are diagonally symmetrically arranged with each other in both electrical and mechanical arrangement so as to meet the so-called flappable mating, i.e., the dual opposite orientations. A pair of metallic upper and lower EMI (Electro-Magnetic Interference) spring plates 22 are enclosed in the shell 16, and each of the EMI spring plates 22 is sandwiched between the shell 16 and the housing 12 and includes a front resilient region 24 extending inwardly toward and into the receiving cavity 14 and in front of the contacting sections 20, a rear abutting region 26 to abut against the shell 16, and a pair of side retention regions 28 retainably engaged within corresponding side portions of the housing 12. A pair of tapes 30 are disposed upon two opposite sides of the housing 12 so as to isolate the contacting section 20 from the shell 16. A spacer 34 is located behind the housing and defines a plurality of passages 35 through which the tail sections 21 of the contacts 18 rearwardly extend. A recessed region 36 is formed in a rear face of the spacer 34 to receive a front edge region of a paddle card 38 wherein the tail sections 21 of the contacts 18 extending through the corresponding passages 35, are soldered upon the corresponding pads 37. The spacer 34 forms a forward extending blade 31 with a pair of forward protrusions 33 on two sides to be commonly inserted into a back side of the housing 12 wherein the protrusions 33 of the blade 31 are essentially received in the side slots 13 of the housing 12. A U-shaped metallic latch 39 of a blanking type received in the side slots 13 of the housing 12 with a pair of locking heads 40 extending into the two opposite lateral sides of the receiving cavity 14 to lock with the lateral edge sections 67 of the shielding plate 76 of the receptacle connector 50 during mating. Understandably, the latch 39 is restrained by the blade 31, the comb structures on the blade 31, the protrusions 33 of the blade 31, the slots 13 and an interior rear face of the housing 12.

A cable 41 behind the paddle card 38, encloses a plurality of wires 42 regulated by a pair of organizer 43 to be soldered upon a rear region of the paddle card 38. Via the protrusions and openings (not labeled), an auxiliary rear shell 17 grasps the shell 16 to shield the paddle card 38, and a clipper 44 grasps the rear shell 17 and further the cable 41 behind the paddle card 38. Opposite front overcoat 45 and rear overcoat or strain relief 46 are overmolded upon the rear shell 17 and the clipper 44, respectively. Finally, a cover 47 essentially fully covers the clipper 44, the front overcoat 45 and the rear overcoat 46. During mating, the mating tongue 54 is received in the receiving cavity 14 with the corresponding contacting sections 60 of the contacts 58 of the receptacle connector 50 connected to the contacting sections 20 of the contacts 18 of the plug connector 10 wherein the latch 39 is locked with the shielding plate 76, and the front resilient region 24 of the spring plate 22 contacts the collar 64.

Referring to FIGS. 15-20, according to a second embodiment similar to the first embodiment and much closer to the second embodiment of the aforementioned provisional application 62/001,084 filed May 21, 2014, a customized receptacle connector 200 includes a terminal module 202 essentially composed of the upper part 204, a lower part 206 and a middle part 208 sandwiched therebetween wherein the upper part 204 includes an upper insulator 210 with integrally formed upper contacts 212 via a first stage insert molding process, the lower part 206 includes a lower insulator 214 with integrally formed lower contacts 216 via another first stage insert molding process, and the middle part 208 includes a shielding plate 218 positioned between the upper part 204 and the lower part 206 and integrally formed with a middle insulator 220 which further binds the upper part 204 and the lower part 206 together.

Similar to the embodiments disclosed in the aforementioned applications, the shielding plate 218 forms a pair of lateral locking edges 222 to latch the locking head of the corresponding latch of the plug (illustrated later). A pair of collars 224 are attached to a root of the mating tongue 226. A metallic shield 228 encloses and secures to the terminal module 202. A metallic bracket 230 is secured to the shield 228 to mount the receptacle connector 200 upon the printed circuit board. The new feature of the embodiment is to forms an identification protrusion 229 around a front opening of the mating cavity 232 which is formed by the shield 228 and receives the mating tongue 226 therein. The identification protrusion 229 is in a shape of a tab, the tab is split the shield and bending into the mating cavity to function as the identification protrusion 229, the tab extends in the front-to-back direction and runs through the front edge of the metallic shell.

Correspondingly, referring to FIGS. 21(A)-29, the customized plug connector 250 includes an insulative housing 252 enclosed within a metallic shell 254 to be commonly received within the mating cavity 232 of the receptacle connector 200. The insulative housing 252 forms a receiving cavity 256 to receive the mating tongue 226 therein. Two rows of contacts 258 are disposed in the housing 252 with contacting sections exposed within the receiving cavity 256. A U-shaped metallic latch 260 is assembled to the housing 252 with a pair of locking heads 262 extending into the receiving cavity 256. A spacer 264 is located behind the housing 252 to allow tails of the contacts 258 to rearwardly extend. A pair of spring plates (not shown) are attached to the housing 252 and extending into the receiving cavity 256. A pair of tapes 266 cover the corresponding spring plates for isolating the pair of spring plates from the shell 254.

A paddle card 268 is located behind the spacer 264 and the tails of the contacts 258 are soldered upon a front region of the paddle card 268. A cable 270 includes a plurality of wires 272 regulated by a rear organizer 274 and a front organizer 276 and soldered upon a rear region of the paddle card 268 wherein the rear organizer 274 includes two parts assembled to each other in a vertical direction while the front organizer 276 is molded upon the rear region of the paddle card 268. A rear shell 278 is attached to a rear side of the shell 254 with an inner mold 280 applied thereon, and an outer jacket 282 is formed upon the whole set to further cover the cable 270, the rear organizer 274, the front organizer 276, the paddle card 268 and the rear shell 278.

The feature of the plug connector 250 is to form a slot 284 in a one primary wall of the shell 254 to receive the protrusion 229 of the shield 228 of the receptacle connector 200 during mating. Understandably, if a flippable mating is desired, another notch may be formed in another primary wall opposite to the existing slot 284, as disclosed in the aforementioned application Ser. No. 14/273,559. Differently, the regular/standard plug connector which is not equipped with the slot in the shell as disclosed in the first embodiment of the instant invention, can not be incautiously inserted into the featured receptacle connector 200 of this embodiment even if the rough contour and dimension of the mating interface of these two embodiments are essentially same with each other except existence of the slot 280, thus achieving an anti-mismating function. Oppositely, the plug connector 250 may be optionally inserted into the regular receptacle connector as disclosed in the first embodiment of the instant invention, thus allowing "one way" variable mating of the plug connector 250 to diversify mating applications among the standard type connector mating and non-standard but related type connector mating.

FIGS. 30(A)-37 show a third embodiment of the receptacle connector very similar to the second embodiment except the identification protrusion structure. In this embodiment, the customized receptacle connector 300 is mounted upon the printed circuit board 350 and includes a terminal module 302 enclosed within the metallic shield 328. The terminal module 302 includes an upper part 304 composed of the upper contacts 312 integrally formed with an upper insulator 310 via a first stage insert molding process, a lower part 306 composed of the lower contacts 316 integrally formed with the lower insulator 314 via another first stage inset molding process, and a middle part 308 sandwiched between the upper part 304 and the lower part 306 with a shielding plate 318 integrally formed with a middle insulator 320 via a second stage insert molding process wherein the middle insulator 320 is further secured with the upper part 304 and the lower part 306. Similar to the previous embodiment, the shielding plate 318 is equipped with a pair of lateral edge sections 322 for locking with the latch of the plug (illustrated later).

The terminal module 302 forms a mating tongue 326 within the mating cavity 332 defined by the shield 328 which forms a lump-like or dimple-like identification protrusion 329 in stead of the tab-like identification protrusion 229 shown in the previous embodiment. Understandably, the lump-like protrusion 329 via the deforming process may keep completeness of the shield 328, compared with the tab-lie protrusion 229 which is split from the shield 328 with a gap therebetween. As mentioned earlier, the protrusion 229/329 may be formed on the top wall of the shield 228/328 instead of on the bottom wall thereof. Under such a situation, the identification protrusion may be formed by the bracket 230/330 when the corresponding position of the shield leaves an enough space for allowing such an identification protrusion formed on the shield to extend therethrough into the mating cavity. It is also noted that in this embodiment the identification protrusion is essentially immovable. Anyhow, in other embodiments, such an identification protrusion may be formed at a distal end of the spring arm unitarily formed on either the shield or the bracket, and the corresponding non-standard or customized plug connector may be formed with a slot or other guiding surfaces to eventually outwardly deflect such an identification protrusion when fully mated while the standard plug connector lacking such a slot or guiding surfaces may not outwardly deflect such an identification protrusion but being stopped thereby.

It is noted that the customized plug connector 250 disclosed in the previous embodiment may be improperly inserted into the standard/regular receptacle connector disclosed in the first embodiment, unless the customized plug connector 250 is intentionally designed to mate with both the standard receptacle connector and the customized receptacle connector. To avoid this situation, the customized plug may be equipped with some features for not mating with the standard receptacle connector.

FIGS. 38-45 show a fourth embodiment of the customized plug connector 400 for mating with the customized receptacle connector 450 mounted upon the printed circuit board 460 and having the identification protrusion 452 on the shield 454. Similar to what is disclosed in the previous embodiment, the plug connector 400 includes an insulative housing 402 defining a receiving cavity 404 therein. Two rows of contacts 406 are disposed in the housing 402 and by two sides of the receiving cavity 404. A U-shaped latch 408 is assembled to the housing 402 with corresponding locking heads 410 extending into the receiving cavity 404 for locking to the corresponding lateral side edges of the shielding plate of the customized receptacle connector 450. An insulative spacer 412 is located behind the latch 408 to receive the paddle 421 card and the tails of the contacts 406. A pair of spring plates 414 and a pair of tapes 416 are disposed in the housing 402 similar to those in the aforementioned other embodiments. A metallic front shell 418 encloses the housing 402 with a slot 420 in the front edge region thereof.

A cable 430 has a plurality of wires 432 soldered upon the paddle card 421. An organizer 423 is seated upon the paddle card 421 to regulate the wires 432, and a middle shell 422 and a rear shell 424 are further attached to the paddle card 421 and the cable 430. An outer jacket 436 is applied upon the front shell 418, the middle shell 422 and the rear shell 424. Different from that in the previous embodiment, the outer jacket 436 further forms a forwardly protruding ring structure or protruding element 438 to enclose a front section of the corresponding receptacle connector 450. Understandably, the receptacle connector 450 is generally located behind a wall A (as shown in the dashed line in FIGS. 44 and 45) of the case such as a desktop computer, and such a wall with the customized receptacle connector 450 behind may be equipped with an opening to allow said ring structure 438 to extend during mating. In opposite, the wall with the standard receptacle connector behind lacks such an opening so as not to allow the customized plug connector 400 to be fully inserted into the mating cavity 456 of the customized receptacle connector 450. On the other hand, the standard plug connector as shown in the first embodiment without such a ring structure thereof may be fully inserted into the corresponding standard receptacle connector behind such a wall. Notably, the slot 439 formed in the ring structure 438 is for an orientation purpose when the plug connector 400 is not intended to be flippable with regard to the receptacle connector 450.

FIGS. 46-52 show a fifth embodiment of the plug connector 500 almost fully same with the plug connector 400 except the ring structure 438 is replaced with a protruding plate or protruding element 538. Understandably, the wall of the case requires the opening only corresponding to the protruding plate 538. In this embodiment, the protruding plate 538 also functions as the orientation means to guide mating between the plug connector and the receptacle connector.

Figure 53A:
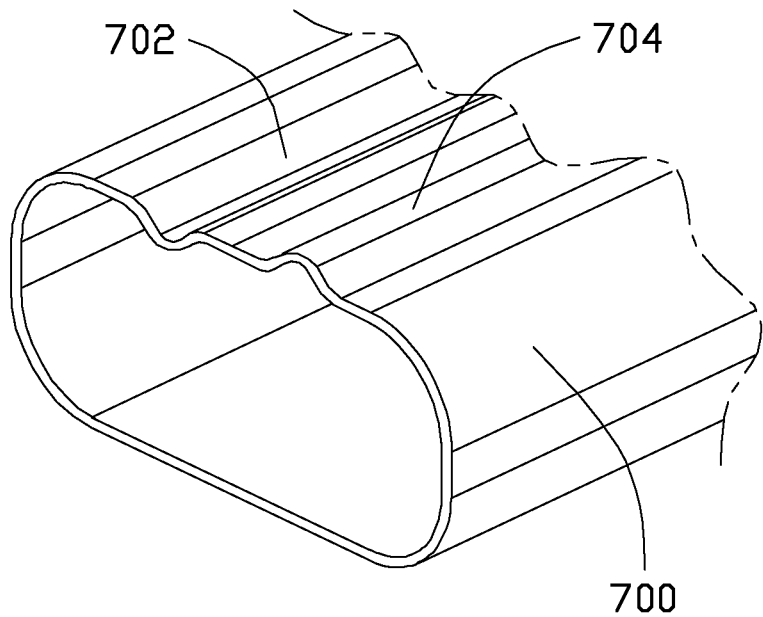
FIG. 53(A) is a perspective view of the shell of the plug connector of another embodiment of the invention.
Figure 53B:
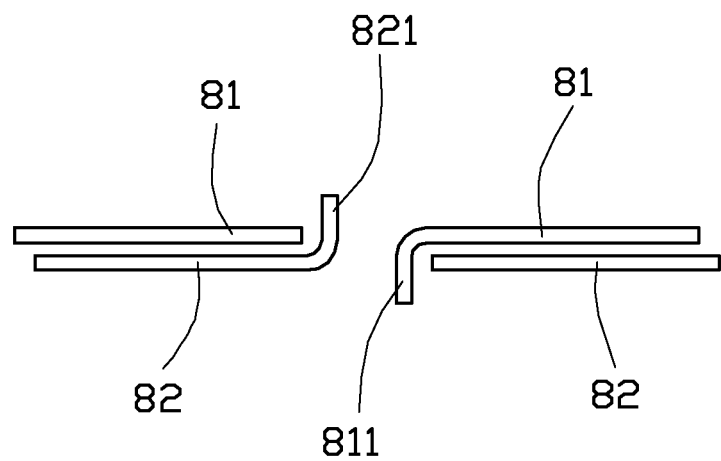
FIG. 53(B) is a cross-sectional view of the shell of the plug connector and the shield of the receptacle connector according to another embodiment of the invention.

Understandably, the previous embodiment may not only allow the customized plug connector to be mated with the corresponding customized receptacle but also preclude the standard plug connector from being inserted into the customized receptacle connector and the customized plug connector from being inserted into the standard receptacle connector. Anyhow, the previous embodiment requires to alter the outer jacket of the customized plug connector. FIGS. 53 (A)-53(B) show other approaches wherein in FIG. 53(A) the shell 700 of the customized plug connector can unitarily form a recess 702 and a protrusion 704, and the customized receptacle connector may also form the similar structures correspondingly for coupling. Because the recess and the protrusion are simultaneously formed on the shield of the customized receptacle connector and the customized plug connector, the standard plug connector and standard receptacle connector can no longer mis-mated therewith. FIG. 53(B) also shows the similar concept to implement the same function within a limited space, wherein the top wall 81 of the shield of the outer receptacle connector has a downward tab 811 split from the shield, the top wall 82 of the shield of the inner plug connector has an upward tab 821 split from the shield.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. It is noted that the flippable arrangement, i.e., the dual-orientation application, is essentially the prior art with regard to the instant invention, and the invention is to provide the customized arrangement of both the plug connector and the receptacle connector wherein such customized arrangement is preferred to be used in only one orientation application.

What is claimed is:

1. A receptacle connector assembly for use with a plug, comprising:
    an insulative housing defining base with a mating tongue forwardly extending therefrom in a front-to-back direction;
    a plurality of contacts disposed in the housing with contacting sections exposed upon the mating tongue;
    a metallic shield enclosing the housing to define a capsular mating cavity in which said mating tongue is disposed; and
    a metallic shielding plate embedded within said mating tongue and defining a pair of lateral edge sections configured to be adapted to be locked with a latch of the plug;

wherein the metallic shield defines an identification protrusion extending inwardly into the mating cavity so as to be precluded from mating with a standard plug connector, which has a contour compliant with said capsular mating cavity, but being adapted to be mated with a customized plug connector which also has a contour compliant with said capsular mating cavity and further with a corresponding slot to receive said identification protrusion;

wherein the shield defines a lump or dimple deformed from the shield and protruding into the mating cavity to function as the identification protrusion.

2. The receptacle connector assembly as claimed in claim 1, wherein the shield defines a tab split therefrom and bending into the mating cavity to function as the identification protrusion, the tab extending in the front-to-back direction and running through the front edge of the metallic shell.

3. The receptacle connector assembly as claimed in claim 1, wherein said metallic shield further forms another identification protrusion extending outwardly away from the mating cavity and neighboring with said inwardly extending identification protrusion.

4. The receptacle connector assembly as claimed in claim 3, wherein said another identification protrusion is either a tab or a dimple.

5. A plug connector comprising:
an insulative housing defining a receiving cavity;
a plurality of contacts disposed in the housing with contacting sections exposed in said receiving cavity;
a metallic shell fitly enclosing said housing;
wherein the shell defines a capsular contour with a slot extending along a front-to-back direction from a front edge thereof so as to distinguish from a standard plug connector having the same capsular contour while without said slot; whereby the plug connector is allowed to be mated with a customized receptacle connector which forms a mating cavity compliant with said capsular contour while being further equipped with an inward protrusion;
wherein said plug connector further includes a protrusion preventing said plug connector from being inserted into a standard receptacle connector which defines a mating cavity compliant with said capsular contour;
wherein said protrusion is formed on an outer jacket enclosing said shell;
wherein said protrusion is or a ring structure forwardly extending to surround the shell;
wherein said ring structure forms forwardly extending a slot therein.

6. The plug connector as claimed in claim 5, wherein said protrusion is a plate forwardly extending in parallel with the shell.

7. The plug connector as claimed in claim 5, wherein said shell extends forwardly beyond the ring structure.

8. An arrangement for preventing mis-mating between different type receptacle connector and plug connector, comprising:
a standard receptacle connector including a first receptacle housing having a plurality of standard contacts therein and enclosed within a first metallic shield which defines a standard mating cavity therein;
a standard plug connector including a first plug housing having a plurality of standard terminals therein and enclosed within a first metallic shell which is adapted to be received with the standard mating cavity in a flippable manner;
a customized receptacle connector including a second receptacle housing having a plurality of customized contacts therein and enclosed within a second metallic shield which defines a customized mating cavity;
a customized plug connector including a second plug housing having a plurality of customized terminals therein and enclosed within a second metallic shell which is adapted to be received within the customized mating cavity in only one orientation way; wherein
the first metallic shield and the second metallic shield define commonly a same contour so as to have both the standard mating cavity and the customized mating cavity configured same with each other except that said second metallic shield further forms a protrusion inwardly extending into the customized mating cavity; wherein
the first metallic shell and the second metallic shell define a same contour except the second metallic shell further forms a slot to comply with the protrusion; wherein
only the customized plug connector can be mated with the customized receptacle connector due to coupling between the protrusion and the slot while the standard plug connector can not be mated with the customized receptacle connector due to interference between the second metallic shell and the protrusion.

9. The arrangement as claimed in claim 8, wherein said customized plug connector further includes a protruding element extending around the second metallic shell, and the customized receptacle connector provides space around the first metallic shield to accommodate said protruding element while the standard receptacle connector lacks any accommodation function thereabouts so as to assure that the customized plug connector can not be mated with the standard receptacle connector.

10. The arrangement as claimed in claim 9, wherein said protruding element is a plate extending forwardly in parallel with the second metallic shell.

11. The arrangement as claimed in claim 9, wherein said protruding element is unitarily formed with an jacket enclosing said second metallic shell.

12. The arrangement as claimed in claim 9, wherein said protrusion is either a tab or a dimple.

13. The arrangement as claimed in claim 9, wherein each of said standard receptacle connector and said customized receptacle connector includes a mating tongue extending forwardly in the corresponding mating cavity, and a metallic shield plate is embedded within the mating tongue with a pair of locking notches in two opposite lateral side edges.

14. The arrangement as claimed in claim 9, wherein said protruding element is of a ring structure extending forwardly to surround the second metallic shell.

15. The arrangement as claimed in claim 14, wherein said ring structure is equipped with a forwardly extending slot.

* * * * *